(12) United States Patent
Jha et al.

(10) Patent No.: US 10,312,426 B2
(45) Date of Patent: *Jun. 4, 2019

(54) GIANT CROSS-PLANE SEEBECK EFFECT IN OXIDE METAL SEMICONDUCTOR SUPERLATTICES FOR SPIN-MAGNETIC THERMOELECTRIC DEVICES

(71) Applicant: Purdue Research Foundation, West Lafayette, IN (US)

(72) Inventors: Pankaj Jha, Hillsboro, OR (US); Timothy D. Sands, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 574 days.

This patent is subject to a terminal disclaimer.

(21) Appl. No.: 13/840,378

(22) Filed: Mar. 15, 2013

(65) Prior Publication Data

US 2014/0261604 A1 Sep. 18, 2014
US 2018/0351065 A9 Dec. 6, 2018

Related U.S. Application Data

(63) Continuation-in-part of application No. 13/415,586, filed on Mar. 8, 2012, now abandoned.

(60) Provisional application No. 61/450,353, filed on Mar. 8, 2011.

(51) Int. Cl.
*H01L 35/22* (2006.01)
*H01L 35/26* (2006.01)

(52) U.S. Cl.
CPC .............. *H01L 35/22* (2013.01); *H01L 35/26* (2013.01)

(58) Field of Classification Search
CPC ................................ H01L 35/22; H01L 35/26
See application file for complete search history.

(56) References Cited

U.S. PATENT DOCUMENTS

2012/0227663 A1* 9/2012 Jha ...................... C30B 23/066
117/105

OTHER PUBLICATIONS

Ryu et al., Metal-to-Insulator Transitions in La2/3Sr1/3MnO3/LaMnO3 (LSMO/LMO) Superlattices, Journal of the Korean Ceramic Society, vol. 43, No. 11, pp. 734-737, 2006.*
Shakouri, A., et al., Heterostructure integrated thermionic coolers. Appl. Phys. Lett. 71 (9), 1234-1237, 1997.
Tritt, T. M., et al., Thermoelectric Materials, Phenomena, and Applications: A Bird's Eye View. MRS Bulletin • vol. 31, 188-198, Mar. 2006.

(Continued)

*Primary Examiner* — Shannon M Gardner
(74) *Attorney, Agent, or Firm* — Purdue Research Foundation

(57) ABSTRACT

Lanthanum strontium manganate ($La_{0.67}Sr_{0.33}MnO_3$, i.e., LSMO)/lanthanum manganate ($LaMnO_3$, i.e., LMO) perovskite oxide metal/semiconductor superlattices were investigated for potential p-type thermoelectric applications. Growth optimizations were performed using pulsed laser deposition to achieve epitaxial superlattices of LSMO (metal)/LMO (p-type semiconductor) on strontium titanate (STO) substrates. The cross-plane Seebeck coefficient of the thermoelectric superlattice measured between the substrate and the capping layer has a value of at least 1600 µV/K measured at about 300K.

9 Claims, 81 Drawing Sheets

(56) References Cited

OTHER PUBLICATIONS

Terasaki, I., et al., Large thermoelectric power in NaCo2O4 single crystals. Physical Review B, vol. 56(20), 685-687, 1997.

Wang, Y. et al., Spin entropy as the likely source of enhanced thermopower in NaxCo2O4. Nature, vol. 423, 425-428, 2003.

Terasaki, I. Transport properties and electronic states of the thermoelectric oxide NaCo2O4. Physica B 328 (2003) 63-67.

Terasaki, I., et al., Out-of-plane thermal conductivity of the layered thermoelectric oxide Bi2—xPbxSr2Co2Oy. Physical Review B 70, 214106, 1-5 (2004).

Ohta, H., et al., Giant thermoelectric Seebeck coefficient of a two-dimensional electron gas in SrTiO3. Nature Materials, vol. 6, 129-134, 2007.

Haghiri-Gosnet, A-M., et al., CMR manganites: physics, thin films and devices. J. Phys. D: Appl. Phys. 36 (2003) R127-R150.

Zener, C., Interaction between the d-Shells in the Transition Metals. II. Ferromagnetic Comyountls of Manganese with Perovskite Structure. Physical Review, vol. 82(3), 403-405, 1951.

Nanach, G., et al., Study of half-metallicity in LSMO. Journal of Magnetism and Magnetic Materials 272-276 (2004) 1963-1964.

Urushibara, A., et al., Insulator-metal transition and giant magnetoresistance in La1—xSrx MnO3. Physical Review B. vol. 51(20), 103-109, 1995.

Aruta, C., et al., Preparation and characterization of LaMnO3 thin films grown by pulsed laser deposition. Journal of Applied Physics 100, 023910, 1-6, 2006.

Choi, W. S., et al., Effects of oxygen-reducing atmosphere annealing on LaMnO3 epitaxial thin films. J. Phys. D: Appl. Phys. 42 (2009) 165401 (4pp).

Kida, T. et al., LaMnO3=CdS nanocomposite: a new photocatalyst for hydrogen production from water under visible light irradiation. Chemical Physics Letters 371 (2003) 563-567.

Koida, T., et al., Effect of A-site cation ordering on the magnetoelectric properties in [(LaMnO3)m/(SrMnO3)m]n artificial superlattices. Physical Review B 66, 144418, 1-6 (2002).

Vashaee, D., et al., Improved Thermoelectric Power Factor in Metal-Based Superlattices. Physical Review Letters, vol. 92(10), 106103, 1-4 (2004).

Venkatasubramanian, R. Lattice thermal conductivity reduction and phonon localizationlike behavior in superlattice structures. Physical Review B, vol. 61(4), 3091-3097, 2000.

Chakhalian, J., et al., Orbital Reconstruction and Covalent Bonding at an Oxide Interface. Science, vol. 318, 1114-1117, 2007.

Jin, S., et al., Thousandfold Change in Resistivity in Magnetoresistive La—Ca—Mn—O Films. Science, vol. 265, 413-415, 1994.

Jin, S., Colossal Magnetoresistance in La—Ca—Mn—O. METAL SAND Materials, vol. 5, No. 6 (1999), pp. 533-537.

Ohno, Y., et al., Electrical spin injection in a ferromagnetic semiconductor heterostructure. Nature, vol. 402, 790-792, 1999.

Motsnyi, V. F., et al., Electrical Spin Injection in a Ferromagnetic / Tunnel Barrier/ Semiconductor Heterostructure. Appl. Phys. Lett. 81, 265 (2002).

Hanbicki, A. T., et al., Analysis of the Transport Process Providing Spin Injection through an Fe/AlGaAs Schottky Barrier. Appl. Phys. Lett. 82, 4092 (2003).

Hu, H., et al., Generalized theory of the photoacoustic effect in a multilayer material. J. Appl. Phys., vol. 86, No. 7, 3953-3958, 1999.

Wang, X., et al., Photo-Acoustic Measurement of Thermal Conductivity of Thin Films and Bulk Materials. Journal of Heat Transfer—Transactions of the ASME. vol. 123, 138-144, 2001.

\* cited by examiner (a)

(b)

(c)

(d)

← Ti/Pt/Au (e)

(f)

GIANT CROSS-PLANE SEEBECK EFFECT IN OXIDE METAL SEMICONDUCTOR SUPERLATTICES FOR SPIN-MAGNETIC THERMOELECTRIC DEVICES

REFERENCE TO RELATED APPLICATIONS

The present application is a continuation-in-part application of U.S. Non-provisional patent application Ser. No. 13/415,586 which was filed Mar. 8, 2012, under the title "OXIDE METAL SEMICONDUCTOR SUPERLATTICES FOR THERMOELECTRICS" and which claims priority from U.S. Provisional Patent Application Ser. No. 61/450,353, which was filed Mar. 8, 2011, under the title "P-TYPE LANTHANUM STRONTIUM MANGANATE/LANTHANUM MANGANATE PEROVSKITE OXIDE METAL/SEMICONDUCTOR SUPERLATTICES FOR THERMOELECTRICS," the disclosure of each of which is expressly incorporated herein by reference.

GOVERNMENT LICENSE RIGHTS

This invention was made with government support under Grant No. W911NF-08-1-0347 awarded by the United States Army Research Office. The Government has certain rights in the invention.

FIELD

The present disclosure relates to semiconductors and superlattices for thermoelectric applications. More specifically, the present disclosure relates to the use of and method of making perovskite oxides as semiconductors and superlattices.

BACKGROUND

Global energy consumption continues to rapidly rise with the majority of energy production coming from fossil fuels. However, continued fossil fuel dependency raises many concerns for the future: for example, environmental sustainability. Sustaining high levels of global energy consumption will require alternative fuel sources and more efficient use of existing fuels. One area of efficiency that can be immediately addressed is the recovery of waste heat.

More than 60% of energy generated in the United States is lost as waste heat which can be partially recovered using solid-state thermoelectric generators, devices that convert thermal gradients into electrical energy (Seebeck effect).

Thermoelectric effects have been known since the 1800's for their application in power generation and refrigeration. The 1950's brought renewed interest in thermoelectric devices with successful research focused on the bismuth telluride ($Bi_2Te_3$) materials system.

However, applications for bismuth telluride thermoelectric devices were restricted due to poor cooling efficiencies. The mid 1990's saw an increase in theoretical work by different research groups promoting the application of nanostructured materials systems with higher efficiency than bulk thermoelectric materials. The nanostructured thermoelectric materials may exhibit ballistic electron transport, which can yield a high power factor ($S^2\sigma$), and boundary or interface scattering of phonons reduces the thermal conductivity ($\kappa_T$). Theoretical work carried by Mahan et al. and Shakouri et al. shows that the cross-plane ballistic transport in metal/semiconductor superlattices can potentially be used for thermoelectrics to achieve a thermoelectric figure of merit (ZT) of around 4 to 5.

Metal/semiconductor superlattices with cross-plane transport offer a novel approach towards improving the thermoelectric figure of merit (ZT). The thermoelectric device performance and efficiency for generation is given by a dimensionless figure of merit, ZT. The figure of merit ZT, is given by;

$$ZT = \frac{S^2\sigma}{K_e + K_l}T,$$

where S is the Seebeck coefficient, $\sigma$ is electrical conductivity, $\kappa$ is the thermal conductivity, T is the absolute temperature (K). The promise of enhancement in ($S^2\sigma$) is possible by engineering the hetero structures barrier height and moreover, cross-plane phonon scattering possibly helps in reducing lattice contribution to the thermal conductivity.

The existing thermoelectric devices for high temperature applications are restricted because of their low melting or decomposition temperatures, scarce and toxic component elements such as $Bi_2Te_3$, $CoSb_3$ and PbTe. Oxides thermal and chemical stability at elevated operating temperature, naturally abundant, nontoxic and low production costs make them an attractive potential candidate for TE devices. Oxides have been previously avoided for TE devices due to strong ionic behavior, narrow conducting bandwidths from weak orbital overlap leading to localized electrons with low carrier mobilities. However, conventional thoughts on oxides changed when large power factors were observed by Terasaki et al. in the magnetic layered cobalt oxide material, $Na_xCo_2O_4$. The power factor is comparable to $Bi_2Te_3$, but the mobility is one order of magnitude lower, suggesting that a low mobility conductor can also be an efficient thermoelectric material. Later, Wang et al. suggested that the reason for the large power factor in $Na_xCo_2O_4$ is due to its anti-ferromagnetic behavior at room temperature. The spin states are free to transfer about the crystal and these "moving spins" (spin entropy) carry energy which contributes to the power factor. This large unexpected power factor in layered cobalt oxide materials inspired the research for high ZT p-type materials in $Ca_3Co_4O_9$ and $Bi_2Sr_3Co_2O_y$ structures. However, ZT is low due to high room temperature thermal conductivity of 4-5 W/m·K. It was later concluded that metal-oxide ZT values exceeding 2 would be limited by their large $\kappa_T$ values, 3-10 W/m·K (compared with those of the heavy metallic alloys, 0.5-2 W/m·K). While these investigations have attracted a great deal of research, no major breakthroughs in oxide TE have yet emerged.

SUMMARY

Lanthanum strontium manganate ($La_{0.67}Sr_{0.33}MnO_3$, i.e., LSMO)/lanthanum manganate ($LaMnO_3$, i.e., LMO) perovskite oxide metal/semiconductor superlattices were investigated as a potential p-type thermoelectric generator element. Growth optimizations were performed using pulsed laser deposition to achieve epitaxial superlattices of LSMO (metal)/LMO (p-type semiconductor) on strontium titanate (STO) substrates. In-plane Seebeck results validated the p-type semiconducting and metallic behavior in LMO and LSMO thin films, respectively.

Thermal conductivity measurements via the photo-acoustic (PA) technique showed that LSMO/LMO superlattices exhibit a room temperature cross-plane thermal conductivity (0.89 W/m·K) that is, 44%-31% lower than individual thin films of either LSMO (1.60 W/m·K) or LMO (1.29 W/m·K). The lower thermal conductivity of LSMO/LMO superlattices may help overcome one of the limitations of oxides as thermoelectrics.

In addition to a low cross-plane thermal conductivity, a high ZT requires a high power factor ($S^2\sigma$). Cross-plane electrical transport measurements were carried out on cylindrical pillars etched in LSMO/LMO superlattices via inductively coupled plasma reactive ion etching. Cross-plane electrical resistivity data of LSMO/LMO superlattices results showed an enhancement in magnetic transition peak from in-plane T~250K to cross-plane T~330K, which is ~80K higher than the magnetic transition peak observed in in-plane resistivity in LSMO, LMO or LSMO/LMO thin films.

P-type perovskite oxide metal/semiconductor superlattices are investigated as yet unexplored materials system for thermoelectric generation. This disclosure investigates lanthanum strontium manganate $La_{0.67}Sr_{0.33}MnO_3$ (LSMO) as a metal and lanthanum manganate, $LaMnO_3$ (LMO) as a p-type semiconductor for our metal/semiconductor superlattices on strontium titanate $SrTiO_3$ (STO) substrates. The $La_{0.67}Sr_{0.33}MnO_3$ is a compound of doped $LaMnO_3$ ($Mn^{3+}$, $t^3_{2g}e^1g$), where $La^{3+}$ is partially replaced by $Sr^{2+}$, which forces a partial change of $Mn^{3+}$ to $Mn^{4+}$ with no $e_g$ electron ($t^3_{2g}e^0_g$), resulting in a mixed Mn valence accompanied by hole doping. The hole may hop from $Mn^{4+}$ ion to the $Mn^{3+}$ only to a location of parallel localized spins. Hopping action between adjacent Mn ions is dominated by the double-exchange mechanism. The double exchange transport mechanism is responsible for the ferromagnetic and conductive ground state for $Sr^{2+}$ doped manganates. LSMO is half-metallic, where one spin band is partly occupied at Fermi level and the other has nearly zero density of states across the Fermi level. Strontium (Sr) hole doping concentration of x=0.33 shows ferromagnetic metallic behavior with metal work function ($\Phi_m$) of LSMO is 5.2 eV.

In addition, parent manganese compound $LaMnO_3$ is anti-ferromagnetic and insulating in its ground state with ion vacancies of $La^{3+}$, $Mn^{3+}$ and $O^{2-}$, which allow doping on all lattice sites. LMO undergoes a structural transformation at T~523K from the Jahn-Teller distorted orthorhombic phase to a high temperature cubic semiconducting phase. The electrical properties are tunable by varying the oxygen stoichiometry to achieve a p-type semiconductor, which conducts by cation transitions. It easily adopts the excess oxygen from its stoichiometric phase and does not allow the interstitial oxygen, but allows cation vacancies. The cation vacancies are responsible for the ferromagnetic as well as the semiconducting behavior. It has very stable and favorable conductivity at high temperature, with a band gap of $E_g$=1.1 eV and electron affinity of 4.4 eV.

The LSMO (metal)/LMO (p-type semiconductor) superlattice has the desired Schottky barrier heights to achieve high ZT. LSMO and LMO superlattices have the desired Schottky barrier ($\Phi_B$) height of 300 meV at 300K, where, $\Phi_B=E_g+X_s-\Phi_m$. The stoichiometry of LSMO and LMO have closely matched lattice parameters that allows growth of epitaxial superlattices with sharp interfaces, which helps to decrease thermal conductivity $\kappa_T$ due to phonons scattering more effectively than hot electrons (phonon blocking and electron transmitting superlattices) at the interfaces.

Therefore in this work, we present the growth optimization, material, electrical and thermal characterization of LSMO/LMO superlattices to achieve a novel potential material system for thermoelectric generator.

DETAILED DESCRIPTION

For the purpose of promoting an understanding of the principles of the invention, reference will now be made to certain embodiments illustrated in the disclosure, and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 1:
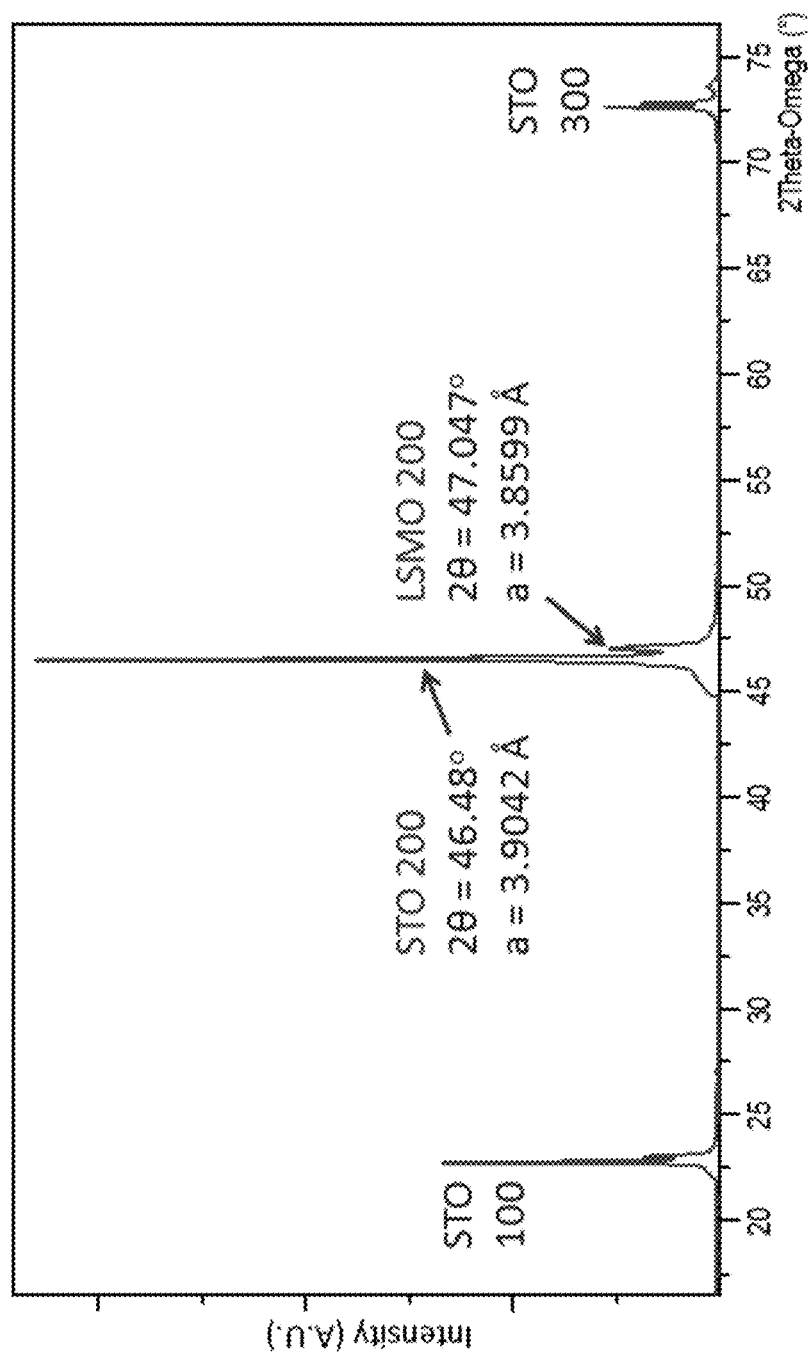
FIG. 1 is a series of XRD 2theta-omega scans of LSMO thin film on STO substrate which confirms c-axis epitaxial behavior.

The epitaxial LSMO films growth on (100)-oriented cubic STO substrate were obtained by using pulsed laser deposition (PLD) with a 248 nm KrF excimer laser and a pulse width of 25 ns. A laser fluence of 1.3 J/cm$^2$ and a pulse frequency of 5 Hz were used to ablate the LSMO sintered target. The deposition was performed at a constant substrate temperature of 740° C., measured using an infrared pyrometer. PLD growth was performed to achieve metallic epitaxial thin films of LSMO on STO. The epitaxial LSMO metallic thin film was achieved with background O$_2$ pressure of 52 mtorr. The target was polished prior to each growth to ensure even film growth and to avoid any large particulates break off from the roughened target surface due to laser thermal shock and heating of the subsurface before atoms vaporize. LSMO growth rate using PLD was 0.13 Å/pulse (4 nm/minute), with typical film thickness ranging from 300 nm to 400 nm. X-ray diffraction (XRD) 2theta-omega scan confirms c-axis epitaxial high quality LSMO films on STO substrate (FIG. 1), and rocking curve's small Full Width at Half Maximum intensity (FWHM) is 0.0122°, shows film is not relaxed. XRD asymmetric 110 Phi scan of LSMO on STO shows all four 90° separated film peaks are well aligned with the substrate peaks, which confirms highly aligned grains and epitaxy.

Figure 2:
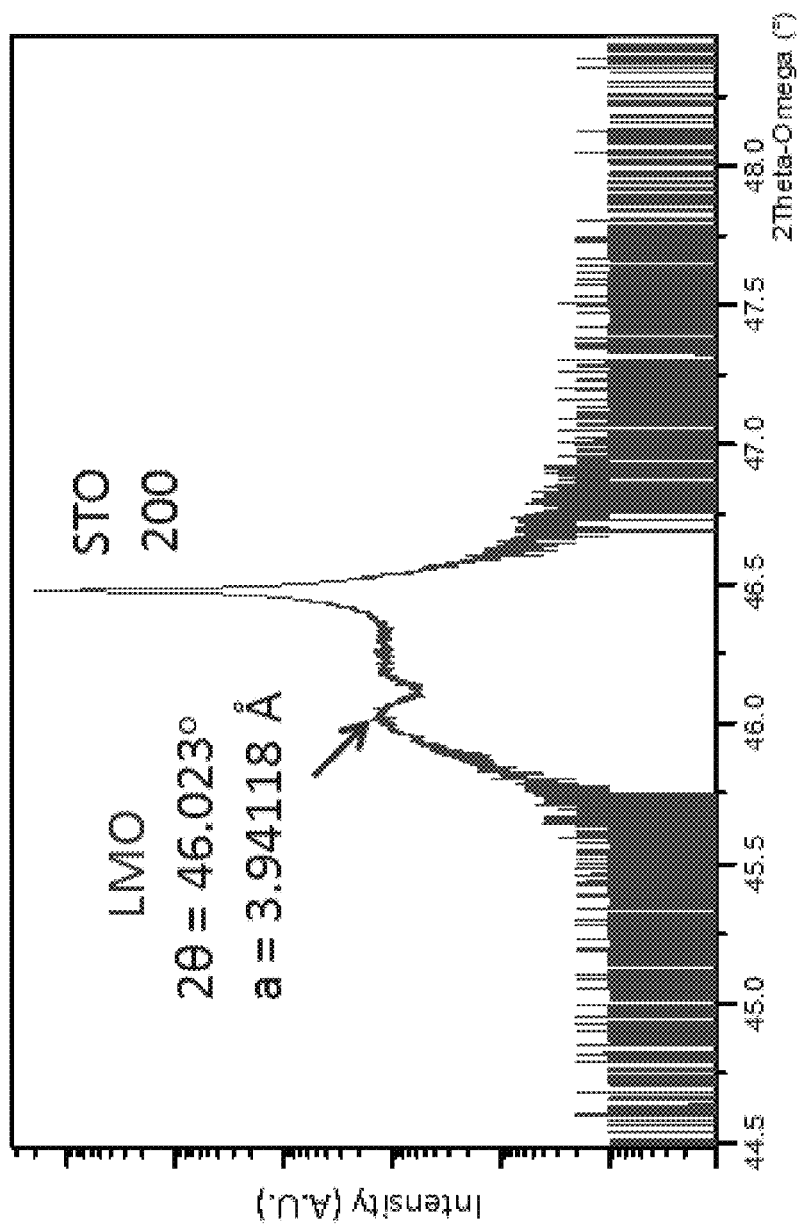
FIG. 2 is a XRD 2theta-omega scan of an LMO thin film on a STO substrate which confirms c-axis epitaxy.

Moreover, LMO thin film growth optimizations to achieve the p-type semiconducting behavior on (100)—STO substrate were also performed using PLD. Laser fluency was maintained at 1.3 J/cm$^2$ and a pulse frequency of 5 Hz was used to ablate the LMO target material. The variation in oxygen pressure had no impact on the epitaxial growth of the thin films. It was observed that non-optimal oxygen pressures resulted in films that looked dark grey and were metallic. In an oxygen pressure window of 45-55 mtorr a semi-transparent semiconducting thin film of LMO was achieved. The evaporated target species reacted with the optimized oxygen flow pressure maintained at 52 mtorr inside the chamber at a substrate temperature of 740° C. to achieve the desired stoichiometry of the LMO films with semiconducting behavior. The LMO growth rate using PLD was approximately~0.13 Å/pulse. XRD 2theta-omega scan confirms c-axis epitaxial LMO films on STO substrate (FIG. 2), and rocking curve of LMO/STO shows a small FWHM (0.0279°, indicating that the film is not relaxed and is of high quality. LMO XRD asymmetric 110 Phi scan confirms highly aligned grains and in-plane epitaxy.

Figure 3A:
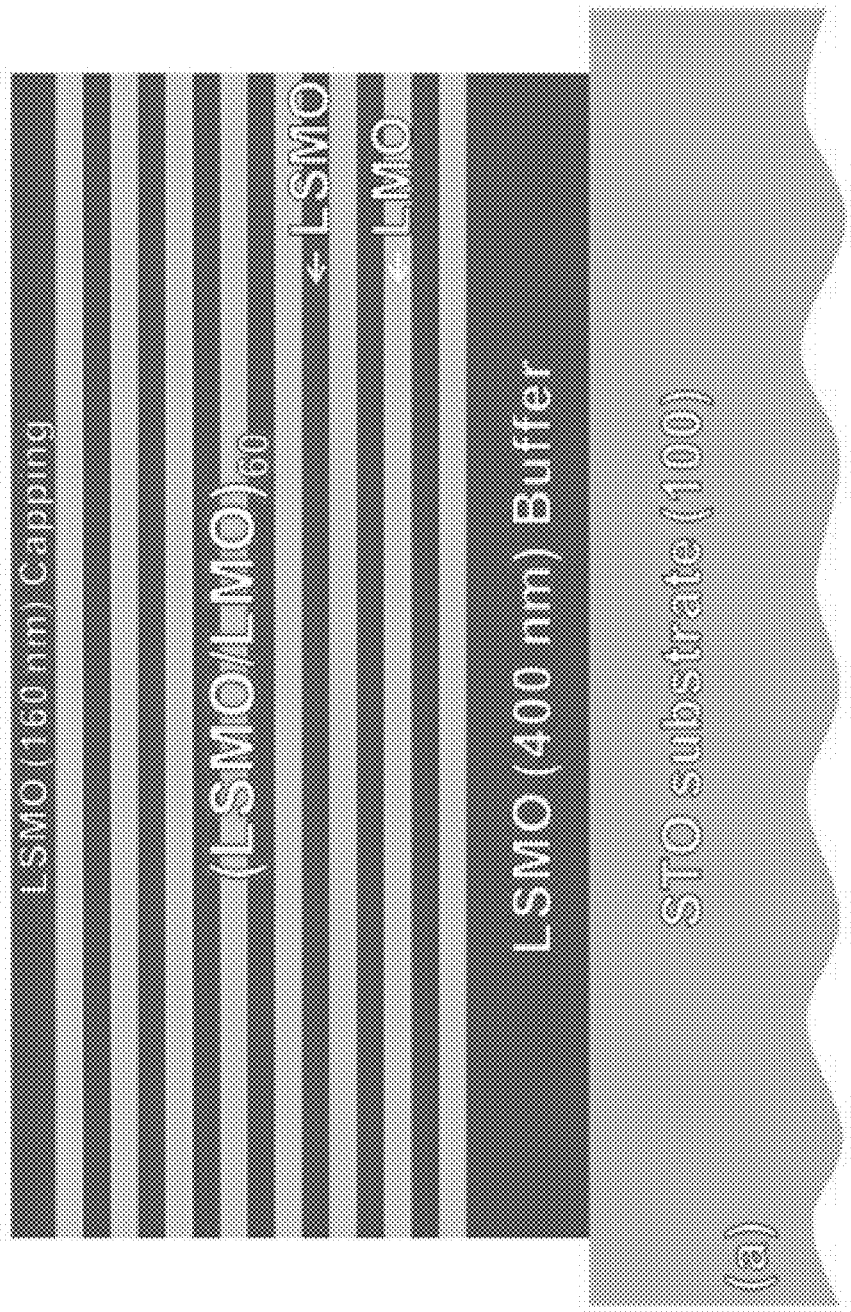
FIG. 3(a) is a schematic of metallic LSMO (8 nm)/ semiconducting LMO (8 nm) superlattice structure.
Figure 3B:
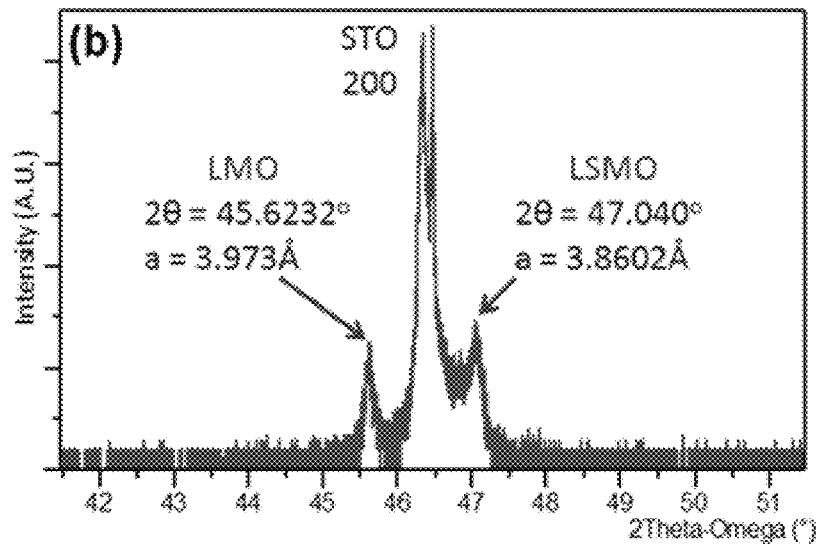
FIG. 3(b) is an XRD 2theta-omega scan of an LSMO/ LMO superlattice on a STO (100) substrate confirming c-axis epitaxial behavior with LSMO FWHM (0.027° and LMO FWHM (0.102°.
Figure 3C:
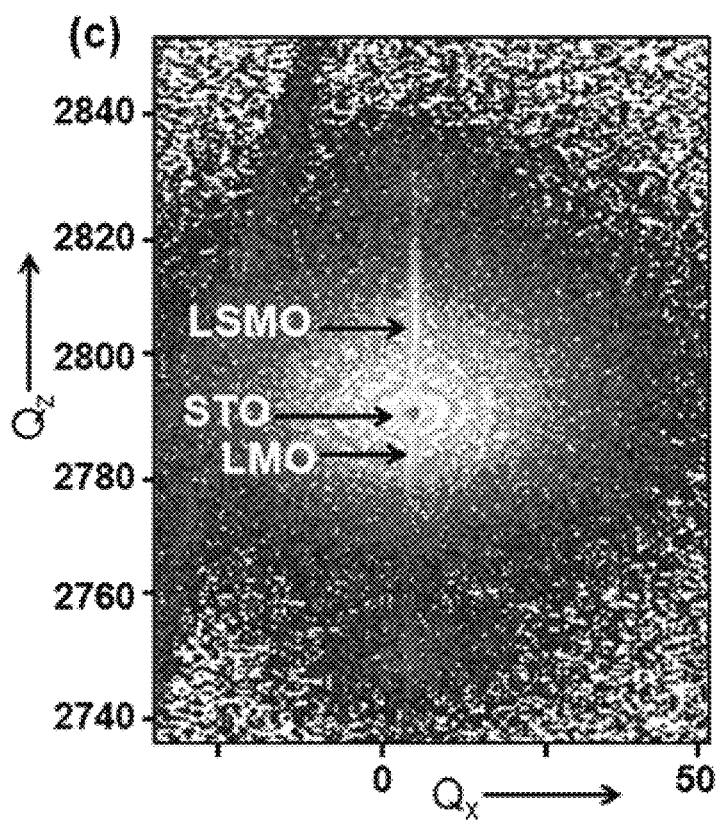
FIG. 3(c) is a 110 RSM of a micron-thick LSMO/LMO superlattice. The LSMO and LMO peaks have a small degree of spread confirming the epitaxial behavior of the superlattice film. The streaking observed in the RSM is the detector streak where, streaks represent the Fourier transform of a sharp interface or surface, and are parallel to the normal to that surface in real space.
Figure 4A:
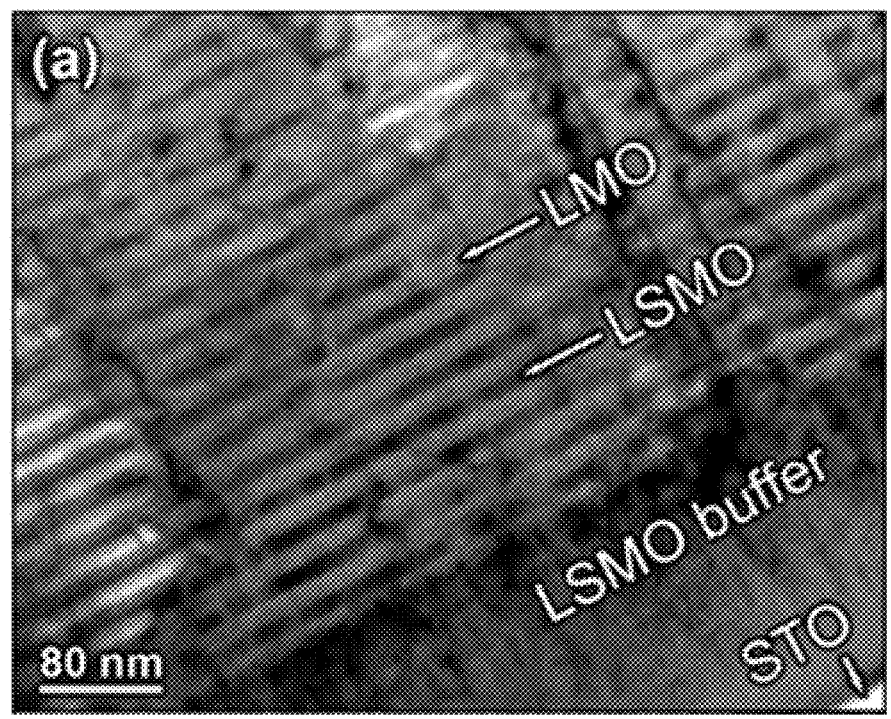
FIG. 4(a) is a low magnification bright field TEM cross-sections of an LSMO (8 nm)/LMO (8 nm) superlattice.
Figure 4B:
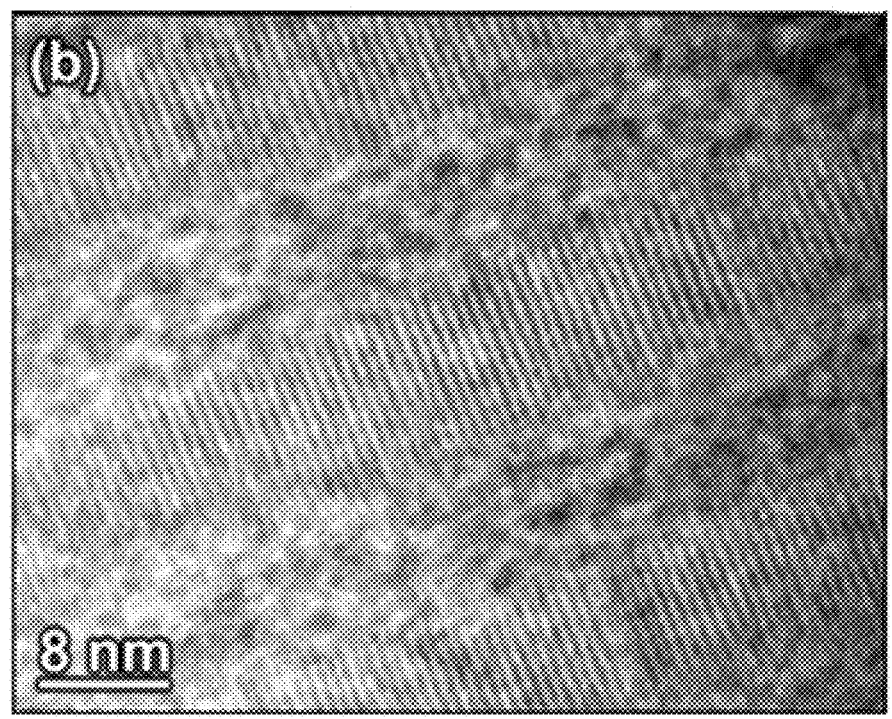
FIG. 4(b) is a high resolution cross-section TEM confirming epitaxial layer contrast of LSMO/LMO superlattices on a STO (100) substrate.

Finally, p-type LSMO/LMO micron-thick superlattices were grown on (100)-STO substrates (FIG. 3(a)). The LSMO/LMO superlattice growth conditions were influenced by those required for achieving p-type semiconducting LMO, as discussed previously: KrF excimer laser •=248 nm, 25 ns), pulse frequency of 5 Hz, laser fluence of 1.3 J/cm², substrate temperature of 740° C., chamber oxygen pressure of 52 mtorr (optimized oxygen pressure to achieve p-type semiconducting LMO), and the base chamber vacuum was $1 \times 10^{-6}$ torr. XRD 2theta-omega scan and rocking curve (LSMO FWHM is 0.027° and LMO FWHM is 0.102°) of an LSMO/LMO superlattice confirms the c-axis epitaxy, highly aligned grains (FIG. 3(b)). Asymmetric 110 Phi scan of LSMO/LMO on STO shows all four 90° separated films peaks, which confirms in-plane epitaxy of all these layers. In order to understand the lattice misfit, degree of relaxation and strain between the superlattice layers, we performed reciprocal space mapping (RSM) of the oxide superlattices, which is a high resolution x-ray diffraction contour mapping of 2theta-omega scans around the Bragg's peak and shows the diffuse distribution of intensity in the vicinity of the Bragg's peak. Using a triple axis diffractometer, simultaneous measurements of the rocking angle ($\omega$) and the diffracted x-ray scattering angle $2\theta$ allows the diffractometer to draw a two dimensional map of the diffracted x-ray intensity as a function of position in the reciprocal space. A 110 asymmetric RSM of an LSMO/LMO superlattice is shown in FIG. 3c. In the RSM map, a small degree of spread (low FWHM) and highly intense peaks indicate well-aligned grain orientations which confirmed high-quality epitaxial LSMO/LMO superlattice growth on STO substrates. Cross-sectional transmission electron microscopy (TEM) images of the superlattice confirm the presence of epitaxial layered structure and high quality crystallinity with sharp interfaces (FIGS. 4(a) and 4(b)).

Figure 5A:
FIG. 5(a) is a top view SEM images of anisotropic etched LSMO/LMO superlattices with pillar heights of one micron using optimization etch recipe and the schematic of final structure of LSMO/LMO superlattices for I-V cross-plane measurement.
Figure 5B:
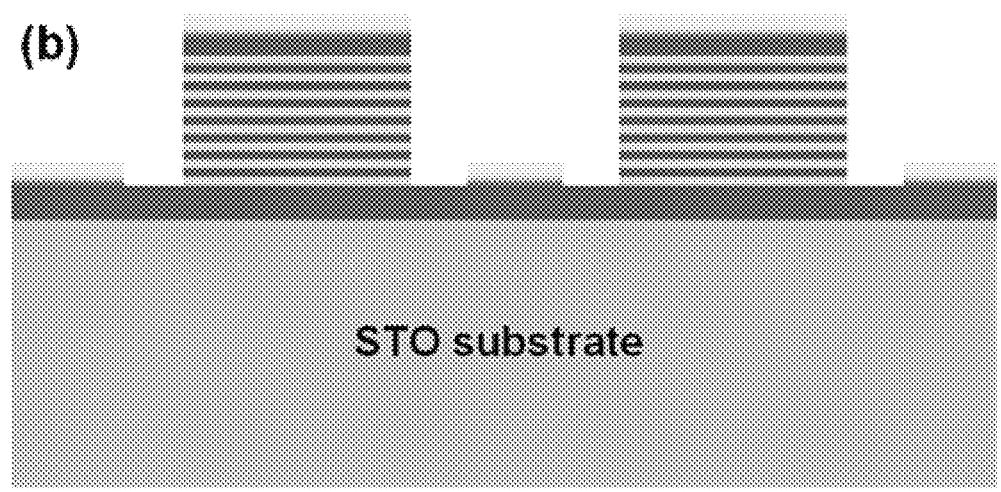
FIG. 5(b) is a schematic side view of final structure.
Figure 5C:
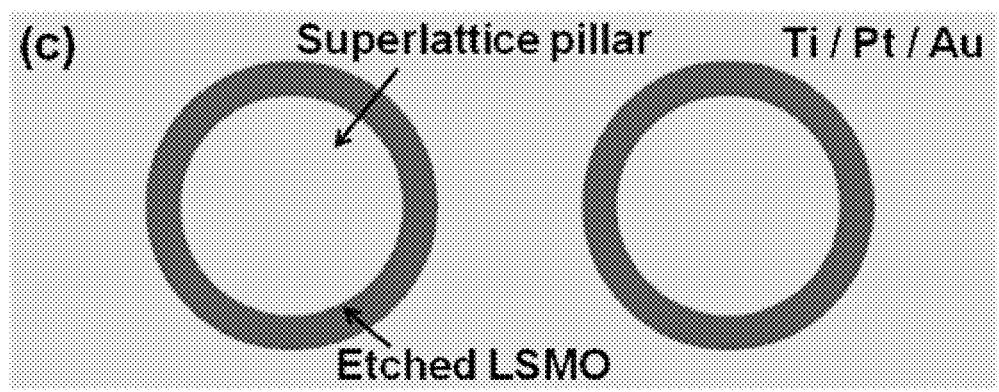
FIG. 5(c) is a schematic top view of final structure.

To perform cross-plane electrical measurements of LSMO/LMO superlattices, a cylindrical pillar structure may be etched into the superlattices. In an effort to perform etching, an LSMO/LMO superlattice etch recipe was developed using inductively coupled plasma reactive ion etching (ICP-RIE). Optically sensitive resist can be used rather than metal masks for etching to simplify the process and reduce the processing steps. The etching chemistry was designed to etch the LSMO/LMO superlattices structure as fast as possible, and to ensure the resist mask used could withstand the complete etch process. The optical resist used in our study was AZ-9260, spun to a thickness of 12 µm. For etching we used $Cl_2$/Ar chemistry of 40/10 seem, a chamber pressure of 0.7 Pa, an RF forward power of 800 W and a capacitive bias of 350 W. The high bias and low pressure provided a strong anisotropic etch. This recipe was able to etch LSMO/LMO superlattices at a rate of 44 nm/minute. The top and bottom contact metallization had three layers, Ti (10 nm)/Pt (40 nm)/Au (500 nm), with the Ti layer chosen to provide better adhesion between LSMO and Pt/Au. A series of microfabrication steps using photolithography and lift-off technique were performed to achieve cylindrical pillars (height of 900 nm and diameter of 300 µm) of the superlattice for temperature dependent I-V measurements (FIGS. 5(a), 5(b), and 5(c)).

A. LSMO and LMO Electrical Measurements

Figure 6A:
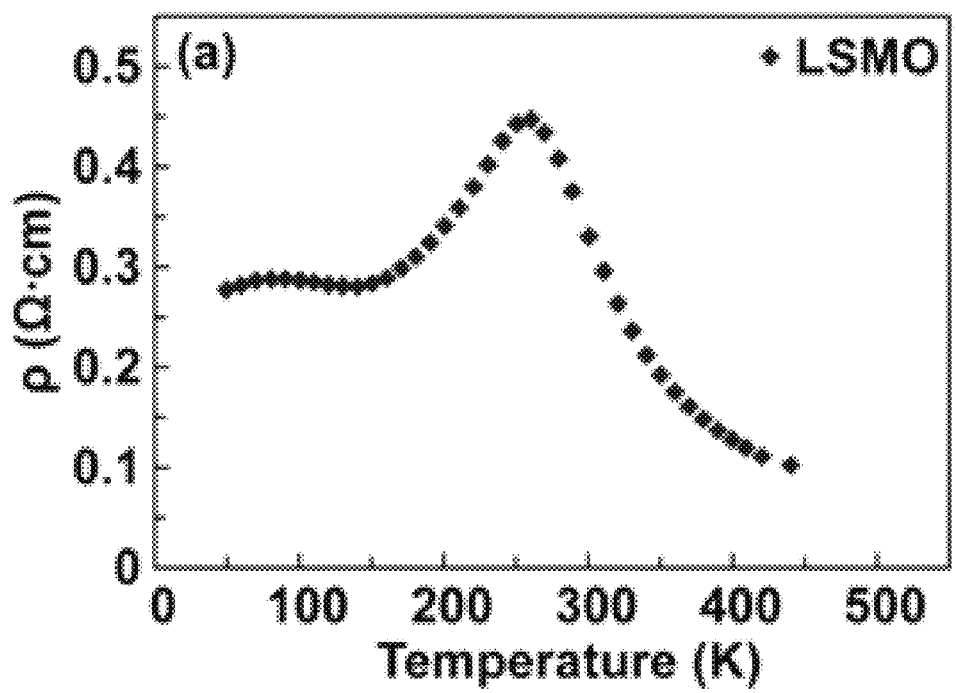
FIG. 6(a) is a temperature-dependent resistivity chart of LSMO.
Figure 6B:
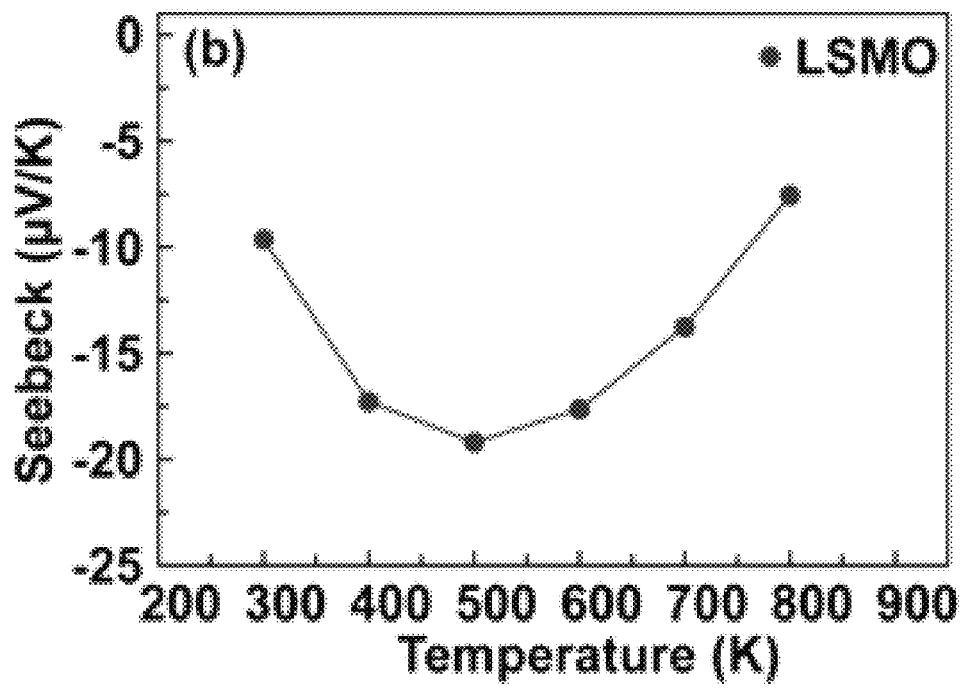
FIG. 6(b) is an in-plane Seebeck of LSMO showing Seebeck coefficient consistent with metallic behavior with a magnitude of less than 20 µV/K.

The LSMO and LMO thin films were measured using Hall effect, four-probe temperature-dependent resistivity, and in-plane Seebeck measurement techniques. The Hall effect measurement was done on a 320 nm epitaxial LSMO thin film on STO in order to determine room temperature resistivity of $3.18 \times 10^{-1}$ ohm·cm, carrier concentration of $1.38 \times 10^{20}$ cm$^{-3}$ and hole type of carrier. LSMO in-plane four-probe temperature-dependent resistivity (FIG. 6(a)) shows a magnetic transition peak at T~260K. The decrease in resistivity after the magnetic transition is a desirable effect in LSMO thin films, as LSMO shows higher conductivity at higher temperatures. The in-plane Seebeck measurement of LSMO shows Seebeck coefficient consistent with metallic behavior with a magnitude of less than 20 µV/K (FIG. 6(b)).

Figure 6C:
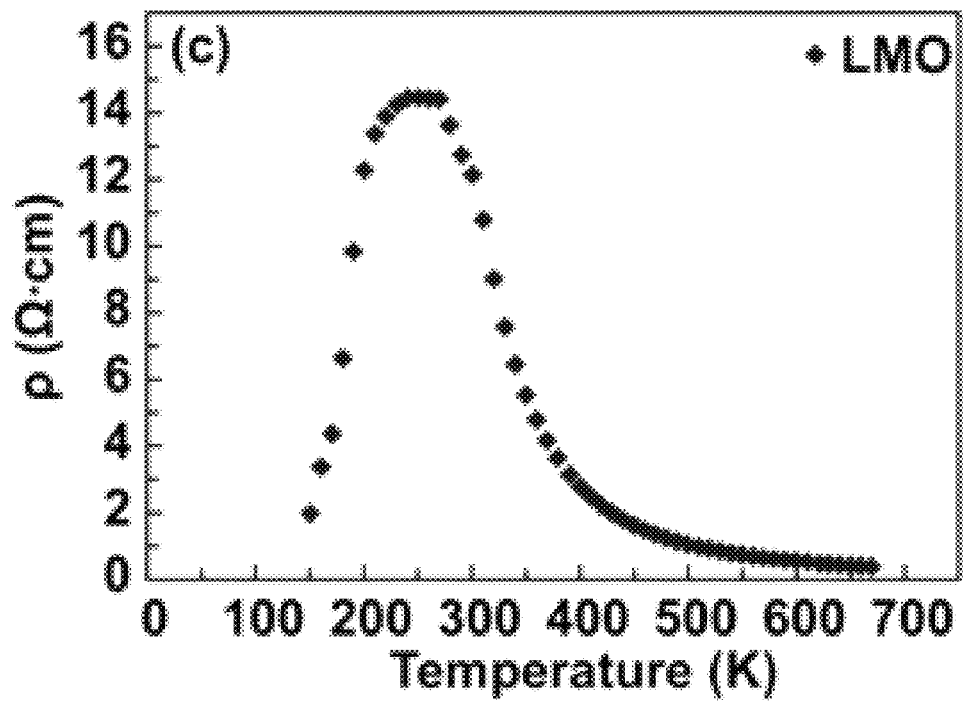
FIG. 6(c) is a temperature-dependent resistivity chart of LMO.
Figure 6D:
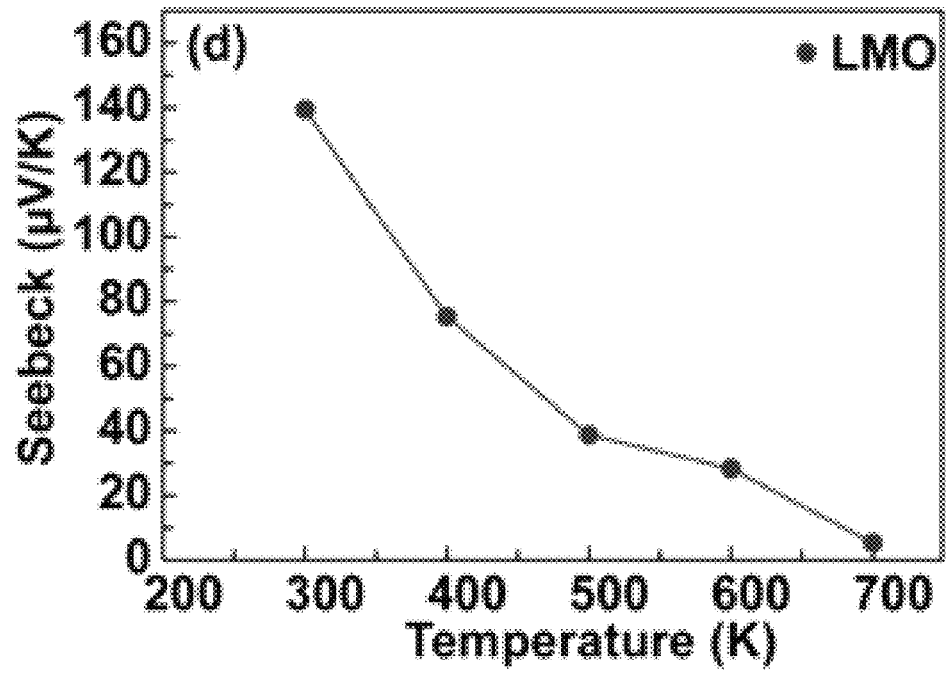
FIG. 6(d) is an in-plane Seebeck measurement validating p-type behavior of LMO.

The Hall effect measurement was done on a 400 nm epitaxial LMO thin film on STO to obtain the room temperature resistivity of 10.426 ohm·cm, carrier concentration of $6.86 \times 10^{18}$ cm$^{-3}$ and hole type of carrier. The p-type LMO thin films four-probe in-plane temperature-dependent resistivity shows magnetic transition leak at T~240K shown in FIG. 6(c). The in-plane Seebeck measurement (FIG. 6(d)) confirms that the LMO films were p-type with a room temperature Seebeck coefficient of 140 µV/K.

Figure 46A:
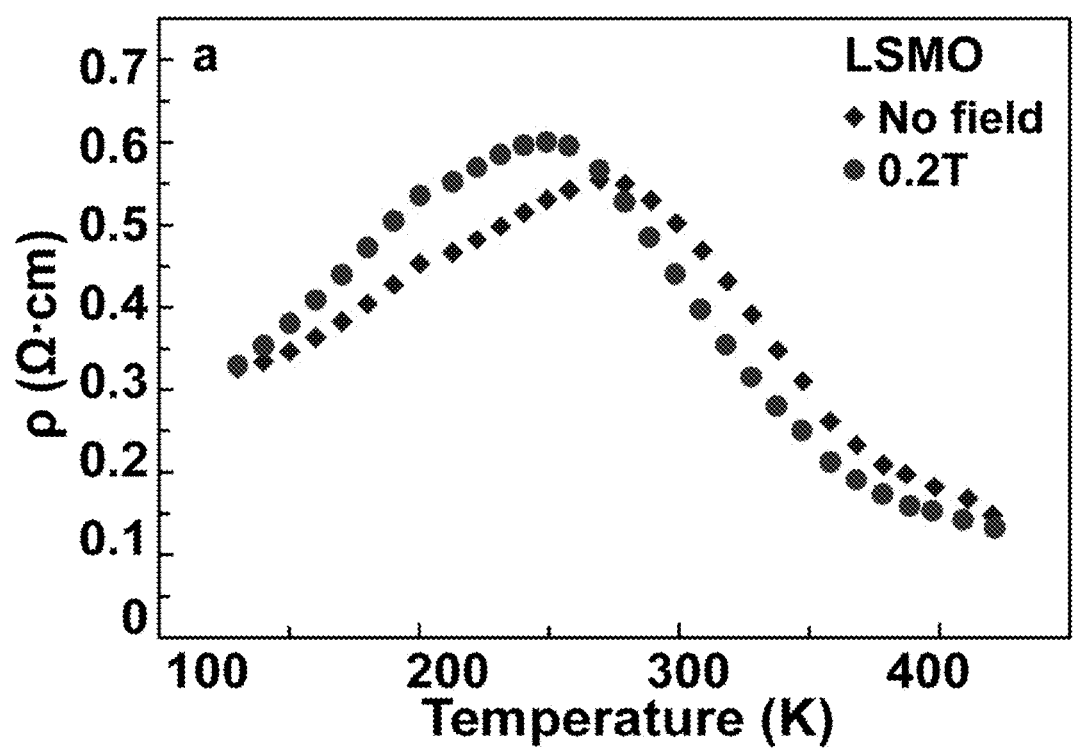
FIG. 46(a) is a temperature-dependent in-plane resistivity of LSMO.
Figure 46B:
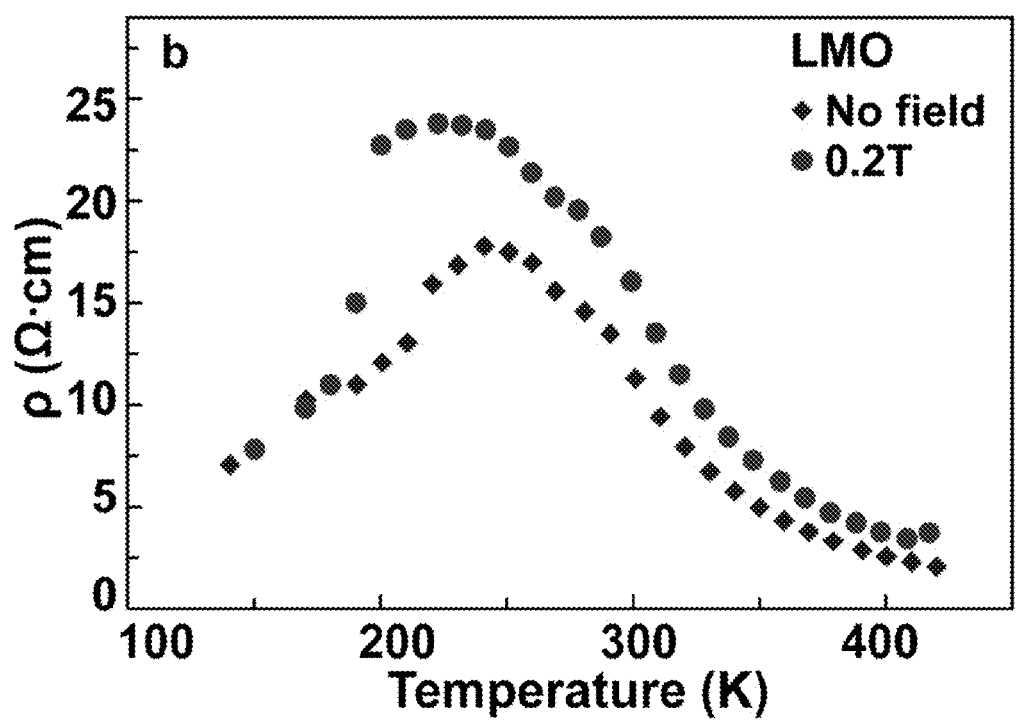
FIG. 46(b) is a temperature-dependent in-plane resistivity of LMO with and without a magnetic field applied in a direction normal to the film surface.

Epitaxial LSMO and LMO thin films were also characterized using magnetoresistance (MR) measurements. Magnetoresistance is given by $\Delta R/R_H = (R_H - R_0)/R_H$, where $R_0$ is the resistance at H=0 Tesla and $R_H$ is measured at 0.2 Tesla. The LSMO in-plane TDR shows a $T_P$ at 260K, and a magnetic field transition ($T_{PB}$) at 248K while the p-type LMO thin films show a $T_P$ at 240K and a $T_{PB}$ at 220K (FIGS. 46(a) and 46(b)). However, the maximum MR was found to be at temperatures below the $T_P$ and $T_{PB}$ temperatures; LSMO shows an MR ratio of ~16% at 210K and the LMO MR ratio is ~52% at 200K, consistent with previous studies of perovskite thin films with magnetic ions on the "B" site.

B. Cross-plane Transport in LSMO/LMO Superlattices

Figure 8A:
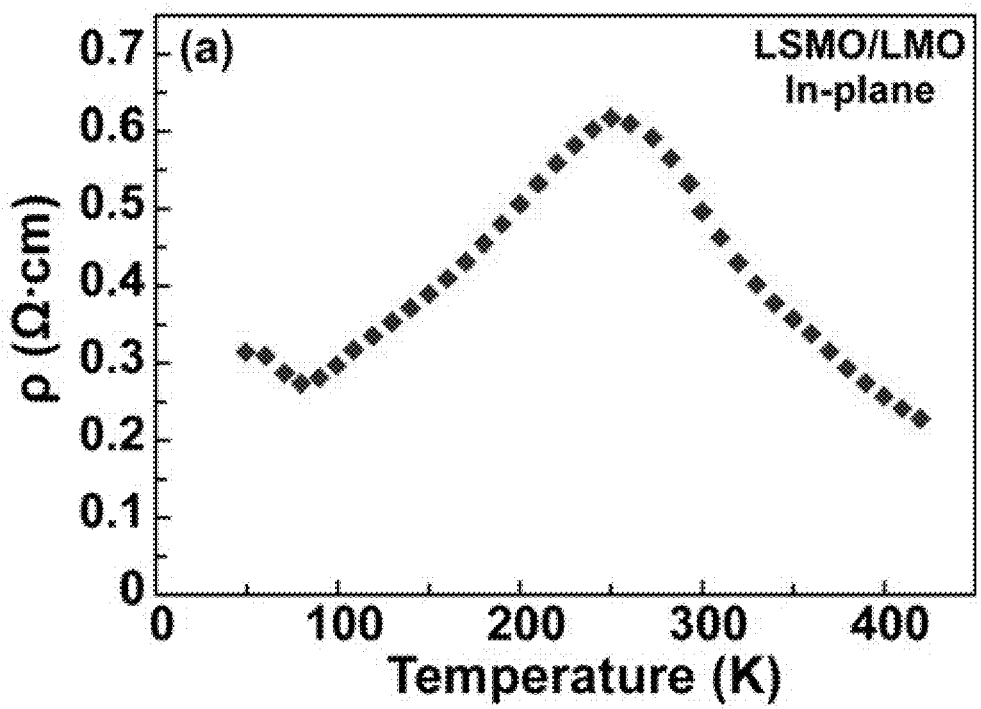
FIG. 8(a) is a measured in-plane resistivity of a p-type LSMO/LMO superlattice.
Figure 47:
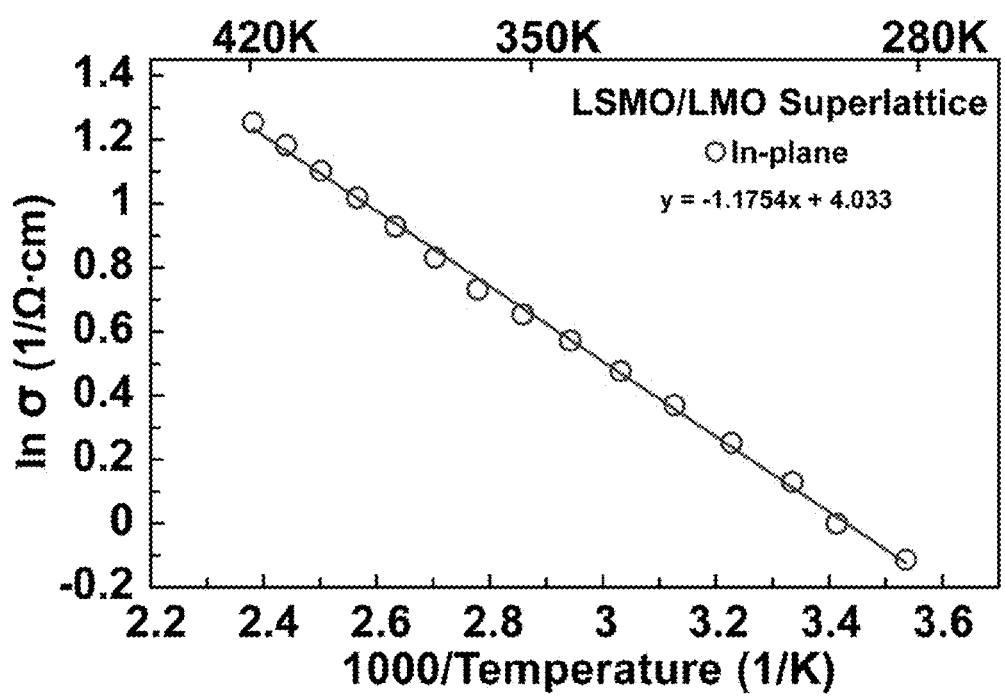
FIG. 47 is the in-plane LSMO/LMO superlattices electrical conductivity fitting plot to extract the effective thermal activation energy of 101±5 meV.

The in-plane temperature dependent resistivity of epitaxial LSMO/LMO superlattices showed a magnetic phase transition temperature ($T_P$) of 250K (FIG. 8(a)), and an extracted thermal activation energy ($E_A$) of 101±5 meV (FIG. 47).

Figure 48:
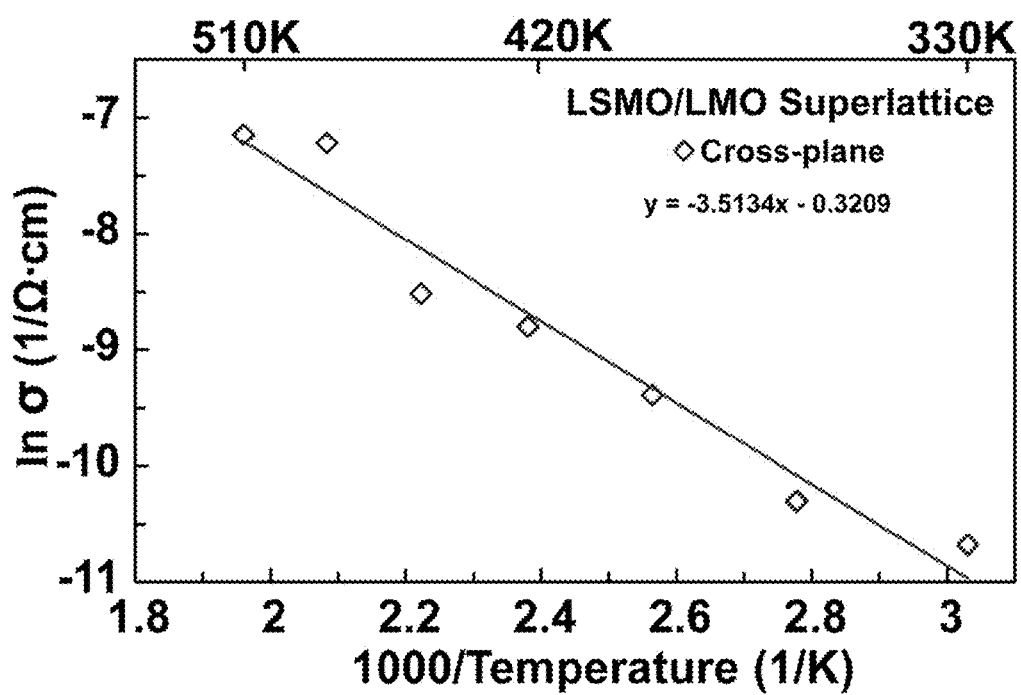
FIG. 48 is Arrhenius plot of cross-plane LSMO/LMO superlattice electrical conductivity. The fitting extracted an effective barrier height of 300±15 meV.

The extracted cross-plane conductivity of the superlattice structure may suggest a contribution from thermionic behavior above the phase transition temperature. The effective barrier height of 300±15 meV was extracted from the cross-plane temperature-dependent electrical conductivity data from LSMO/LMO superlattices assuming, for simplicity, that the activated process(es) indicated by the temperature dependence was entirely due to thermionic emission (FIG. 48). The extracted experimental barrier height is consistent with the expected LSMO/LMO Schottky barrier ($\Phi_B$) height of 300 meV at 300K.

Figure 8B:
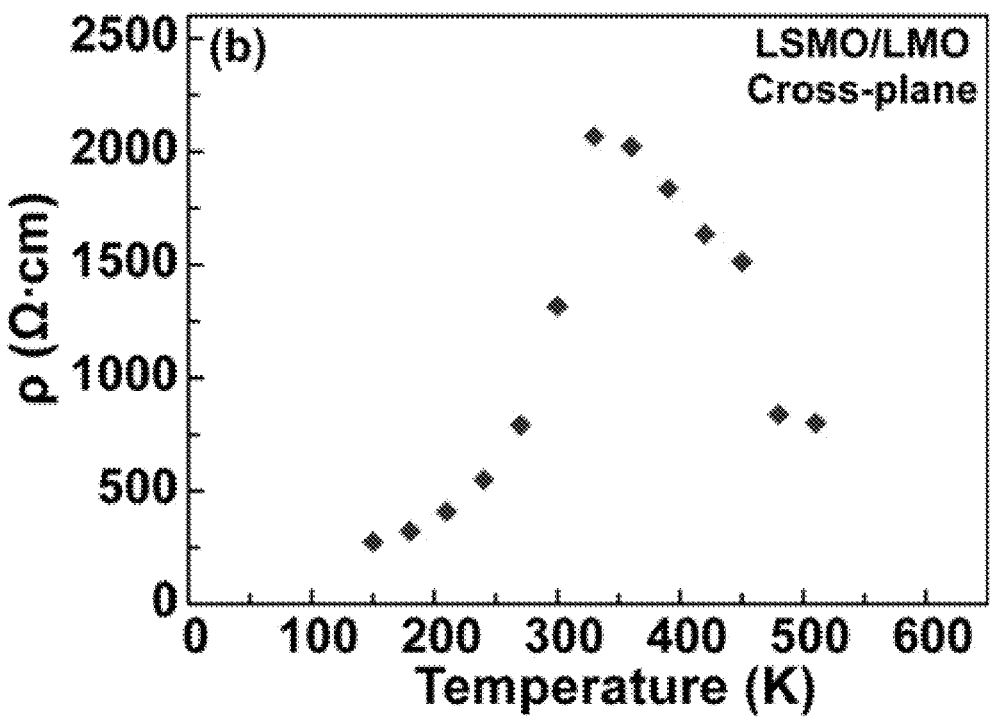
FIG. 8(b) is an extracted cross-plane resistivity using temperature dependent I-V measurement. The magnetic transition peak is shifted to T~330K in cross-plane transport through LSMO/LMO superlattices, ~80K higher than the peak observed in in-plane resistivity in LSMO, LMO or LSMO/LMO thin films.

The LSMO/LMO superlattice four-probe in-plane temperature-dependent resistivity shows magnetic transition peak at T~250K (FIG. 8(a)). The cross-plane I-V measurement was performed for the p-type LSMO/LMO superlattices as a function of temperature (100-600K). The extracted cross-plane temperature-dependent resistivity with magnetic transition peak at T~330K is given in FIG. 8(b). The extracted cross-plane conductivity of the superlattice structure suggests thermionic behavior above the transition temperature. The magnetic transition peak is shifted to T~330K in cross-plane transport through LSMO/LMO superlattices, ~80K higher than the peak observed in in-plane resistivity in LSMO, LMO or LSMO/LMO thin films.

The novel combination of LSMO/LMO hetero structure superlattices cross-plane transports for thermoelectric produces a shift in cross-plane magnetic transition above room temperature (T~330K), without any applied magnetic field. This enhancement in magnetic transition above room temperature may be useful in areas such as low-magnetic field magnetoresistance devices, sensors, and magnetic storage. LSMO half-metallic ferromagnetic characteristics with high Curie temperature and a source of spin-polarized electrons along with LMO p-type semiconducting behavior would be a material for spintronics devices. P-type LSMO/LMO with Schottky barrier might provide a potential material system to preserve spin injection across the interface without using a thin insulating tunnel barrier to fabricate spintronics devices around room temperature.

C. LSMO/LMO Superlattices Thermal Conductivity Measurements

Figure 7A:
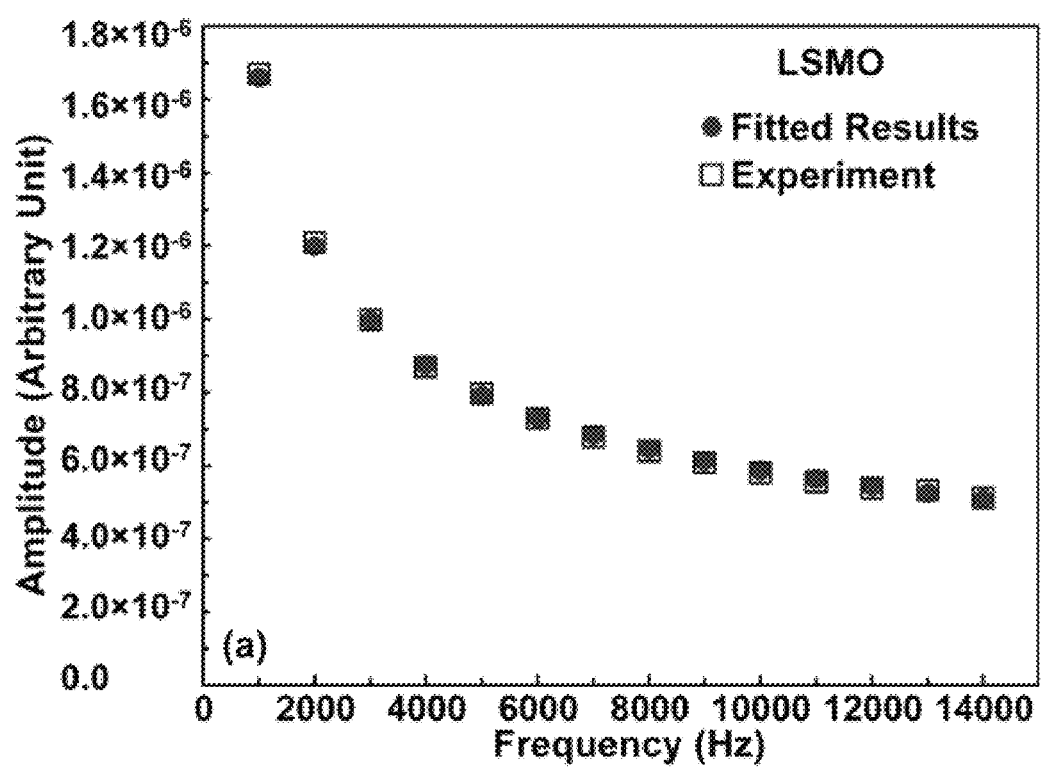
FIG. 7(a) is a photo-acoustic (PA) experimental amplitude measurement as a function of the modulation frequency for the LSMO sample.
Figure 7B:
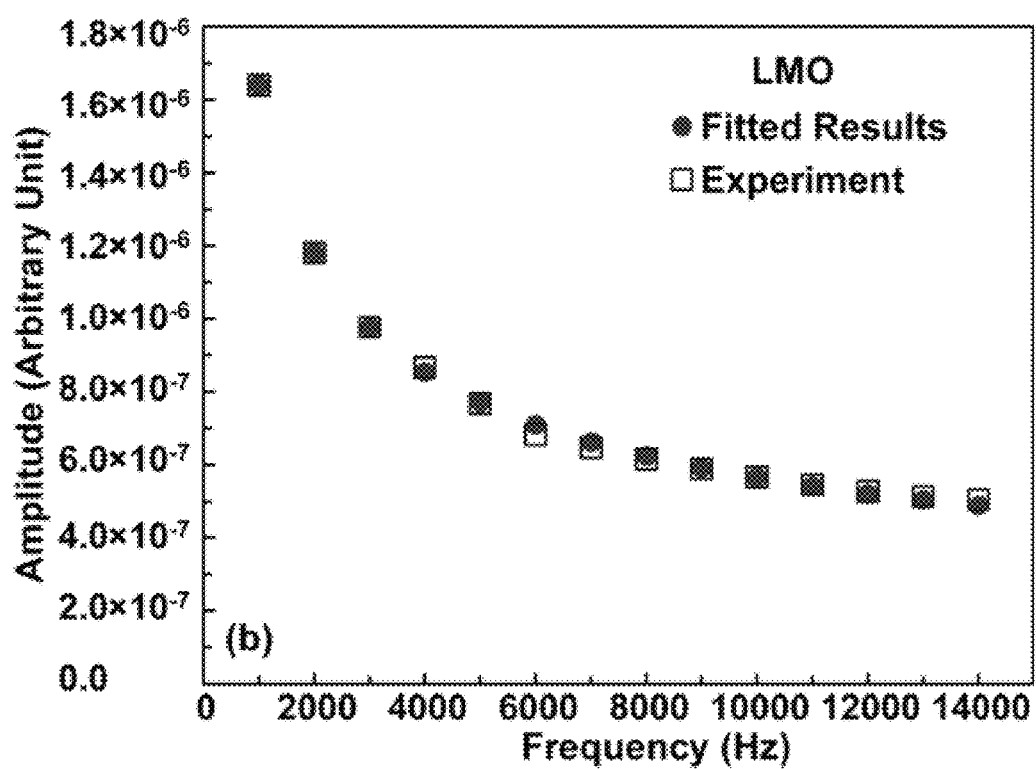
FIG. 7(b) is a photo-acoustic (PA) experimental amplitude measurement as a function of the modulation frequency for the LMO sample.
Figure 7C:
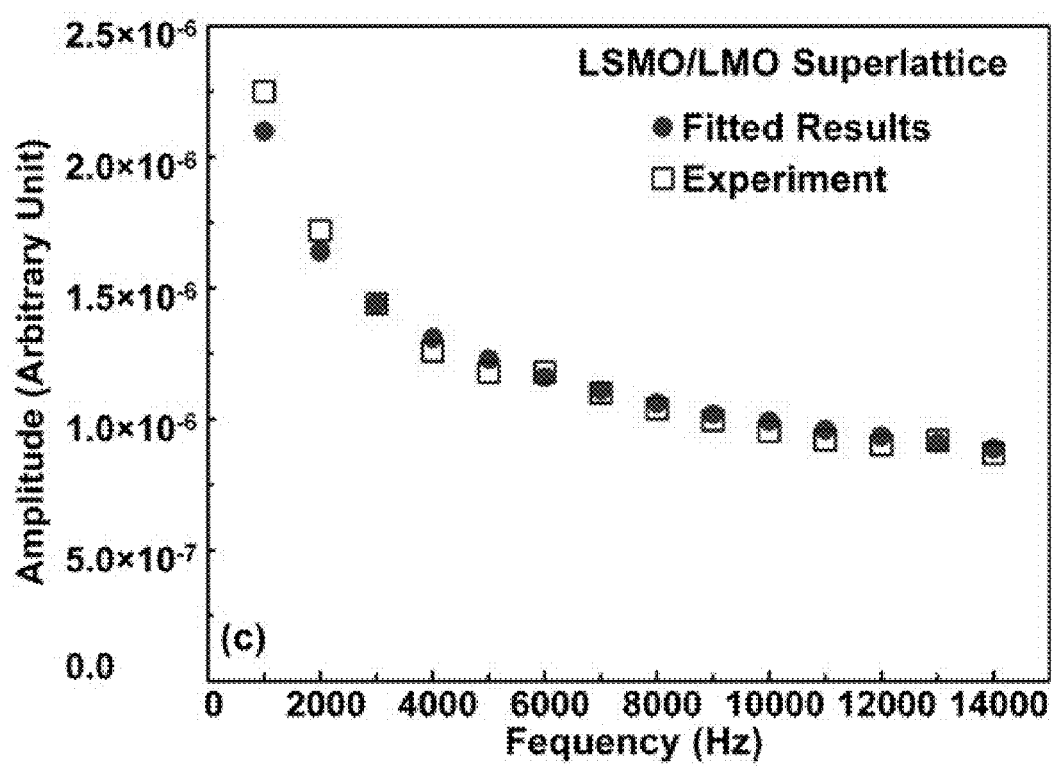
FIG. 7(c) is a PA experimental amplitude measurement as a function of the modulation frequency for the LSMO/LMO superlattices material system.

Thermal conductivity measurements on LSMO and LMO thin films, as well as p-type LSMO/LMO superlattices are essential to evaluate its technological applications. The room temperature thermal conductivity of thin films and superlattices were measured using the photoacoustic (PA) technique. A diode laser operating at wavelength of 0.8 μm is used as a heating source and the laser power driver is sinusoidally modulated by the function generator of a lock-in amplifier with a laser power output of ~150 mW during modulation. The sample is coated with 80 nm of titanium metal layer using e-beam evaporator in a cleanroom environment. Each sample and reference STO bare substrates were coated with Ti simultaneously to achieve the same thickness uniformity and tolerance. Sample is heated by laser beam to generate the acoustic signal. The maximum rise in temperature at the sample surface is less than 0.5° C. A condenser microphone which is built into the PA cell is used to sense the acoustic signal and transmit to a lock-in amplifier that measures its amplitude and phase shift of the pressure signal. The lock-in amplifier is connected to a computer for data acquisition and control. The measured cross-plane room temperature thermal conductivities of epitaxial thin films of LSMO and LMO are 1.60 W/m·K and 1.29 W/m·K, respectively. Moreover, the cross-plane thermal conductivity of p-type LSMO/LMO superlattices material system is 0.89 W/m·K, which is lower than the reported value for oxide bulk, composite materials or heavy metal alloys. The summarized thermal conductivity results are shown in Table 1 and the experimental amplitude measurement of PA signal fitting plots of metallic LSMO, p-type semiconducting thin film LMO and LSMO/LMO superlattices are shown in FIGS. 7(a), 7(b), and 7(c). The Wiedemann-Franz law ($\kappa_e = L_o \sigma T$) was used to calculate the electronic contribution ($\kappa_e$), where $L_o = 2.44 \times 10^{-8}$ W$\Omega$K$^{-2}$. The lattice contribution to the total thermal conductivity ($\kappa_l$) was determined using ($\kappa_l = \kappa_T - \kappa_e$). The estimated lattice contribution of LSMO, LMO and LSMO/LMO superlattices are 1.598 W/m·K, 1.289 W/m·K and 0.889 W/m·K, respectively. The lattice thermal conductivity has dominant contribution to the total thermal conductivity, i.e. conventional behavior in oxides. LSMO/LMO superlattices showed a room temperature thermal conductivity of 0.89 W/m·K, which is lower than either LSMO (1.60 W/m·K) or LMO (1.29 W/m·K) thin films. The reduction in thermal conductivity using p-type perovskite LSMO/LMO superlattice may be beneficial in the development of perovskite oxide thermoelectrics.

In summary, the novel p-type LSMO/LMO superlattices material system as a p-type thermoelectric generator element is presented. We successfully optimized the growth parameter using PLD to achieve the p-type epitaxial thin film of LMO with a room temperature Seebeck coefficient of 140 μV/K and metallic LSMO. The optimized growth parameters of p-type LSMO and LMO were used to obtain high quality epitaxial, micron-thick LSMO/LMO superlattices. XRD and TEM characterization demonstrated the superlattices were of high quality and were consistent with epitaxial films. LSMO/LMO etch recipe ($Cl_2$/Ar chemistry) was developed with photoresist as a mask to perform cross-plane electrical transport measurements using ICP-RIE. The measured cross-plane resistivity of micron-thick LSMO/LMO superlattices of high epitaxial quality shows an enhancement of the magnetic transition peak, to T~330K: ~80K higher than either LSMO (T~260K), LMO (T~240K) thin films or in-plane LSMO/LMO superlattices (T~250K). A room temperature transition may be beneficial for low-magnetic field magnetoresistance devices, magnetic data storage and potential use of ferromagnetic/semiconducting oxide LSMO/LMO into spintronics devices applications. The cross-plane thermal conductivity achievable in the LSMO/LMO superlattices was 0.89 W/m·K (at room temperature), 44%-31% lower than their individual thin film counterparts (LSMO and LMO).

LIST OF ABBREVIATIONS

Thermoelectric Devices ("TE")
Thermionic Devices ("TI")
Thermoelectric Figure of Merit ("ZT")
Kelvin ("K")
Total Thermal Conductivity ("$\kappa_T$")
Electronic Contribution of Thermal Conductivity ("$\kappa_e$")
Lattice Contribution of Thermal Conductivity ("$\kappa_l$")
Power factor ("$S^2\sigma$")
Lanthanum Manganate ($LaMnO_3$, i.e., LMO)
Lanthanum Strontium Manganate ($LaSrMnO_3$, i.e., LSMO)
Strontium Titanate ($SrTiO_3$, i.e., STO)
Transition Metal Oxides ("TMO")
X-ray Diffraction ("XRD")
X-ray Reflection ("XRR")
Reciprocal Space Mapping ("RSM")
Scanning Electron Microscopy ("SEM")
Transmission Electron Microscopy ("TEM")

Metal/semiconductor superlattices with cross-plane transport offer a novel approach towards improving the thermoelectric figure of merit (ZT) over conventional thermoelectric materials operating at high temperatures 800-1000K. The perovskite oxides are a materials system for these metal/semiconductor superlattices due to their diverse range of properties, which allows tuning of the intertwined thermoelectric properties.

Lanthanum Strontium Manganate (LSMO)/Lanthanum Manganate (LMO) perovskite oxide metal/semiconductor superlattices were investigated as a potential p-type thermoelectric generator element operating at 800-1000K. Epitaxial superlattices of LSMO (metal) and LMO (p-type semiconductor) were deposited on Strontium Titanate (STO) substrates using pulsed laser deposition in an oxygen ambient environment. Individual films and superlattice materials were characterized by high-resolution x-ray diffraction, reciprocal space mapping and transmission electron microscopy.

LSMO/LMO superlattices exhibited a room temperature thermal conductivity (0.89 W/m·K) lower than either LSMO (1.60 W/m·K) or LMO (1.29 W/m·K) thin films individually. In addition to a low thermal conductivity, a high ZT requires a high power factor, the product of the electrical conductivity and the square of the Seebeck coefficient. In an effort to perform cross-plane electrical transport measurements, an LSMO/LMO superlattice etch recipe was developed using reactive ion etching. A series of micro-fabrication steps resulted in cylindrical pillars of the superlattice. Cross plane I-V-T measurements yielded preliminary data for cross-plane conductivity, the Seebeck coefficient and the Schottky barrier height. The measured cross-plane conductivities of LSMO/LMO superlattices suggest a combination of magnetic transitions and thermionic behavior.

The novel approach of using p-type perovskite oxide superlattices of LSMO/LMO using cross-plane transport has the potential to provide a new high temperature thermoelectric material system.

A novel perovskite oxide p-type metal/semiconductor materials system was studied for thermoelectric generation operating in the high temperature range of 800-1000K.

Thermoelectric Effects

Thermoelectric power generation is based on the Seebeck effect. The Seebeck effect was discovered in 1821 by the German physicist Thomas Johann Seebeck and is used for converting a thermal gradient into electrical energy. Seebeck found that a voltage is produced when two different metal wires are joined together at both ends with a temperature differential between the two ends. The Seebeck coefficient (S) is defined as the ratio, $S=\Delta V/\Delta T$. Metals typically have low Seebeck coefficients, on the order of 1-10 μV/K, whereas semiconductors have higher Seebeck coefficients, on the order of 100-1,000 μV/K.

Thermoelectric refrigeration is a complementary effect that is based on the Peltier effect. The Peltier effect was discovered in 1834 by Jean Peltier and is used for converting electrical energy into a thermal gradient (i.e. refrigeration). In the Peltier effect, if a current is passed through two different metal wire junctions, heating or cooling will take place depending on the direction of current flow. The Peltier coefficient (π) is the ratio of $\pi=Q/I$ where, Q is heating or cooling rate at the junction.

Thermoelectric Modules

Thermoelectric (TE) device modules are made of several hundreds of individual n-p couples connected electrically in series and thermally in parallel. An individual TE couple consists of an n-type leg (electron carrier) with a negative Seebeck coefficient and a p-type leg with a positive Seebeck coefficient (hole carrier) which are connected using metallic contacts.

Thermoelectric Figure of Merit

The thermoelectric device performance and efficiency for generation and refrigeration is given by dimensionless figure of merit, ZT, where T is the absolute temperature in Kelvin (K) and Z specifics the materials, electrical and thermal transport properties. The figure of merit ZT, is given by:

$$ZT = \frac{S^2 \sigma}{K_e + K_l} T$$

Where,
S=Seebeck coefficient (μV/K)
σ=Electrical conductivity ($\Omega^{-1}$ $m^{-1}$)
$\kappa_T=(\kappa_T=\kappa_e+\kappa_l)$ Total thermal conductivity (W/m·K)
$\kappa_e$=Electronic contribution of the total thermal conductivity
$\kappa_l$=Lattice contribution of the total thermal conductivity
T=Absolute temperature (K).

Figure 9:
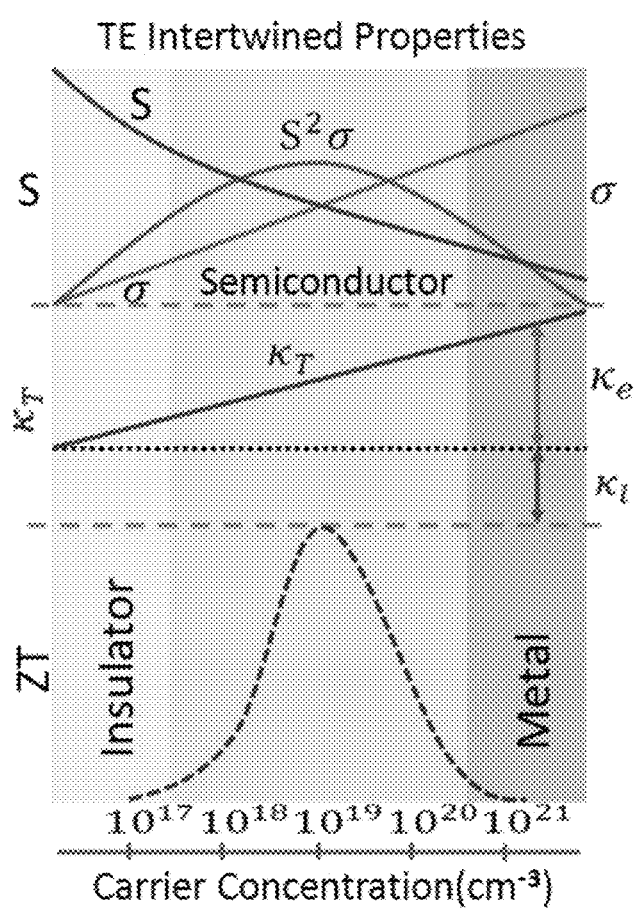
FIG. 9 is a schematic showing intertwined thermoelectric material properties.

ZT can be maximized by increasing the power factor $S^2\sigma$ and reducing the total thermal conductivity ($\kappa_T=\kappa_e+\kappa_l$). It can be easily concluded from ZT that a material with a high Seebeck coefficient is desired for efficient conversion and high electrical conductivity to reduce the joule heating in the generator. Low thermal conductivity is also desired to maintain a temperature gradient and loss of thermal energy. It would seem intuitive that one simply needs to increase S and σ while reducing $\kappa_T$; however, these materials properties are interdependent (FIG. 9).

In an optimal case, a high ZT material has a carrier concentration in the range of $10^{19}$ carriers/$cm^3$, similar to a heavily doped semiconductor. Metals have a higher carrier concentration, but their low Seebeck and high thermal conductivity result in low ZT. Insulators have larger Seebeck coefficients, but lower ZT due to extremely low electrical conductivities. Significant ZT enhancement is restricted due to $\kappa_e$, which is related with σ through the Wiedemann-Franz law ($\kappa_e=L\sigma T$), were L is the Lorenz factor. The contribution of $\kappa_l$ to the total thermal conductivity can be drastically reduced by alloying.

The comparative study done by G. Chen and Ali Shakouri showed that ZT>2 is required for thermoelectric generator to compete with established commercially-viable power generation technologies.

Thermoelectric Materials Review

The last 50 years of progress in TE materials and devices has resulted in commercial cooling devices with ZT=~1 using bismuth telluride ($Bi_2Te_3$) and its alloys [$(Bi_{1-x}Sb_x)_2$ $(Te_{1-x}Se_x)_3$] around room temperature, and $Si_{1-x}Ge_x$ for high temperature (800-1000K) applications.

Interest in TE returned around 1990 after the theoretical work of Hicks and Dressclhaus. They proposed to enhance the power factor ($S^2\sigma$) using quantum confinement of charge carriers by modifying the bulk materials structure into quantum wells, superlattices and wires. The transport along these 2D and 1D structures reduces the thermal conductivity by introducing boundary scattering. The promising advantages of low dimensional structures was experimentally observed by Venkatasubramanian et al. in 2001 in p-type $Bi_2Te_3/Sb_2Te_3$ superlattice structures with a room temperature ZT of 2.4. Harman et al. have shown a room temperature ZT of 1.6 in PbSeTe/PbTe based quantum dot superlattices. However, it was not clear how much quantum confinement helped in improving ZT, and it has been suggested that the enhancement is almost entirely due to phonon reflection and scattering at interfaces.

Thermionic Devices

In 1994, Ali Shakouri and coworkers proposed that a further enhancement in ZT to values as high as 5-6 might be possible using the concept of cross-plane ballistic transport in metal/semiconductor multilayer structures. This device is known as a solid-state thermionic (TI) energy converter. Both TE and TI devices are based on the Seebeck and Peltier effects. TI based devices have high efficiency as the carrier transport is ballistic across the barrier. These devices have an electron mean free path (λ~50-100 nm) longer than width of barrier (L) which is greater than $L_t$ (minimum thickness to prevent the electron from tunneling ~5-10 nm). In TE devices the width of the barrier is longer than the electron mean free path so in this quasiequilibrium condition, carrier flow is diffusive.

Shakouri et al. suggested that the application of metal/semiconductor superlattice hetero structures in which the barrier to carrier transport is the Schottky barrier height, promise an enhancement in ZT. However the development by Radtke et al. showed that the TI thermoelectric power factor is smaller than that of a comparable TE material and the main advantage of the multilayer structure was only to reduce the phonon thermal conductivity. Later, Shakouri showed that highly degenerate semiconductor and metal superlattices in the quasilinear transport regime with non-conserved lateral momentum allow a much larger number of hot carriers to participate in the conduction process, which will improve the performance of the thermionic energy converter. In the case of non-conserved lateral momentum, the carrier momentum along the z-direction (perpendicular to interface) is not coupled with momentum along x and y-direction, which in turn increases the number of hot carriers participating in conduction.

Review of Oxide Thermoelectric Materials

The existing thermoelectric devices for high temperature applications (>900K) use silicon-germanium alloys for n-type and p-type couples with fairly low ZT (~0.6) due to the high thermal conductivity of the diamond structure. The highest ZT materials are intermetallic compounds such as $Bi_2Te_3$ and $CoSb_3$ but the practical application of these materials at high temperatures is restricted because of their low melting or decomposition temperatures and scarce and toxic component elements.

Perovskite oxides have been extensively researched across wide range of applications, e.g. as insulating dielectrics, metals, ferro- and anti-ferroelectrics, ferro- and anti-ferromagnetics, multiferroics, superconductors, spin entropy devices and thermoelectrics. Their thermal and chemical stability at elevated operating temperature and low production costs make perovskite oxides an attractive candidate for TE devices. Perovskite oxides have been previously avoided for TE devices due to strong ionic behavior resulting in narrow conducting bandwidths from weak orbital overlap leading to localized electrons with low carrier mobilities.

Conventional thoughts on oxides changed when large power factors were observed by Terasaki et al. in the perovskite-type magnetic layered cobalt oxide material, $Na_xCo_2O_4$. This material contains ionic bonds (as compare to classical TE material which is covalently bonded) and properties can be tuned by varying the doping of sodium atoms (Table 1.1).

TABLE 1.1

Comparison of the thermoelectric properties of $Na_xCoO_4$ and $Bi_2Te_3$.

| Parameters | Unit | $NaCo_2O_4$ | $Bi_2Te_3$ |
| --- | --- | --- | --- |
| ρ | m Ω cm | 0.2 | 1 |
| \|S\| | μV/K | 100 | 200 |
| $S^2/\rho$ | $\mu W/K^2$ cm | 50 | 40 |
| μ | $cm^2/V$ s | 13 | 150 |

The power factor is comparable to and the mobility is one order of magnitude lower than those of $Bi_2Te_3$, which suggests that a low mobility conductor can also be an efficient thermoelectric material. In-plane room temperature thermal conductivity is around 4-5 W/m·K and using the Wiedemann-Franz law, the lattice thermal contribution is estimated to be 1-2 W/m·K, which is comparable to the values for conventional thermoelectric materials. Low lattice thermal conductivity is attributed due to the disordered Na layer in which Na ions and vacancies make a "solid solution". The ZT for these p-type oxides in a single crystal is 0.7-0.8 at 1000K. Later, Ito et al. demonstrated an Ag-doped $NaxCo_2O_4$, with a ZT of 0.95 at 1000K.

Wang et al. suggested that the large power factor in $Na_xCo_2O_4$ is due to its antiferromagnetic behavior at room temperature. The spin states are free to transfer about the crystal and these "moving spins" (spin entropy) carry energy which contributes to the power factor. It has been verified that the power factor is suppressed in the presence of a magnetic field applied in the plane of the layered-oxide material, blocking the movement of the spins. Terasaki et al. conversely attributed the large S to large spin and orbital degrees of freedom on $Co^{4+}$ in the low-spin state. This large unexpected power factor in layered cobalt oxide materials inspired the research for high ZT p-type materials in $Ca_3Co_4O_9$ and $Bi_2Sr_3Co_2O_y$ structures. Cobalt oxides with thermoelectric figures of merit greater than 1 above 700K are promising over conventional p-type materials at high temperature. Hiromichi et al. later concluded that metal-oxide ZT values exceeding 2 would be limited by their large $\kappa_T$ values of 3-10 W/m·K (compared with those of the heavy metallic alloys, at 0.5-2 W/m·K). While these investigations have attracted a great deal of research, no major breakthroughs in oxide TE have yet emerged.

Research Statement

The progress so far in TE shows promise to increase ZT, but currently available high ZT materials are restricted to a temperature limit of about 1000K due to their decomposition and low conversion efficiency. The potential of novel p-type perovskite oxide metal/semiconductor superlattice materials systems was investigated for high ZT, and for stability and reliability at high temperatures 800-1000K.

A prospective candidate materials system can incorporate the ideas from previous theories and results for ZT enhancement. The study by Shakouri shows that a Schottky barrier height of 120 meV (~5 kT) in metal/semiconductor structure can yield a ZT as high as 7.0. Incorporating structures that decouple electronic and thermal transport is also important; for example, low-dimensional 2-D superlattice structures can allow reduction in thermal conductivity as interfaces scatter the phonons more effectively, while hot electrons may be scattered at these coherent interfaces to a lesser degree (phonon blocking and electron transmitting superlattices).

P-type perovskite oxide metal semiconductor superlattices are investigated as a yet unexplored materials system for thermoelectric generation. In our work, epitaxial LSMO are metallic and LMO are p-type semiconducting. The LSMO/LMO superlattices exhibited a room temperature thermal conductivity of 0.89 W/m·K. The lower thermal conductivity provides a potential solution to achieve metal oxide ZT values greater than 2.

Perovskite Oxide Thermoelectrics

This section discusses the diverse properties of perovskite oxide materials in the context of using these materials for thermoelectric application. It also covers the material selection criterion for LSMO (metal) and LMO (p-type semiconductor) perovskite oxides for realizing metal/semiconductor superlattices.

Perovskite Oxides

Figure 10:
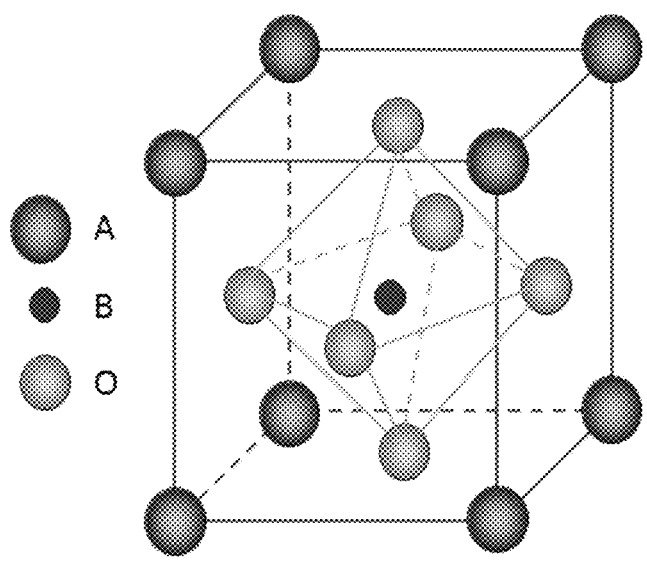
FIG. 10 is a schematic showing cubic/pseudo-cubic structure ($ABO_3$).
Figure 11A:
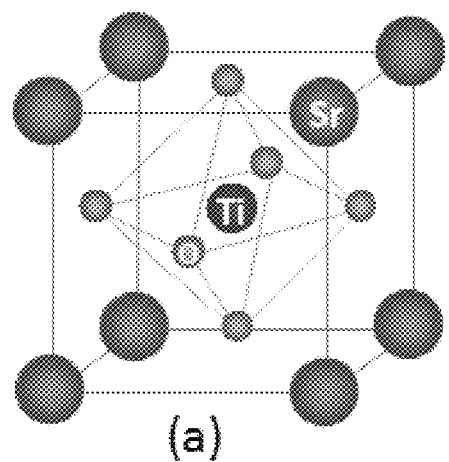
FIG. 11(a) is a schematic of perovskite oxide unit cells for (a) $SrTiO_3$ (STO). Lattice constant of $a_{STO}$=3.91 Å.
Figure 11B:
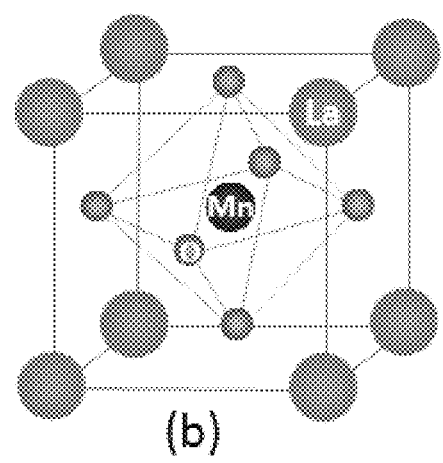
FIG. 11(b) is a schematic of perovskite oxide unit cells for (b) LaMnO$_3$ (LMO). Lattice constant of $a_{LMO}$=3.95 Å.
Figure 11C:
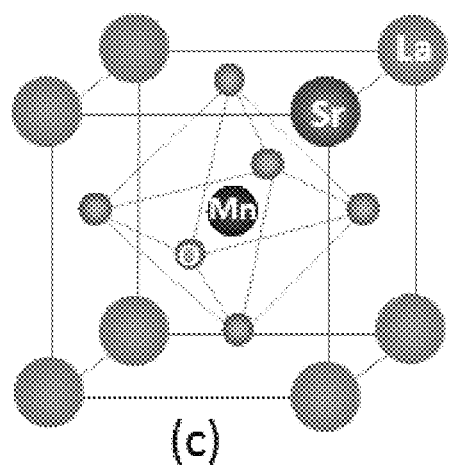
FIG. 11(c) is a schematic of perovskite oxide unit cells for (c) La$_{1-x}$Sr$_x$MnO$_3$ (LSMO). Lattice constant of $a_{LSMO}$=3.885 Å (at x=0.33).
Figure 12A:
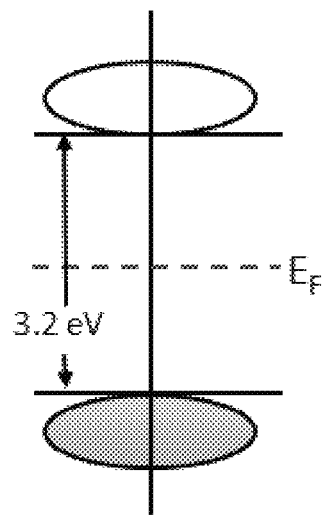
FIG. 12(a) is an electronic band structure of SrTiO$_3$. The filled bands are shown in dark and arrow denotes electron spins. The STO is a band insulator.
Figure 12B:
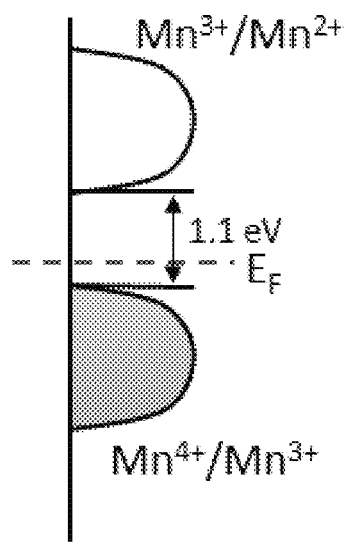
FIG. 12(b) is an electronic band structure of LaMnO$_3$. The filled bands are shown in dark and arrow denotes electron spins. The LMO is a p-type semiconductor.
Figure 12C:
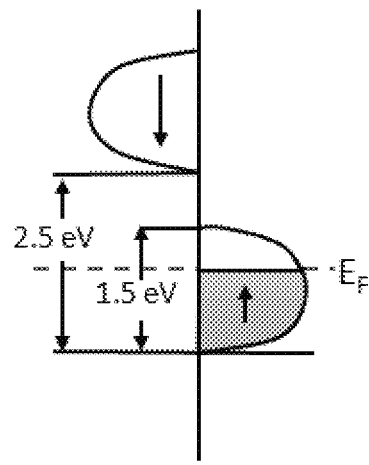
FIG. 12(c) is an electronic band structure of La$_{1-x}$Sr$_x$MnO$_3$. The filled bands are shown in dark and arrow denotes electron spins. The LSMO is half-metallic (up electron spin denotes metallic and down insulating).
Figure 12D:
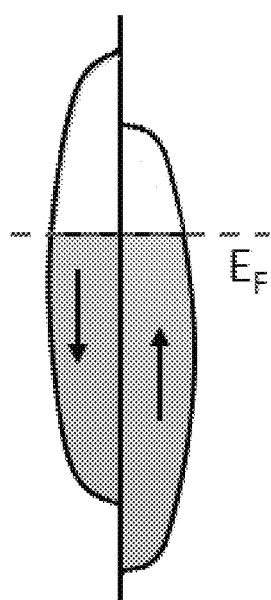
FIG. 12(d) is an electronic band structure of Ni. The filled bands are shown in dark and arrow denotes electron spins. The Ni is a conventional ferromagnetic metal with both up and down spin occupied.

As illustrated by FIG. 10, the perovskite oxides have a general formula of $ABO_3$. These materials possess highly diverse and versatile functional properties. In some of the complex perovskites the general formula is given as $A(B_xB_y)O_3$ where x+y=1. The A and B are cations and oxygen (O) is the anion at an FCC position. The A element is commonly occupied by rare earth or alkaline earth metals whereas the B atom can be a rare-earth (also known as group 3) or a transition metal. The A cation is coordinated with twelve oxygen ions and the B cation with six oxygen ions in octahedral coordination. Thus, the A cation is normally larger than the B cation. Stability of the perovskite oxides is related by tolerance factor (T), $T=r_A+r_O/\sqrt{2r_B+r_O}$ where $r_A$, $r_B$, and $r_O$ are the ionic radii, respectively. Perovskite oxides with 0.89<T<1.00 are stable in the cubic phase, T<0.89 are stable in the orthorhombic phase, and T>1.00 in the rhombohedral phase. Any structural distortion leads to a rotation of the $BO_6$-octahedron, which is consequently responsible for their diverse magnetic and electronic properties.

The relatively small structural variation between different perovskite oxide allows growth of epitaxial superlattices with sharp interfaces, and unique interface characteristics. Strontium Titanate $SrTiO_3$ (STO), parent manganese compound Lanthanum Manganate, $LaMnO_3$ (LMO) and its Sr hole doped derivative, Lanthanum Strontium Manganate $La_{1-x}Sr_xMnO_3$ (LSMO), were investigated. Schematics in FIGS. 11(a), 11(b), 11(c), 12(a), 12(b), 12(c) and 12(d) show unit cell and electronic band structures of STO, LMO and LSMO.

Figure 13:
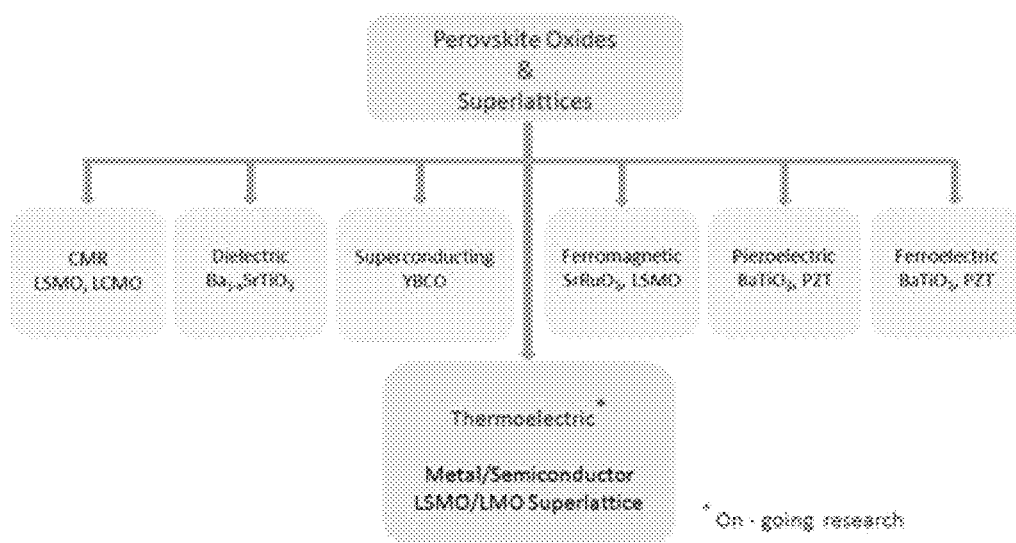
FIG. 13 is a schematic showing diverse electrical properties of perovskite oxides.

The perovskites' versatile electrical properties are easily tunable by varying the oxygen stoichiometry, by doping or by applying an electric field (FIG. 13). The undistorted perfect cubic, $SrTiO_3$ at room temperature is an insulator, but the $SrTiO_{3-x}$ oxygen deficient derivative is conducting or superconducting. The parent manganese compound $LaMnO_3$ is anti-ferromagnetic and insulating in its ground state. $LaMnO_3$ undergoes a structural transformation at T-523K from the Jahn-Teller distorted orthorhombic phase to a high temperature cubic semiconducting phase. Sr and Ca doped $LaMnO_3$ derivatives become metallic/ferromagnetic and also show effects like colossal magnetoresistance in metallic multilayers.

Thermoelectric Perovskite Material Selection

Perovskite materials for thermionic energy conversion devices provide chemical and thermal robustness, abundance in nature and low manufacturing cost benefits.

Figure 14:
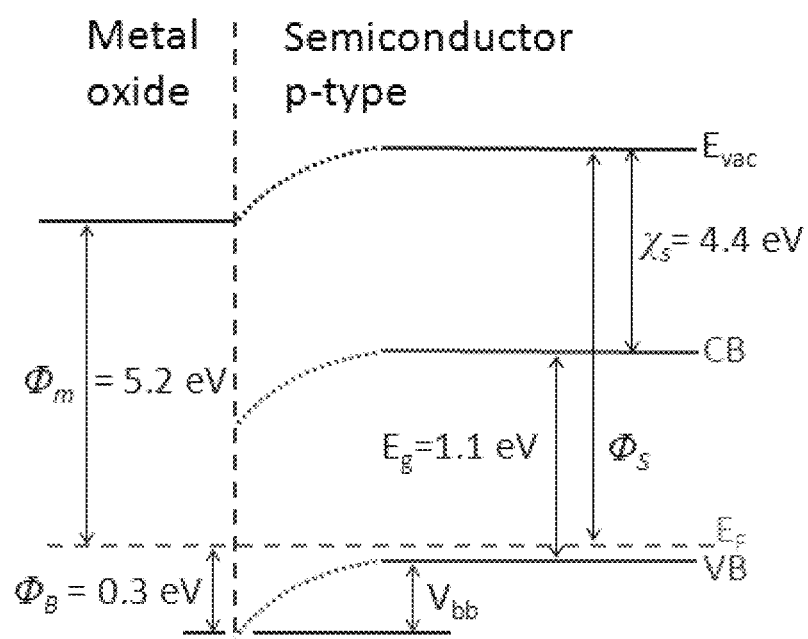
FIG. 14 is a schematic showing band diagram of metal/p-type semiconductor. Where, $\Phi_B$ ($\Phi_B = E_g + \chi_s - \Phi_m$) is Schottky barrier, $V_{bb}$ is band bending, $\Phi_m$ is a metal work function, $\Phi_s = \chi_s + (E_c - E_f)$. LaAMnO$_3$ with A=Sr ($\Phi_m$=5.2 eV), Ca (4.8 eV) and Ce (5.1 eV). $E_g$=1.1 eV, $\chi_s$=4.4 eV and ($E_c - E_f$) is 1.0 eV.

An LSMO (metal)/LMO (p-type semiconductor) superlattice is expected to have the desired Schottky barrier heights to achieve high ZT (FIG. 14). The LSMO and LMO have closely matched lattice parameters to enable epitaxy of high quality superlattice growth on single crystal STO substrates, which helps to decrease thermal conductivity $\kappa_l$ due to phonon scattering at the interfaces between layers. Calculations of Schottky barrier height and lattice mismatch for LSMO/LMO on STO suggests favorable behavior for TI devices.

The Schottky barrier for LSMO and LMO gives a desired optimum barrier height of $\Phi_B$=300 meV=≈11 kT at 300K (kT=0.0256 eV=26 meV) and $\Phi_B$≈11/3=3.666 kT at an operating temperature of 1000K. The lattice constant of bulk LMO=3.95 Å, STO=3.91 Å, LSMO=3.885 Å and their respective mismatches shows the following:

Mismatch of LSMO with STO=$(a_{STO}-a_{LSMO}/a_{STO})$=0.63% tensile strain.

Mismatch of LMO with STO=$(a_{STO}-a_{LMO}/a_{STO})$=-1.02% compressive strain.

Mismatch of LMO with LSMO=$(a_{LSMO}-a_{LMO}/a_{LSMO})$= -1.67% compressive strain.

Strontium Titanate ($SrTiO_3$) Substrate $SrTiO_3$ (STO) substrates grown by the Verneuil method provide a perovskite substrate, which has an undistorted cubic structure with a lattice parameter of a=3.91 Å at room temperature. STO is a band gap insulator with bandgap of 3.2 eV. It also shows an indirect bandgap of 3.27 eV and direct bandgap at 3.46 eV. STO single crystals are transparent and paramagnetic over the whole temperature range. STO has a high dielectric constant of 300, a density of 5.117 g/cm$^3$ and a melting point of 2080° C. STO is a widely used substrate material for the growth of perovskite thin films due to its easily polished surfaces and high tetragonal p4 mm surface symmetry.

Metallic Lanthanum Strontium Manganate (LSMO)

In the early 1950s, studies established ferromagnetism, negative magnetoresistance and metallic conductivity behavior in mixed valence perovskite $La_{1-x}A_xMnO_3$ (A=Sr, Ca, Pb, and Ba) and considered applications for spin electronics, magnetic random access memory and sensors. LSMO is a compound of doped $LaMnO_3$ ($Mn^{3+}$, i.e., $t^3_{2g}e^1g$), where $La^{3+}$ is partially replaced by $Sr^{2+}$, which forces a partial change of $Mn^{3+}$ to $Mn^{4+}$ with no $e_g$ electron ($t^3_{2g}e^0g$), resulting in a mixed Mn valence accompanied by hole doping. A hole may hop from a $Mn^{4+}$ ion to a $Mn^{3+}$ under the constraint of parallel localized spins. LSMO is half-metallic in which the conduction electrons are spin polarized. In the half-metallic case, one spin band is partly occupied at the Fermi level and the other has nearly zero density of states across the Fermi level. LSMO with Sr hole doping of x=0.33 shows ferromagnetic metallic behavior, and has anti-ferromagnetic and insulating behavior for any other Sr doping concentration with a Curie temperature $T_c$ of 239K.

Figure 15:
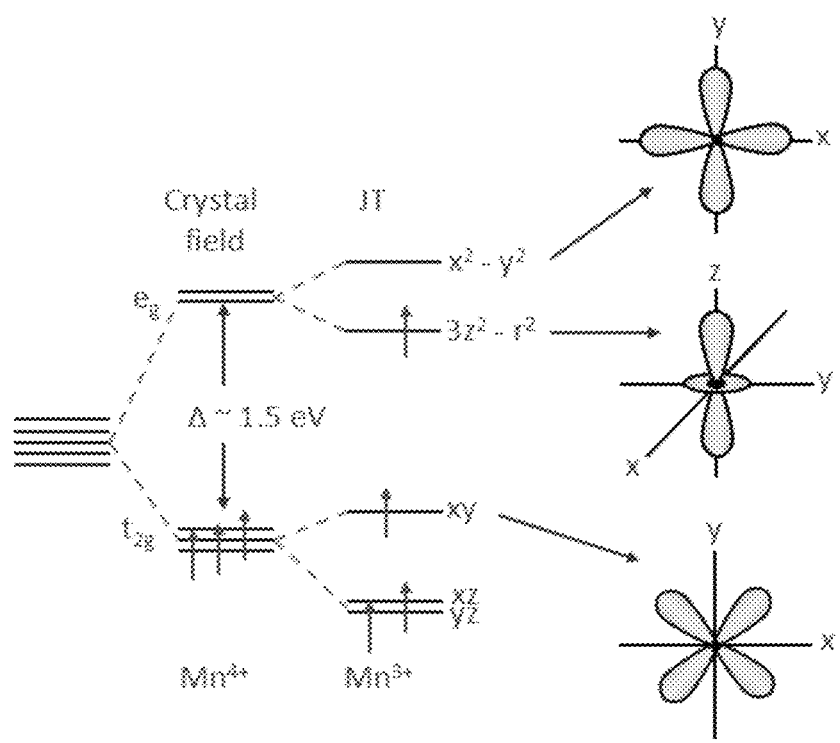
FIG. 15 is a schematic showing energy levels of the JT-active Mn ion. The Mn$^{4+}$ is shown in the octahedral crystal field, filling the $t_{2g}$ states (total spin S=3/2). The Mn$^{3+}$ has an additional unpaired electron (S=2, high-spin state) and undergoes a JT distortion with axial elongation.

The physical behavior of a perovskite manganate compound is highly dependent on the behavior of the manganese ions. In perovskite materials with isolated 3d ions, six neighboring O atoms transform the five initially degenerate d orbitals to form three lower degenerate $t_{2g}$ ($d_{xy}$, $d_{xz}$, and $d_{yz}$) and two higher $e_g$ ($d_{x2-y2}$ & $d_{3z2-r2}$) orbitals. The splitting energy (crystal field energy) between the three lowest and two highest sets of levels is Δ=1.5 eV. There is an additional Jahn-Teller distortion (FIG. 15). Therefore, in LSMO, Mn has a mixed valence state of x $Mn^{4+}$ (holes) and (1-x) $Mn^{3+}$ which leads to degenerate $t_{2g}$ and $e_g$ states of the $MnO_6$ octahedra due to a large Hunds coupling energy $J_H$=2.5 eV as compared to the crystal field energy. The electron hopping action between adjacent Mn ions is dominated by the double-exchange mechanism, where one electron is transferred from $Mn^{3+}$ to an adjacent oxygen 2p, and then another electron from the oxygen 2p to an adjacent $Mn^{4+}$. The initial and final states are therefore degenerate. The double exchange transport mechanism is responsible for the ferromagnetic and conductive ground state for $Sr^{2+}$ doped manganates.

Semiconducting Lanthanum Manganate (LMO)

Figure 16:
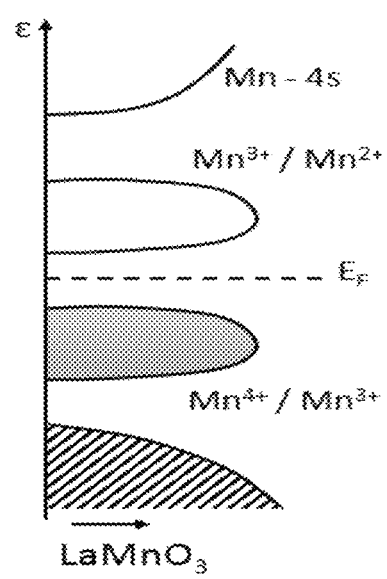
FIG. 16 is the band diagram of LaMnO$_3$ crystal.

Lanthanum manganate, $LaMnO_3$ or "LMO", is one of the parent compounds of the manganate family. $LaMnO_3$ has the potential for ion vacancies of $La^{3+}$, $Mn^{3+}$ and $O^{2-}$ which allow doping on all lattice sites (FIG. 16). LMO is a p-type semiconductor that conducts by cation valence transitions. It has very stable and favorable conductivity at high temperature. P-type semiconducting LMO, which is a Mott insulator, shows both ferromagnetic and metallic tendencies, with a band gap of 1.1 eV and electron affinity of 4.4 eV.

LMO is anti-ferromagnetic and insulating in the ground state. Orthorhombic LMO undergoes a structural transformation at T~523K from a Jahn-Teller distorted orthorhombic phase to a high-temperature cubic phase. The transition is accompanied by an abrupt change in the electrical resistivity of several orders of magnitude. The resistivity is temperature independent in the cubic phase, which is the ferromagnetic and p-type semiconducting phase of LMO.

Figure 17:
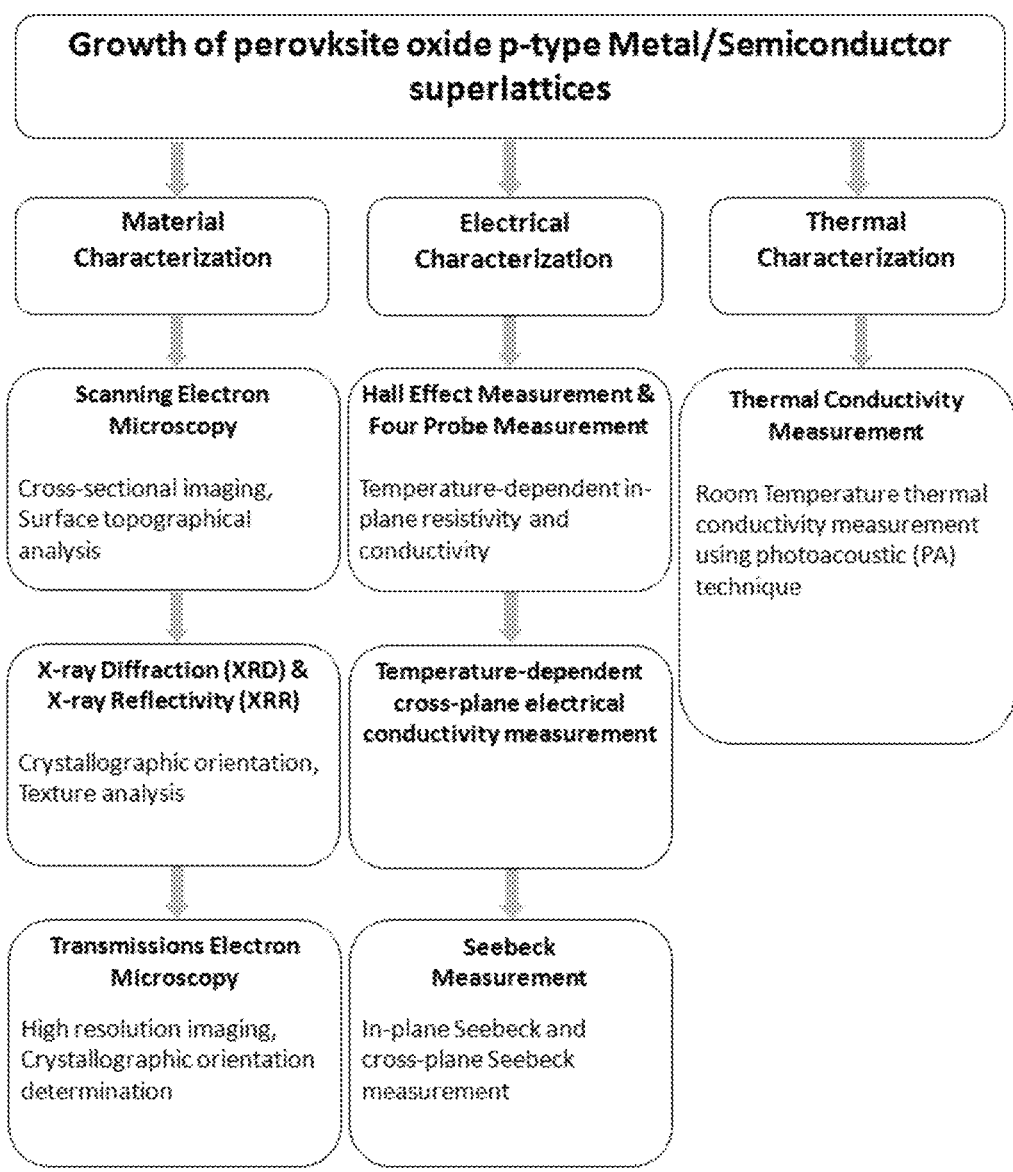
FIG. 17 is a schematic showing the process flow of characterization techniques used for p-type perovskite oxide LSMO/LMO superlattices for thermoelectric generators.

This section describes the experimental technique used to grow LSMO/LMO epitaxial superlattice thin films using pulsed laser deposition (PLD) and the characterization of thin-film and superlattice crystal structures using various materials characterization techniques, such as x-ray diffraction (XRD), high resolution reciprocal space mapping (RSM), transmission electron microscopy (TEM), and surface analysis and growth rate calibration using scanning electron microscopy (SEM) (FIG. 17).

Introduction

The LSMO/LMO superlattice can have high quality epitaxy and sharp interfaces between the layers. In section growth and characterization methods, we will address the basic operation of the experimental growth and characterization techniques used in our disclosure. In the following section, we will address growth processes, physical and material characterization of the individual p-type epitaxial metal and semiconductor thin films.

Growth and Characterization Methods

In this section, we describe the different experimental growth and material characterization technique for perovskite oxides thin film and superlattices.

Pulsed Laser Depositions

Perovskite families of oxides are grown using pulsed laser deposition (PLD). Dijakkamp and Venkatesan et al. used the PLD technique to prepare the epitaxial films of YBCO that promoted the use of PLD to deposit high quality films of a wide range of oxide materials for research applications. PLD enables easy transfer of multi-component oxide stoichiometric thin films from the target to the substrate. PLD is widely used to deposit highly crystalline stoichiometric ceramic or oxide films not easily obtained by other deposition techniques.

PLD is a physical vapor deposition (PVD) technique in which a high power laser beam outside the high vacuum deposit ion chamber (base pressure<$1\times10^{-6}$ torr) is focused using external lenses that satisfy the requirement of optical transparency to ultraviolet light onto the target. The absorbed laser beam energy changes to thermal, chemical and mechanical energy causing the excitation of target atoms ablation and exfoliation of the surface, and plasma plume formation. This highly directional plume is a collection of energetic neutral atoms, molecules, ions, electrons, atom clusters and molten droplets that reach the substrate and condense to form a thin film. Background gases in vacuum deposition chamber such as $O_2$ and $N_2$ are used to promote surface reaction or to maintain film stoichiometry for oxide and nitride thin films, respectively. The crystal quality, uniformity and stoichiometry of the thin film by PLD depend on the character of the plasma plume, and the diffusivity and energy of the particles on the surface.

Widely used PLD laser include the solid state $Nd^{3+}$: YAG (1064 nm) laser and excimer gas lasers with typical wavelengths in the range of 200-400 nm. Most of the non-metallic materials exhibit strong absorption in the ultraviolet spectral range between 200 and 400 nm. At such short wavelengths, the absorption penetration depth is small, which is highly favorable to ablate a thin layer of the target material. Some advantages of the PLD method are:

High melting point materials such as ceramic or oxide thin films can easily be deposited at lower growth temperatures, maintaining the stoichiometric composition of the target material.

Precise control of growth parameters such as laser power density, substrate temperature, deposition gas flow rate.

Laser source is outside the deposition chamber which reduces the contamination in thin film deposition and allows the use of background gases such as $O_2$, $N_2$ to promote surface reactions or to maintain film stoichiometry.

Figure 18:
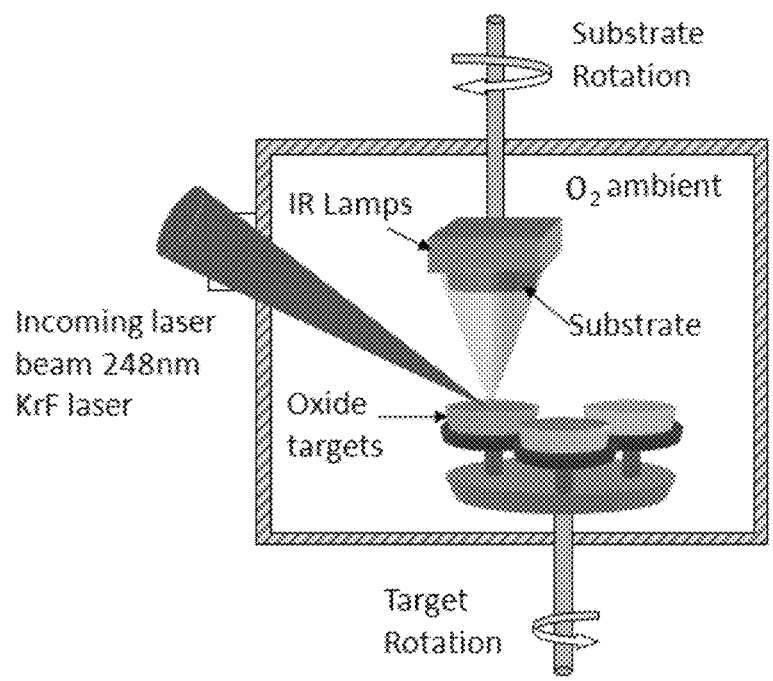
FIG. 18 is a schematic showing high vacuum pulsed laser deposition (PLD) system used for LSMO, LMO and LSMO/LMO superlattice depositions.
Figure 19:
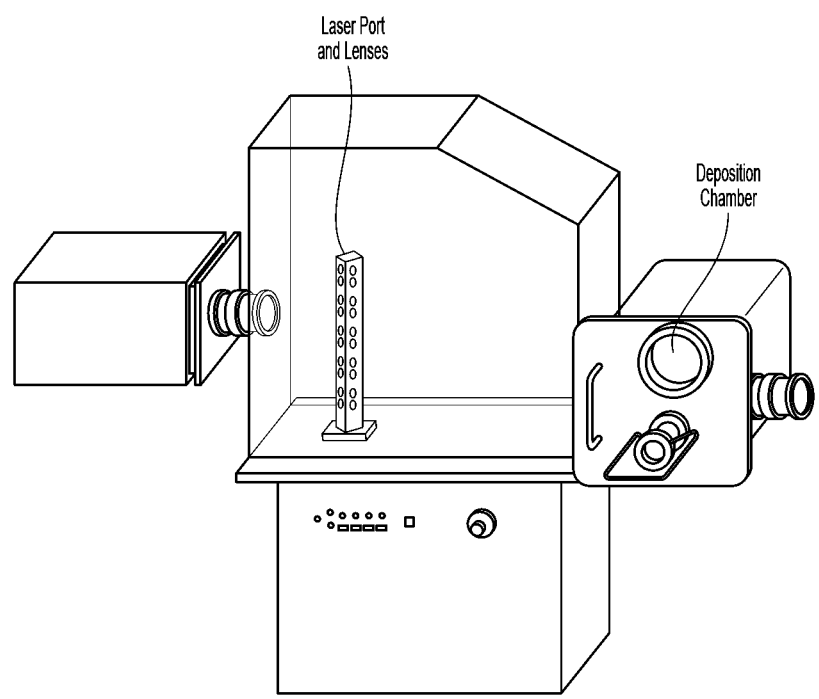
FIG. 19 is a photograph image of a pulsed laser deposition system used for perovskite oxide deposition.

In our perovskite oxide thin-film growth, we used a 248 nm KrF excimer laser (Lambda Physik 305i) with a pulse width of 25 ns, pulse frequency of 5 Hz and target fluence (energy density) of 1.3 J/cm$^2$ (fluence is controlled by laser output energy and spot size) and a substrate temperature of 740° C. The vacuum deposition chamber has a base pressure of $1\times10^{-6}$ torr and the background oxygen gas pressure is introduced at pressures between 20 and 220 mtorr to deposit an epitaxial oxide thin film. The PLD vacuum deposition system has a three-target holder for 2" diameter and ¼" thick targets, providing the flexibility to grow three different thin films in a multilayer at one time. The LSMO and LMO 2" diameter targets and STO (001) as a single crystal substrate material was used. A schematic of the PLD growth system is shown in FIGS. 18 and 19.

X-ray Diffraction

XRD is one of the most commonly used non-destructive materials characterization techniques for analyzing the crystallographic arrangement of thin films deposited on single crystal substrates. This technique provides information about the quality of each thin film, distinguishing whether the films are epitaxial crystalline (coherent with the substrate), polycrystalline, or amorphous, revealing the thickness of the films and whether there is mismatch strain.

X-ray diffraction for this study employed Cu-Kα radiation x-rays with a wavelength 1.54059 Å, which is incident on the sample at an angle of θ with respect to the thin film. A detector is placed at an angle 2θ with respect to the incident ray. Due to the symmetric arrangements of atoms in a crystal and the corresponding parallel atomic planes, the reflected x-rays constructively interfere with each other, resulting in sharp peaks of intensity. The peak intensities provide information about the quality and crystal orientation of the film with respect to the substrate, as well as the c-axis lattice parameter of the thin film. The criterion for constructive interference of the x-ray described by Bragg's law, $n\lambda=2d \sin \theta$ where, d is the lattice spacing between the crystal planes, λ is the wavelength of x-ray, n is the integer of a reflection order and θ is the incident angle with the thin film surface.

The XRD equipment used in this research work is a PANalytical MRD X' Pert pro system that is capable of doing 2Theta-omega rocking curve, Phi scan, RSM and x-ray reflectivity (XRR):

2Theta(2θ)-omega(ω): This scan provides detailed information about the lattice mismatch between thin films on substrates. These scans are very useful to understand the stress and strain in thin films or superlattices.

Rocking Curve: This measurement utilizes an omega scan at a fixed 2Theta angle, which gives one main diffraction peak. The Full Width at Half Maximum Intensity (FWHM) of the peak is inversely related to the dislocation density in the film, which is directly related to the structural quality of the film.

Asymmetric Phi Scan: This scan is done to check the orientation relationship between epitaxial layers.

2Theta-omega scan for characterizing the superlattice: This is a general 2theta-omega scan for superlattice structures. This scan results in periodic and uniformly spaced satellite peaks around a main diffraction peak, which is useful to deduce the superlattice period, lattice mismatch and quality of the film.

X-ray Reflectivity scan: This is a measurement technique in which the source beam is incident with a low glancing angle from 1.5° to 3°. This scan is useful to determine the period of a superlattice, roughness and density of films.

Reciprocal Space Mapping

RSM is a high resolution x-ray diffraction contour mapping of 2theta-omega scans around the Bragg's peak and shows the diffuse distribution of intensity in the vicinity of the Bragg's peak. Using a triple axis diffractometer, simultaneous measurements of the rocking angle ($\omega$) and the diffracted x-ray scattering angle $2\theta$ allows the diffractometer to draw a two dimensional map of the diffracted x-ray intensity as a function of position in the reciprocal space.

RSM is very useful to understand the lattice misfit and degree of lattice relaxation with respect to the substrate. This is helpful to understand strain relaxation processes, both in and out of the plane direction for an epitaxial film. The reflection measurements are restricted in the range between the minimum $\omega=0$ and maximum $w=2\theta$ condition above which, the scattered beam cannot exit the surface. In order to overcome the restriction the scanning technique in the plane of momentum transfer is represented by the in-plane component ($Q_x$) and out of the plane component ($Q_z$) of the scattering vector.

$$Q_x = K[\cos(\theta-\omega) - \cos(\theta+\omega)]$$

$$Q_z = K[\sin(\theta-\omega) + \sin(\theta+\omega)]$$

where, $K=2\pi/\lambda$, is the magnitude of the x-ray wave vector. The symmetric 2Theta-theta (2Theta-omega) scan proceeds along $Q_z$. Reciprocal space mapping is performed in such a way that the Bragg's reflection under investigation is fully mapped in a confined area of Q-space. In this case, the reflection is not only monitored by one rocking curve crossing it, but the whole area in the vicinity of the reflection is included in the measurement. One way of mapping includes performing various rocking curves with increasing scattering angles, 2theta. The streaking observed in the RSM is due to the influence of the different crystals and the streaks represent the Fourier transform of a sharp interface or surface, and are parallel to the normal to that surface in real space.

Scanning Electron Microscopy

SEM is a surface morphology, topography and compositional imaging technique using an electron beam instead of light for imaging. SEM has large depth of focus and high resolution.

In SEM, an electron beam ranging from a few eV to 40 keV is generated at the top of the vertical microscope by an electron gun. The beam is focused at a point on the sample by electromagnetic lenses. The beam is rastered across the sample, and secondary electrons are collected at each point to obtain an image of the surface. For best SEM imaging, samples should be free of water and non-conductive material, and oxide samples should be made conductive by covering the sample with a thin (5-10 nm) gold coating. A Hitachi (S-4800) Cold Field Emission SEM which has a resolution of 2.0 nm at 30 kV was used.

Transmission Electron Microscopy

TEM is an imaging technique where a beam of electrons is transmitted through an ultrathin sample. TEM is an analysis technique for superlattice thin films that is capable of providing useful details about the crystallographic orientations (in and out of plane), degree of order, epitaxy in superlattices structure, grain size and orientations, atomic scale structure and defects. TEM's unique features also include its ability to combine real and reciprocal space information from the same spatial location with very high resolution. There are various different experimental techniques available in TEM to understand the thin-film superlattices such as high resolution electron microscopy (HREM) and high angle annular dark field (HAADF) (Z-contrast) imaging.

HREM provides details on crystalline defects, amorphous layers, atomic structure across boundaries, and information on the topography of the interfaces. In HAADF imaging, which lacks diffraction contrast and has little phase contrast, the images contain intensity proportional to the square of atomic number (Z) of the scattering atom, which is also called "Z-contrast" and is useful in understanding the composition changes between superlattice layers. In a phase contrast HREM image, a very slight contrast between the layers of similar composition can be observed. While in an HAADF image, the two layers should have a sharp contrast to distinguish the superlattices if the atomic numbers of the atoms differ significantly across the interface.

Material Growth and Characterization

Figure 20:
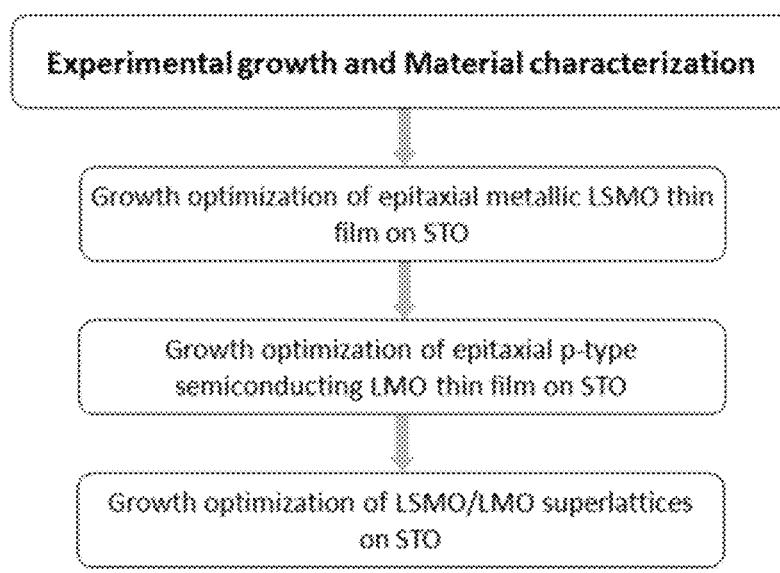
FIG. 20 is a process flow chart showing growth and material characterization.

In this section, we will discuss our growth optimization and materials characterization of LSMO and LMO as well as that for LSMO/LMO superlattices. New materials growth and characterization can include optimization to obtain the desired materials properties. The process flow for our experimental growth and materials characterization approach is summarized in FIG. 20.

Metallic LSMO ($La_{0.67}Sr_{0.33}MnO_3$)

In this section, we describe the individual layer growth and characterization of epitaxial metallic LSMO thin films on STO substrates by using PLD and materials characterization using x-ray diffraction.

Figure 21:
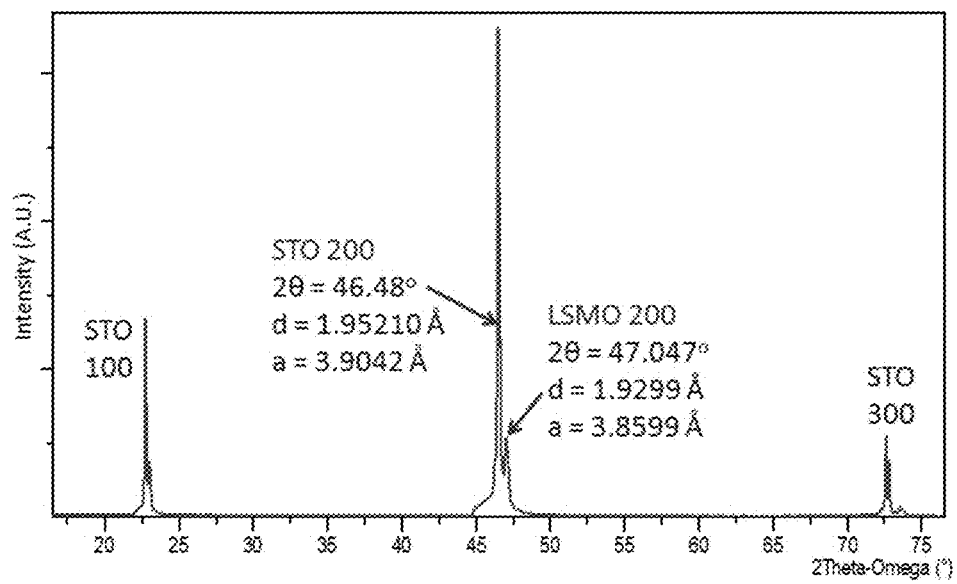
FIG. 21(a) is a series of XRD scans of LSMO thin film on STO substrate with LSMO 2theta-omega scan which confirms c-axis epitaxial orientation.
FIG. 21(b) is a chart illustrating rocking curve's small FWHM which shows film is not relaxed and is of high quality.
Figure 21B:
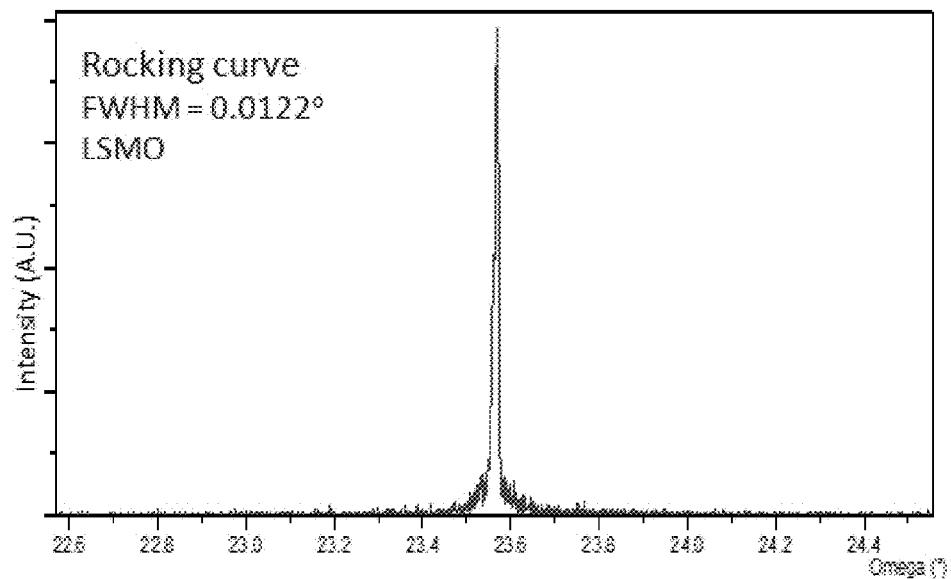
Figure 22:
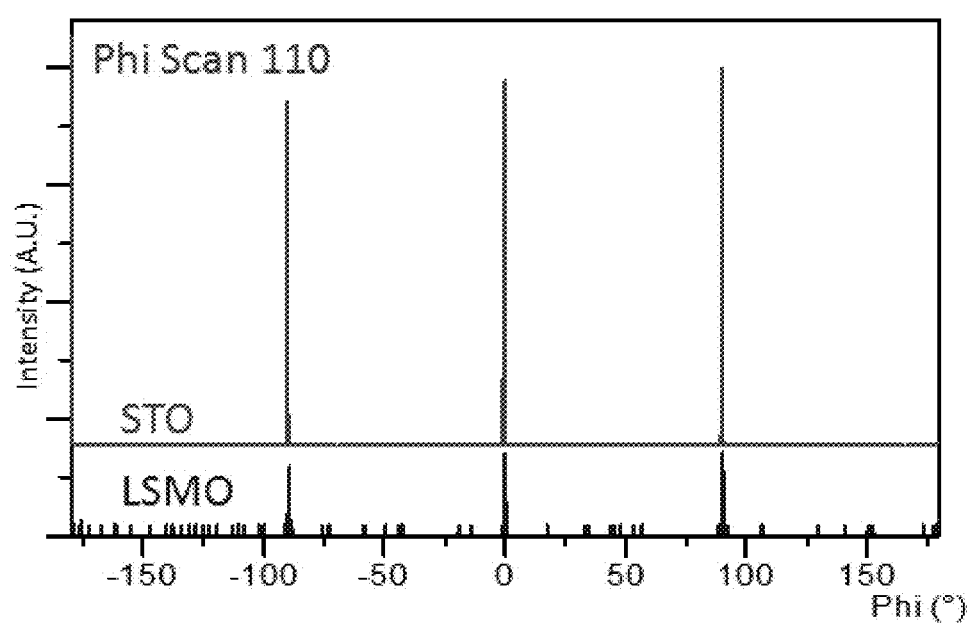
FIG. 22 is an XRD asymmetric 110 Phi scan of LSMO on STO shows all four film peaks are well aligned with the substrate peaks, which confirms highly aligned grains and epitaxy.

Growth was performed to achieve metallic epitaxial thin films of LSMO on STO. A laser fluence of 1.3 J/cm$^2$ and a pulse frequency of 5 Hz were used to ablate the LSMO target. The deposition was performed at a constant substrate temperature of 740° C., measured using an infrared pyrometer. The epitaxial LSMO metallic thin film was achieved with background $O_2$ pressures of $(40-52-165-227) \times 10^{-3}$ torr (FIGS. 21(*a*), 21(*b*), and 22). Target polishing by diamond paper was performed prior to every deposition in order to smooth the target. The LSMO growth rate using pulsed laser deposition was 0.133 Å/pulse (4 nm/minute).

LSMO materials characterization was performed using x-ray diffraction to analyze the epitaxial growth of LSMO on STO, film quality (FWHM) and crystal orientation related to the STO substrate. The thickness of the film was determined by cross-sectional imaging of the thin film LSMO on STO sample using a SEM.

Semiconducting LMO ($LaMnO_3$)

LMO is a p-type semiconductor that conducts by a cation transition. LMO easily adopts the excess oxygen from its stoichiometric phase and, as a perovskite, does not allow the interstitial oxygen but instead allows cation vacancies. The cation vacancies are responsible for the ferromagnetic as well as the semiconducting behavior. Laser fluency was maintained at 1.3 J/cm$^2$ and a pulse frequency of 5 Hz was used to ablate the LMO target material. The evaporated target species reacted with the oxygen flow pressure maintained at 52 mtorr inside the chamber to achieve the desired stoichiometry of the LMO films at a substrate temperature of 740° C. The LMO growth rate using pulsed laser deposition was approximately 0.1 Å/pulse.

Figure 23A:
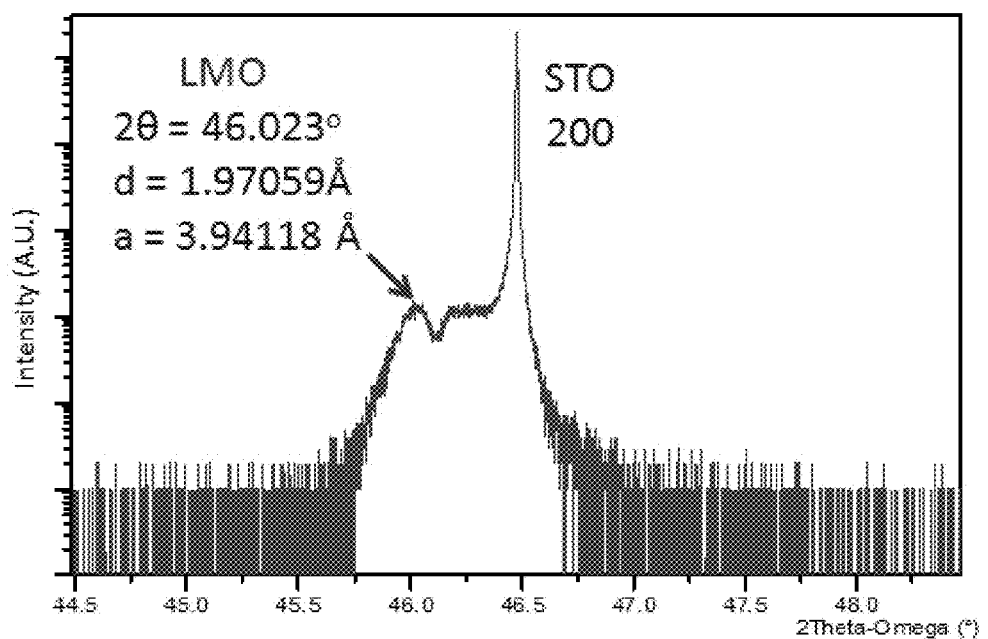
FIG. 23(a) is an XRD 2theta-omega scan of an LMO thin film on a STO substrate confirming c-axis epitaxy.
Figure 23B:
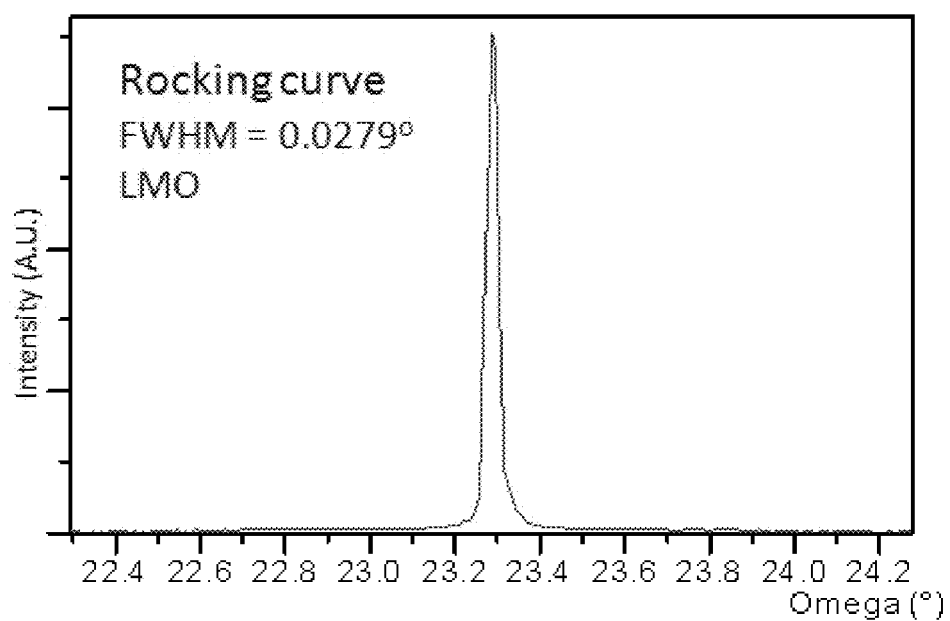
FIG. 23(b) is a rocking curve of LMO/STO showing a small FWHM, indicating that the film is not relaxed and is of high quality.
Figure 24:
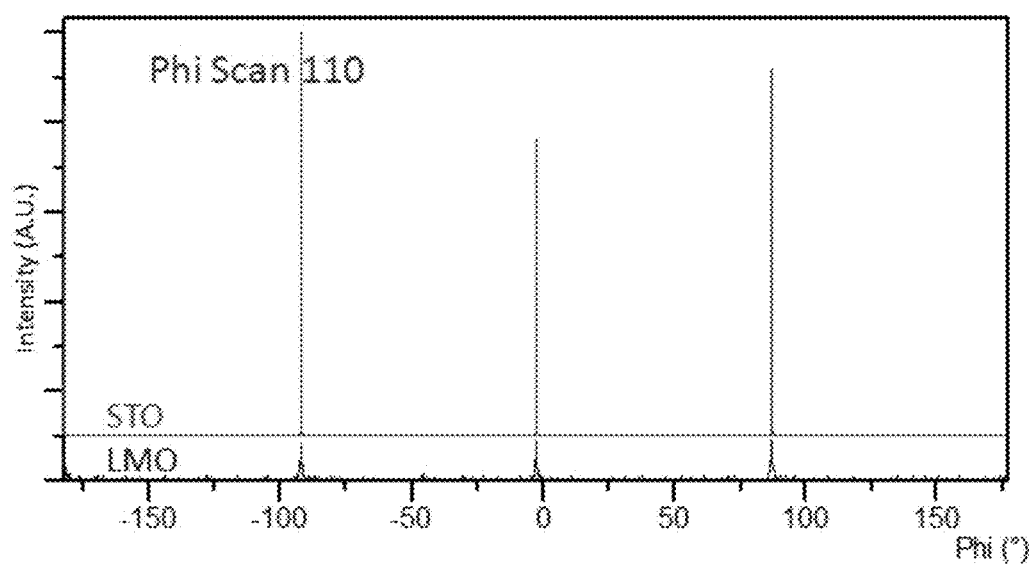
FIG. 24 is an XRD asymmetric 110 Phi scan of LMO on STO shows all four film peaks are well aligned with the substrate peaks, which confirms highly aligned grains and epitaxy.

The variation in oxygen pressure had no impact on the epitaxial growth of the thin films (FIGS. 23(a), 23(b), and 24). It was observed that other oxygen pressures resulted in films that looked dark grey and were metallic. In an optimized oxygen pressure window of 45-55 mtorr a semi-transparent semiconducting thin film of LMO was achieved.

LSMO/LMO Superlattices

Figure 25:
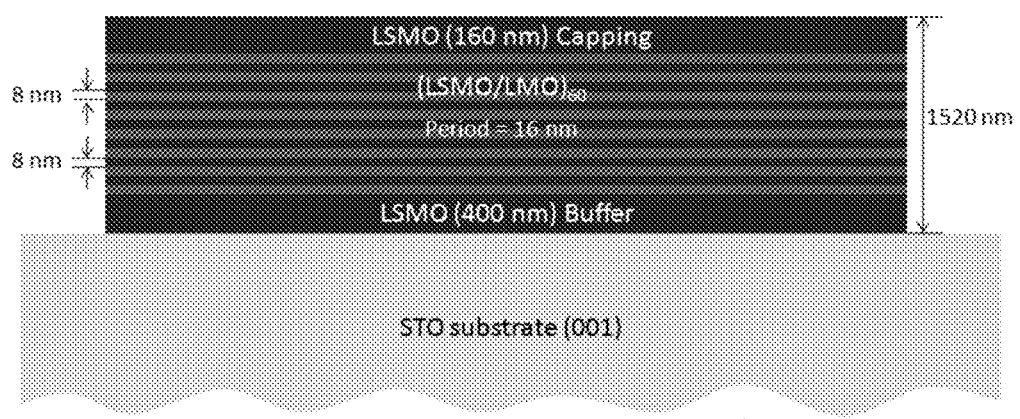
FIG. 25 is a p-type metal/semiconductor superlattice structure using perovskite oxides.
Figure 26:
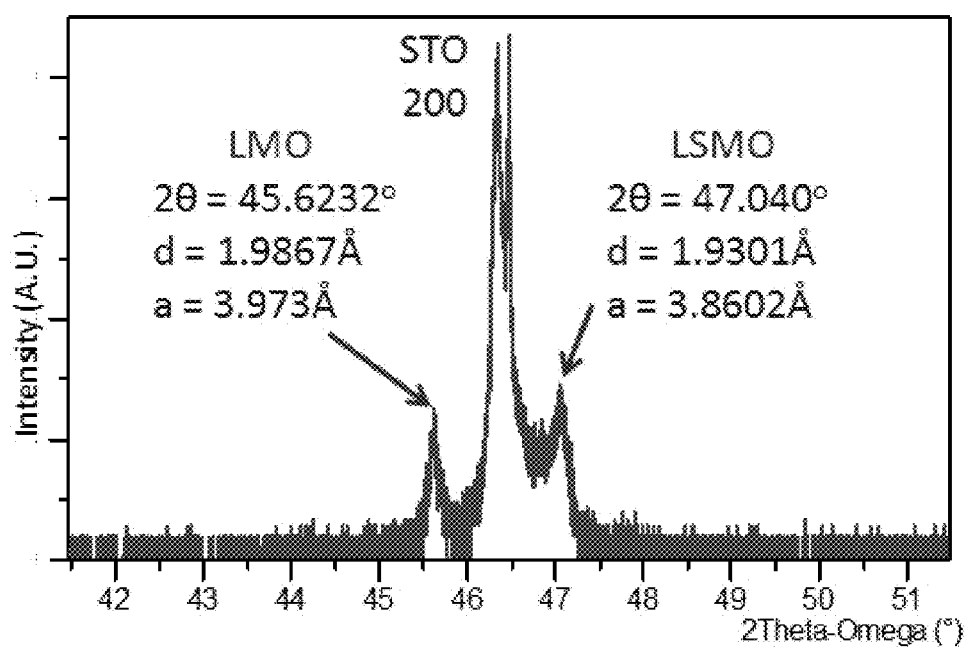
FIG. 26 is a XRD 2theta-omega scan of an LSMO/LMO superlattice on a STO substrate confirming c-axis epitaxial behavior.
Figure 27:
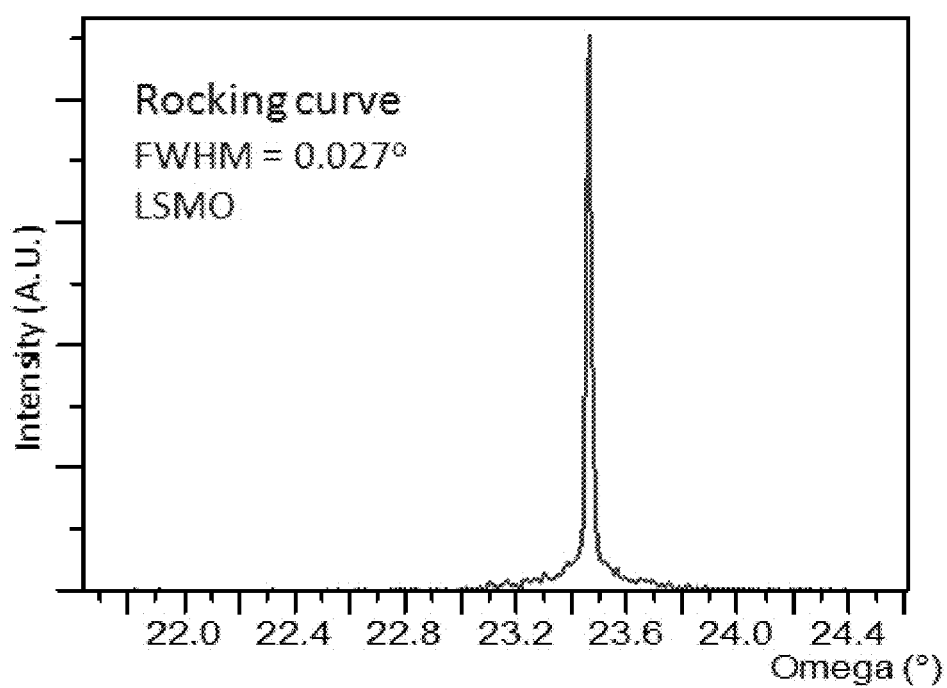
FIG. 27 is a XRD rocking curve scan of LSMO within an LSMO/LMO superlattice on STO.
Figure 28:
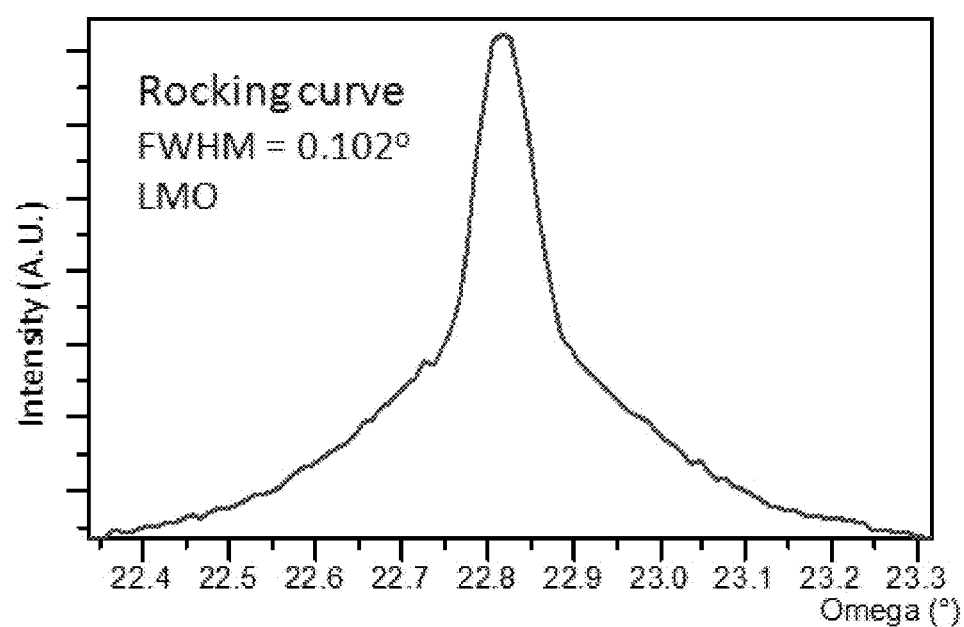
FIG. 28 is a XRD rocking curve scan of LMO within an LSMO/LMO superlattice on STO.
Figure 29:
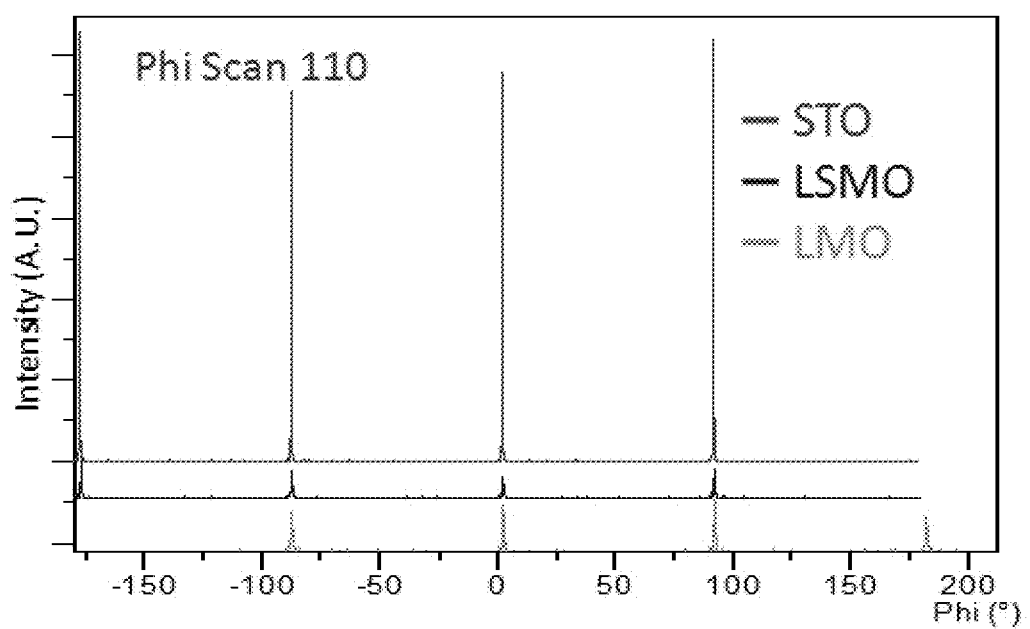
FIG. 29 is an asymmetric 110 Phi scan of an LSMO/LMO superlattice on STO shows the film peaks are well aligned with the substrate peaks, which confirms highly aligned grains and epitaxy.

LSMO/LMO superlattices were grown on (001)-oriented cubic STO substrates (FIG. 25). The LSMO/LMO superlattice growth conditions were influenced by those required for achieving semiconducting LMO, a discussed in previous sections: KrF excimer laser ($\lambda$=248 nm, 25 ns), pulse frequency of 5 Hz, laser fluence of 1.3 J/cm$^2$, substrate temperature of 740° C., chamber oxygen pressure of 52×10$^{-3}$ torr (oxygen pressure to achieve p-type semiconducting LMO), and the base chamber vacuum was 1×10$^{-6}$ torr.

In order to understand the strain between the superlattice layers (FIGS. 26, 27, 28, and 29), we performed RSM of the superlattices. RSM was done with the following parameters to achieve a two-dimensional map including iterated ω scans at fixed 2θ values, for a certain range of ω/2θ, centered around the (110) reciprocal plane:

Scan axis: Omega-2Theta, Scan range: 13.6556°-16.6546°
Step size: 0.0010°, No. of points: 2999
Scan center (2Theta: 32.5000°, omega: 15.1551°)
Scan mode: Continuous, Reflection Material: STO
(HKL): (110), Phi: 3.20° and Psi: 45.00°

Figure 30:
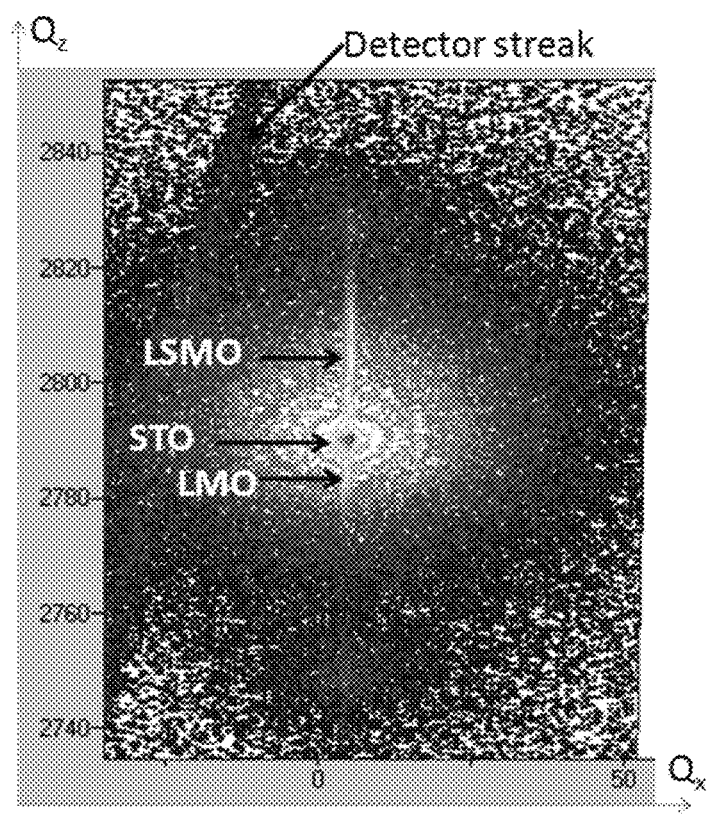
FIG. 30 is a 110 RSM of a micron-thick LSMO/LMO superlattice. The LSMO and LMO peaks have a small degree of spread confirming the epitaxial behavior of the superlattice film.
Figure 31:
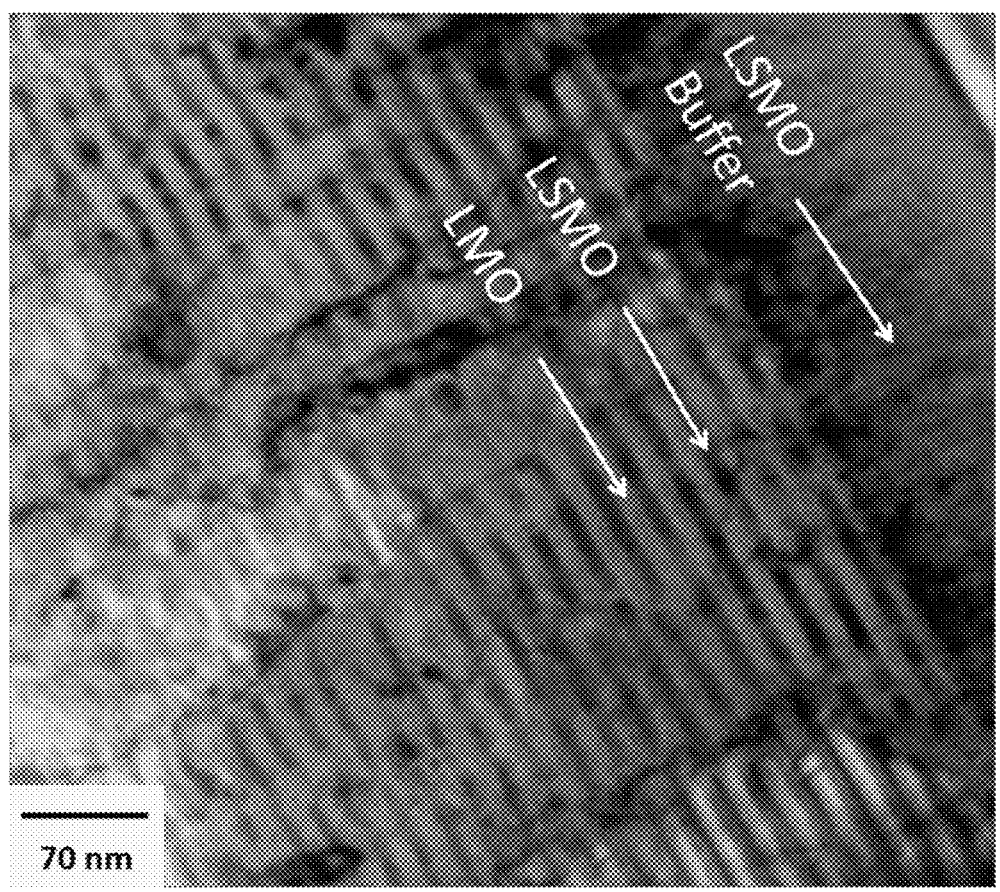
FIG. 31 is a low magnification bright field TEM cross-sections of an LSMO (8 nm)/LMO (8 nm) superlattice.
Figure 32A:
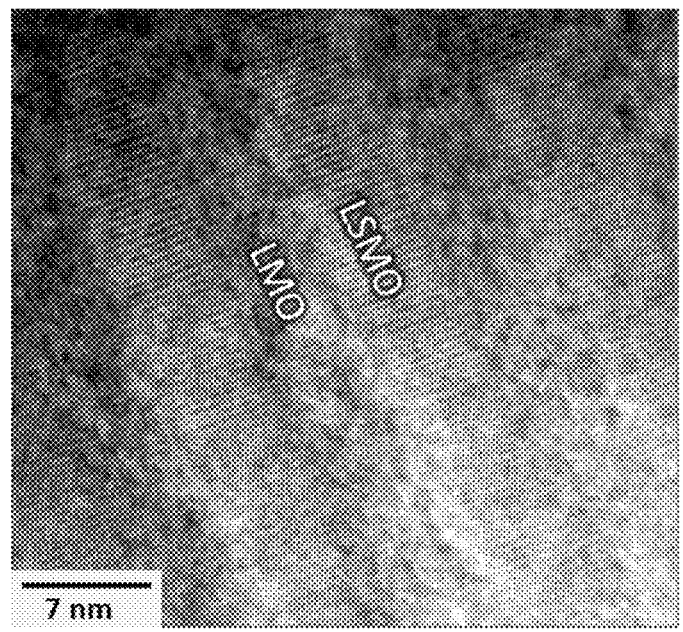
FIG. 32(a) is a high resolution cross-section TEM of an LSMO (8 nm)/LMO (8 nm) superlattice confirming epitaxial layers grown on a STO (001) substrate with epitaxial layer contrast of LSMO and LMO.
Figure 32B:
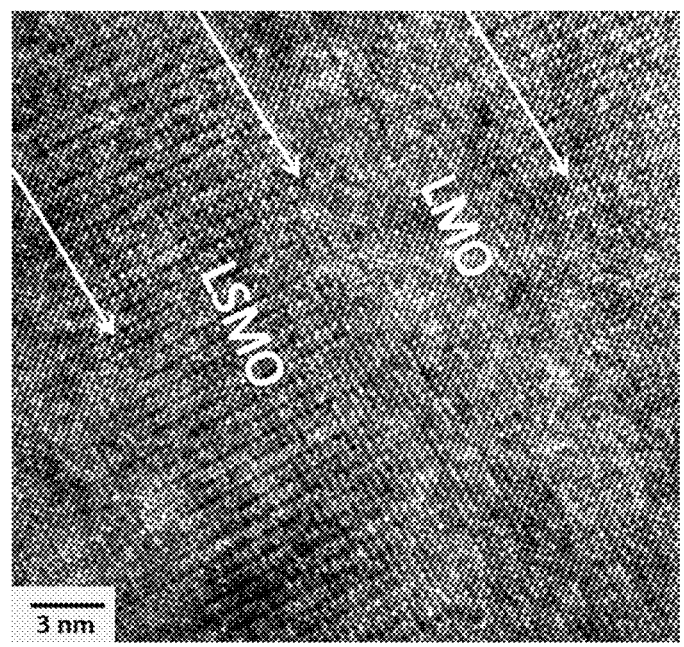
FIG. 32(b) illustrates a sharp high-resolution crystalline interfaces; arrow denotes interfaces.

A 110 asymmetric RSM of an LSMO/LMO superlattice is shown in FIG. 30. In the RSM map, a small degree of spread (Low FWHM) and highly intense peaks indicate well-aligned grain orientations. We confirmed high-quality epitaxial LSMO/LMO superlattice growth on STO substrates. TEM images of the superlattice confirm the presence of a uniform, layered structure (FIGS. 31, 32(a), and 32(b)).

Electrical and Thermal Characterization

This section reports the electrical and thermal measurement study of epitaxially grown thin film and superlattice structures. The as-grown high quality films of LSMO, LMO and LSMO/LMO superlattices on STO are used for electrical and thermal characterization in order to determine the thermoelectric properties of this materials system.

Electrical Transport Measurements

The measured electrical and thermal properties of LSMO, LMO and LSMO/LMO superlattices using different characterization techniques are presented.

LSMO and LMO Electrical Measurements

The following measurements were performed to characterize the electrical properties of continuous epitaxial thin films of LSMO and LMO:

Four probe measurements to determine the sheet resistance of the material.
Van der Pauw and Hall measurements to determine the mobility, carrier concentration and type of carriers in epitaxial thin film samples.
In-plane temperature-dependent resistivity and conductivity.
In-plane Seebeck measurement for p-type behavior validation.

LSMO Electrical Measurements

The LSMO thin films were measured using four probe, Hall, temperature-dependent resistivity and in-plane Seebeck measurement techniques. The room temperature four probe measurements were done on a 320 nm epitaxial LSMO thin film on STO. The measured value of the sheet resistance is 11.30×10$^3$ Ω/square. The calculated room temperature resistivity is 361.6×10$^{-3}$ ohm$^{-1}$·cm$^{-1}$ and conductivity is 2.765 ohm$^{-1}$·cm$^{-1}$. The Hall measurement was done in order to determine resistivity, carrier concentration, mobility and carrier type for the 320 nm LSMO thin film on STO (Table 4.1).

Figure 33:
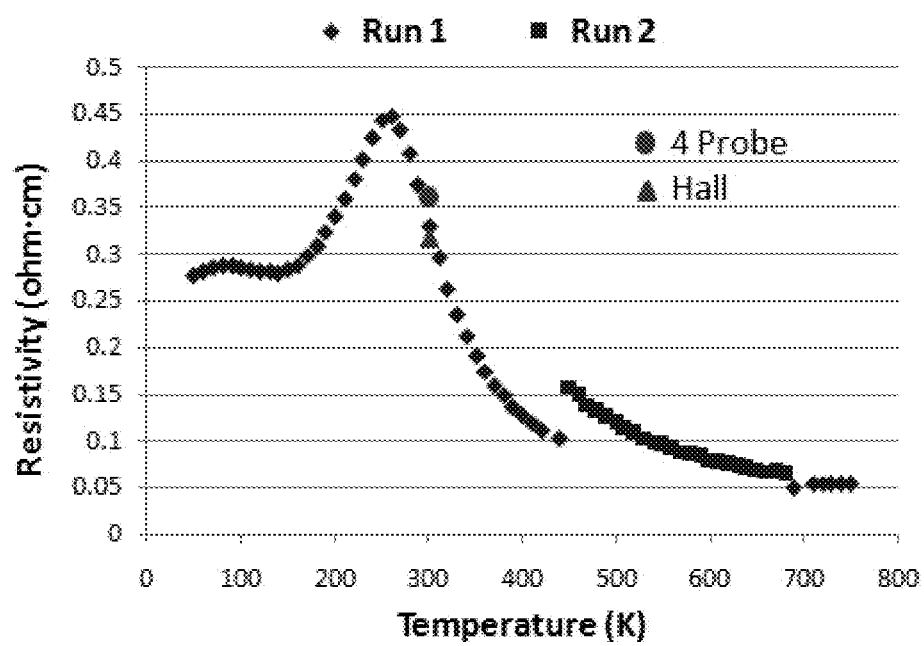
FIG. 33 is a temperature-dependent resistivity of LSMO.
Figure 34:
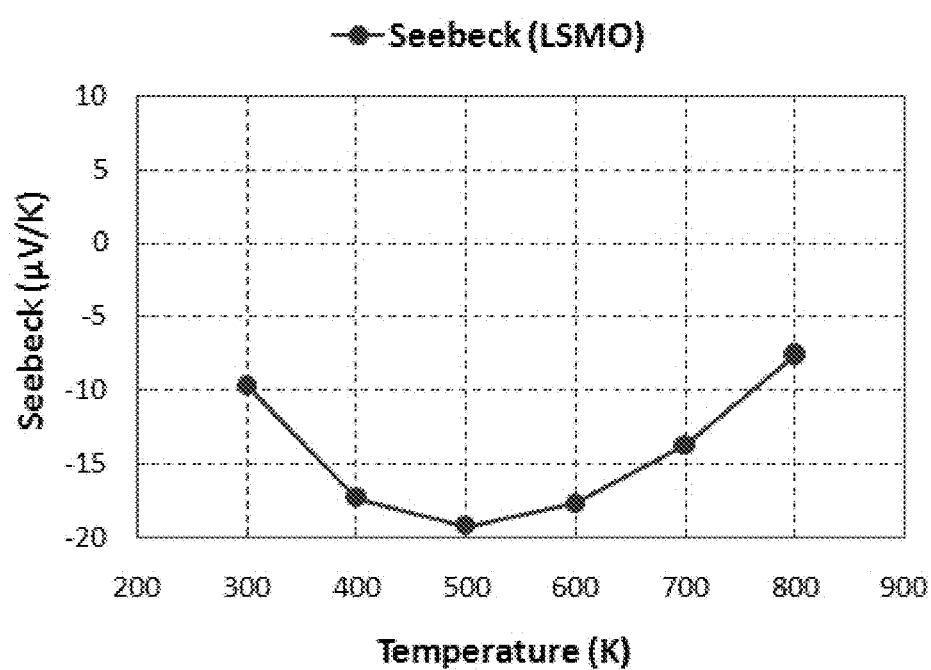
FIG. 34 is an in-plane Seebeck measurement of LSMO.

LSMO in-plane temperature-dependent resistivity (FIG. 33) shows magnetic transitions around T~244K and the resistivity is decreasing at higher temperatures, which indicates a transition to metallic behavior in LSMO. The decrease in resistivity after the magnetic transition is a desirable effect in LSMO thin films as LSMO shows higher conductivity at higher temperatures. The jump in the resistivity at T~450 and T~690 is an experimental measurement artifact. The in-plane Seebeck measurement (FIG. 34) shows the negative Seebeck coefficient of metallic material type in the range of (1-20 μV/K). The Seebeck coefficient is moving towards a positive value at higher temperatures. This type of switching from negative to positive in Seebeck coefficients is also seen in metallic calcium doped lanthanum magnate ($La_{0.6}Ca_{0.4}MnO_3$).

TABLE 4.1

| Hall measurement of thin film LSMO (320 nm) on STO. | | |
|---|---|---|
| Temp (K) | 300 K | 300 K |
| Resistivity (ohm cm) | 0.3173465 | 0.3169425 |
| Mobility (cm$^2$/Vs) | 0.3700202 | 0.3994014 |
| Density (cm$^{-3}$) | 5.3159 × 10$^{19}$ | 4.931142 × 10$^{19}$ |
| Hall Coefficient (cm$^3$/c) | 0.1774246 | 0.126587 3 |
| Sheet Resistance (Ω/square) | 9917.079 | 9904.452 |
| Type of Carrier | Electron | Holes |

LMO Electrical Measurements

The p-type LMO ($LaMnO_3$) thin films were measured using four probe, Hall, temperature-dependent resistivity and in-plane Seebeck measurement techniques.

Figure 35:
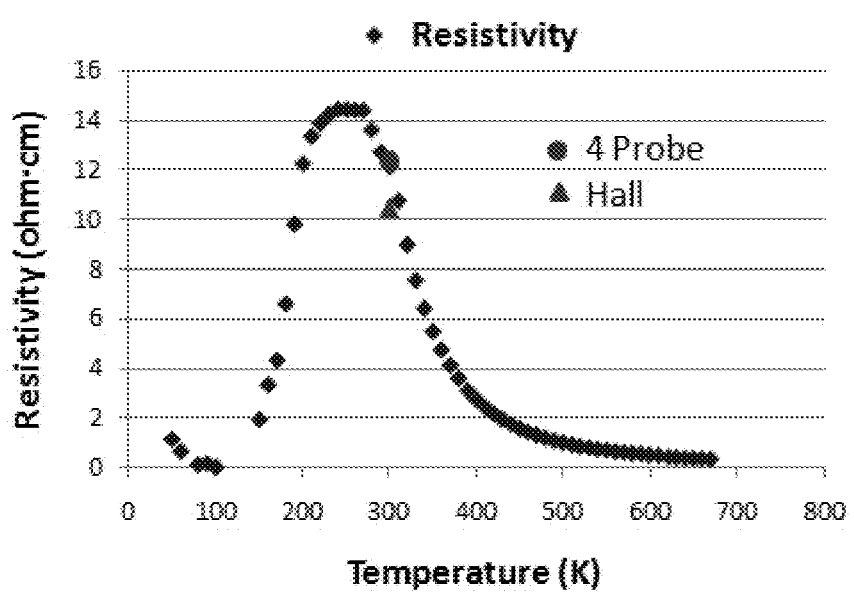
FIG. 35 is a temperature-dependent resistivity of LMO.
Figure 36:
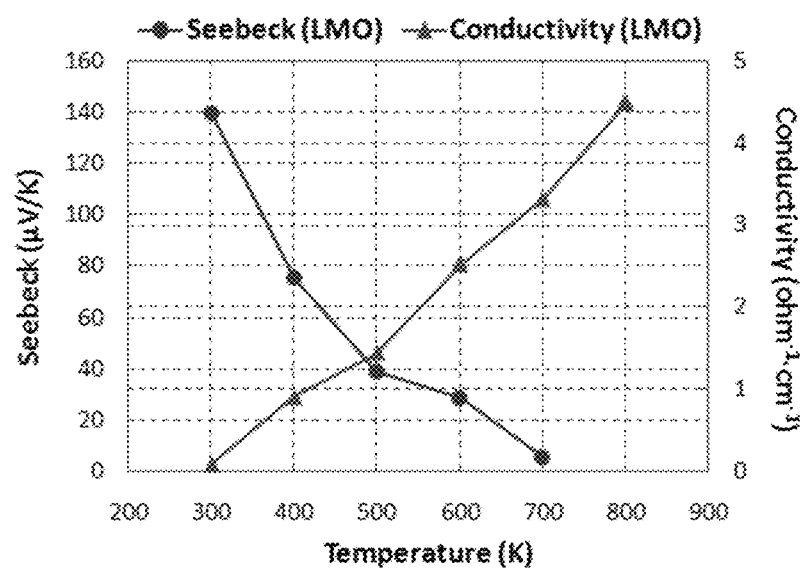
FIG. 36 is an in-plane Seebeck measurement validating p-type behaviors of LMO.
Figure 37A:
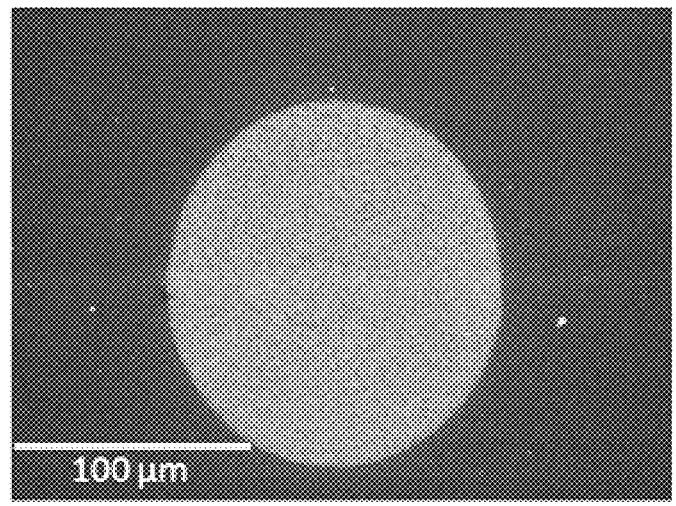
FIG. 37(a) is a top view SEM image of etched LSMO pillars with heights of 500 nm.
Figure 37B:
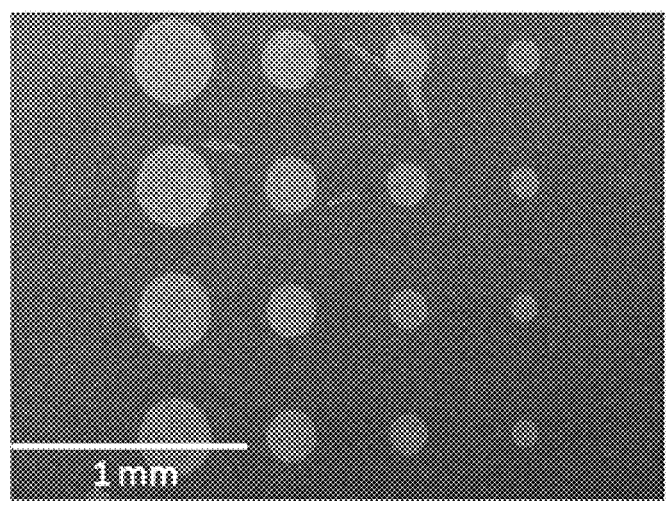
FIG. 37(b) is a top view SEM image of etched LSMO pillars with heights of 500 nm.
Figure 38A:
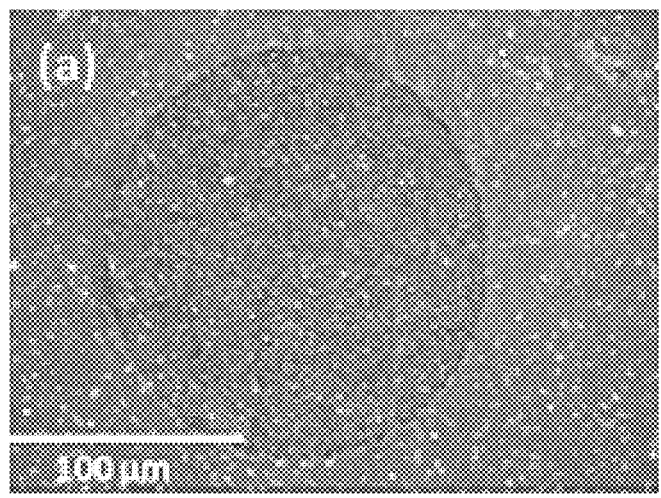
FIG. 38(a) is a top view SEM image of etched LSMO/LMO superlattices with pillar heights of 1 micron during etch recipe optimization process.
Figure 38B:
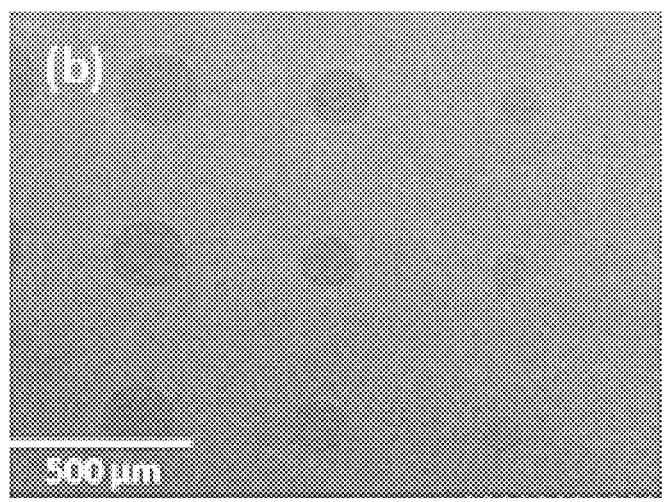
FIG. 38(b) is a top view SEM image of etched LSMO/LMO superlattices with pillar heights of 1 micron during etch recipe optimization process.
Figure 38C:
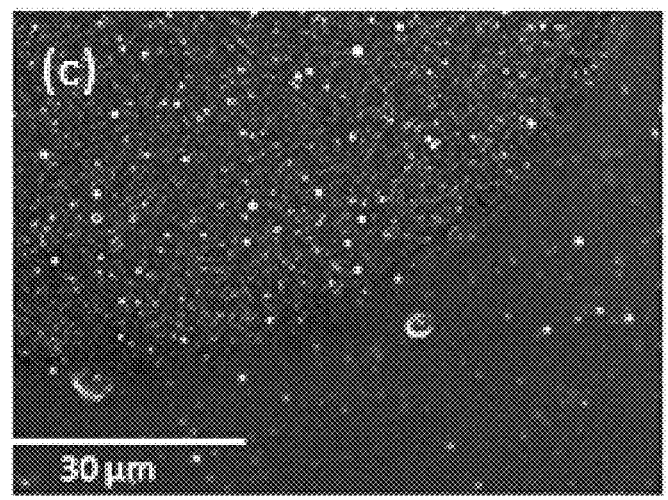
FIG. 38(c) is a top view SEM image of etched LSMO/LMO superlattices showing that the etching is highly vertical.
Figure 38D:
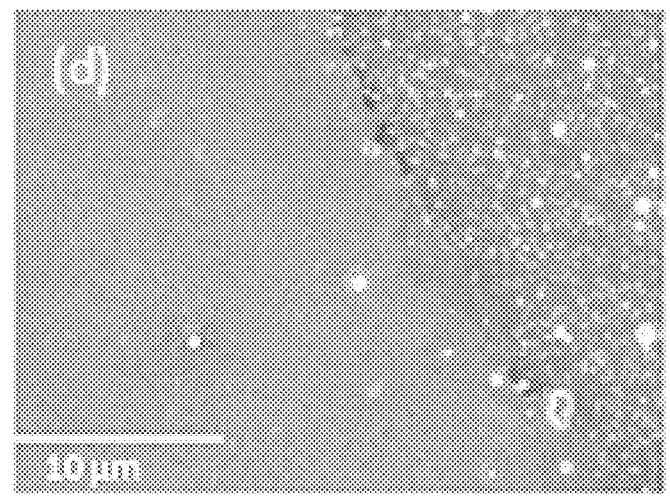
FIG. 38(d) is a top view SEM image of etched LSMO/LMO superlattices showing that the etching is highly vertical.
Figure 39A:
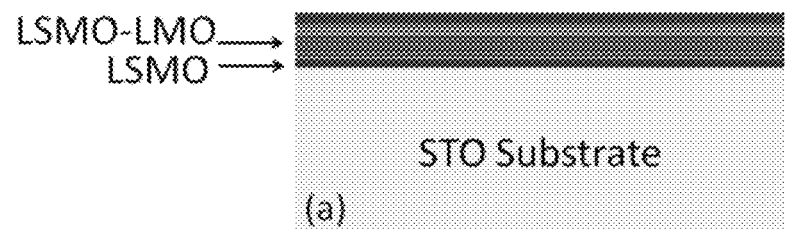
FIG. 39(a) is the process flow of making electric contact for LSMO/LMO superlattices for I-V cross-plane measurement with starting substrate for cleanroom processing.
Figure 39B:
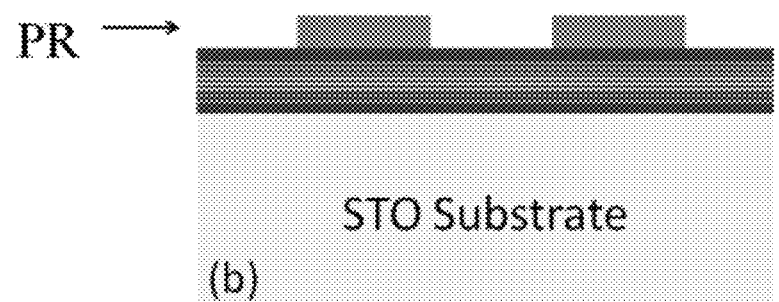
FIG. 39(b) is the process flow of making electric contact for LSMO/LMO superlattices for I-V cross-plane measurement with first mask pattern.
Figure 39C:
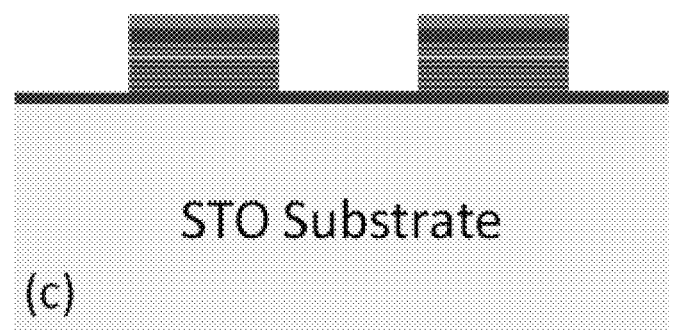
FIG. 39(c) is the process flow of making electric contact for LSMO/LMO superlattices for I-V cross-plane measurement after dry etching.
Figure 39D:
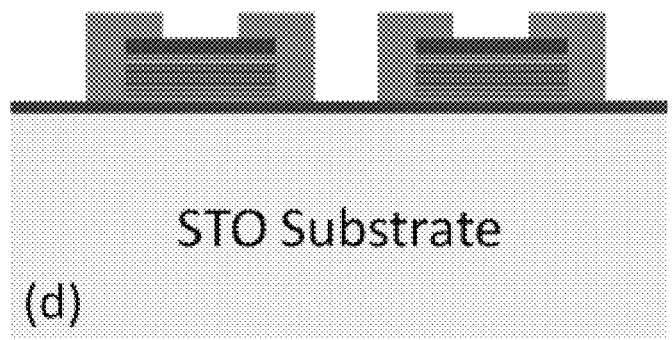
FIG. 39(d) is the process flow of making electric contact for LSMO/LMO superlattices for I-V cross-plane measurement with second mask pattern.
Figure 39E:
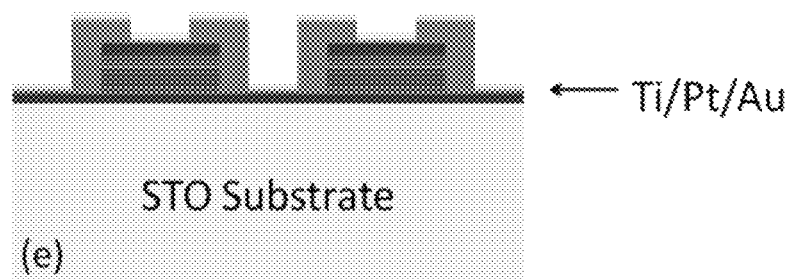
FIG. 39(e) is the process flow of making electric contact for LSMO/LMO superlattices for I-V cross-plane measurement after metallization process.
Figure 39F:
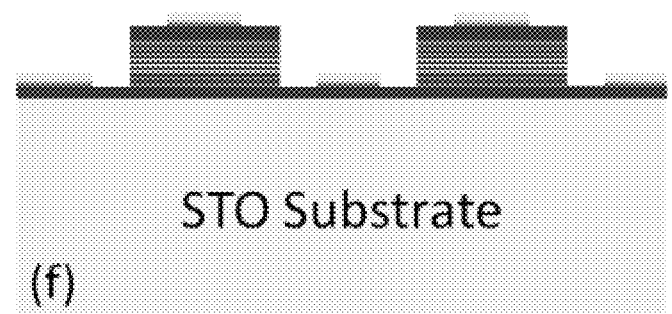
FIG. 39(f) is the process flow of making electric contact for LSMO/LMO superlattices for I-V cross-plane measurement with lift off of metal over resist.
Figure 39G:
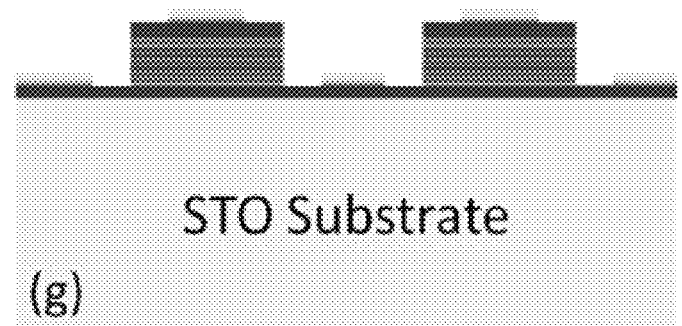
FIG. 39(g) is the process flow of making electric contact for LSMO/LMO superlattices for I-V cross-plane measurement with side view of final structure.
Figure 39H:
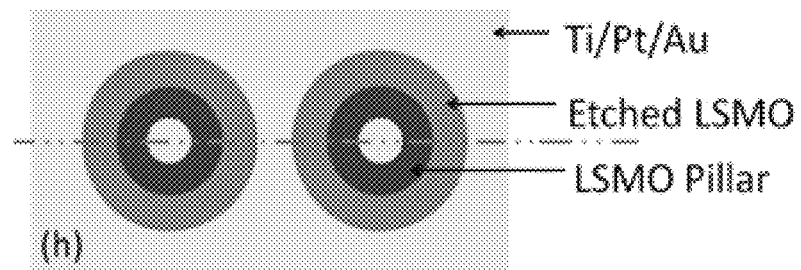
FIG. 39(h) is the process flow of making electric contact for LSMO/LMO superlattices for I-V cross-plane measurement with top view of final structure.

The room temperature four probe measurements were done on a 400 nm epitaxial LMO thin film on STO. The measured value of the sheet resistance was 3.1×10$^5$ Ω/square. The calculated room temperature resistivity was 12.44 ohm·cm and conductivity was 8.0×10$^{-2}$ ohm$^{-1}$·cm$^{-1}$. In plane temperature-dependent resistivity results are shown in FIG. 35. The Hall measurement was done to obtain the carrier concentration, mobility and carrier type on 400 nm LMO thin films on STO. Table 4.2 presents the results of Hall measurement for LMO thin film. The in plane Seebeck measurement (FIG. 36) was done to validate the p-type semiconducting behavior in LMO thin film. The room temperature Seebeck coefficient was 140 μV/K, which confirms that the LMO is a p-type semiconducting material.

TABLE 4.2

| Hall measurement of thin film LMO (400 nm) on STO. | | |
|---|---|---|
| Temp (K) | 300 K | 300 K |
| Resistivity (ohm cm) | 10.46441 | 10.42698 |
| Mobility (cm$^2$/Vs) | 6.72 × 10$^{-2}$ | 8.72 × 10$^{-2}$ |
| Density (cm$^{-3}$) | 8.874 × 10$^{18}$ | 6.86 × 10$^{18}$ |
| Hall Coefficient (cm$^3$/c) | 0.7034109 | 0.9094537 |
| Sheet Resistance (Ω/square) | 261610.1 | 260674.4 |
| Type of Carrier | Electron | Holes |

LSMO/LMO Superlattices Electrical Measurements

The in-plane Seebeck measurement showed that the LSMO and LMO have metallic and p-type semiconducting behavior, respectively, validating our materials selection. In the current section, we present the cross-plane electrical transport measurement on a p-type LSMO/LMO superlattice structure. Cross-plane temperature-dependent I-V measurements provide data for cross-plane conductivity and the Seebeck coefficient. These results help to calculate the thermoelectric figure of merit (ZT) of the structure.

In order to perform cross-plane I-V measurements on a LSMO/LMO superlattice structure, a series of micro-fabrication steps were required to allow measurement through the superlattice.

Microfabrication of LSMO/LMO Superlattice Structures

To perform cross-plane electrical measurements of LSMO/LMO superlattices, a cylindrical pillar structure can be etched into the superlattices. Looking to the literature, we find a limited number of papers that address etching of LSMO. A few have etched LSMO thin films using a $CO/NH_3$ chemistry on a reactive ion etching (RIE) system using Ti and Al metal as a mask. Another paper used a $Cl_2/Ar$ chemistry with $SiN_x$ as a mask.

The Birck Nanotechnology Center has a Panasonic RIE tool that uses an inductively coupled RF plasma Inductively Coupled Plasma (ICP). In our design, we use optically sensitive resist rather than metal masks for etching to simplify the process and reduce the processing steps. This reduced turnaround time also helps when troubleshooting and makes it easier to repeat the process a number of times to perfect or calibrate the structure's performance. The etching chemistry we employed was designed, first, to etch the LSMO/LMO superlattices structure as fast as possible and, second, to ensure the resist mask used could withstand the complete etch process. The optical resist used in our study was AZ-9260 (Microchem, GrnBH), spun to a thickness of 12 μm. The conditions for etching were $Cl_2/Ar$ chemistry of 40/10 sccm, a chamber pressure of 0.7 Pa, an RF forward power of 800 W and a capacitive bias of 350 W. The high bias and low pressure ensured a strong anisotropic etch, but reduced the selectivity to the resist. However, since only 1-1.5 μm of etching was needed, while there was over 10 μm of resist, this was not a problem. This recipe was able to etch LSMO/LMO superlattices at a rate of 44 nm/minute and AZ-9260 at rate of 466 nm/minute.

To etch LSMO/LMO superlattices using $Cl_2/Ar$ chemistry, the chamber was first cleaned and conditioned using $CF_4/O_2$ to remove any contaminants. It was followed by a $Cl_2$ coating of the chamber to reduce any absorption of chlorine during etching of the sample. Etching was done in two time steps and an intermediate step of cleaning/conditioning and coating was inserted to ensure a repeatable etch process. SEM pictures of the pillars after etching of LSMO/LMO superlattices during optimization are shown in FIGS. 37(a), 37(b), 38(a), 38(b), 38(c), and 38(d).

The following is the process flow to obtain pillars of LSMO/LMO structures to perform cross-plane I-V measurements. FIGS. 39(a)-39(h) schematically highlight the steps taken to realize the final structure:

a. The sample was first solvent cleaned in acetone under ultrasonication for 2 minutes. This was repeated with methanol. It was then rinsed in deionized (DI) water for 1 minute and then $N_2$ dried.

b. To define pillars for etching, we first spun HMDS on the sample at 2000 rpm for 25 seconds. This ensured good adhesion of the resist. AZ-9260 was then spun at 2000 rpm for 45 seconds.

c. The sample was then baked in an 80° C. oven for 15 minutes. The first mask was then used to expose circular patterns using Suss MJB 3 high resolution photolithography. The exposure at 23 $mW/cm^2$ was maintained for 90 seconds.

d. A developer of AZ 400K: DI water=1:2 was used to develop the exposed patterns. The sample was gently agitated in the developer for 1 minute to obtain a clear and defined pattern. It was the baked at 120° C. oven for 15 minutes in preparation for dry etching.

e. The sample was dry etched to a depth of 1-1.2 μm using the Panasonic dry etcher (ICP-RIE) using our developed etch recipe.

f. The resist was removed by a solvent clean process. Another layer of resist was spun to expose the $2^{nd}$ pattern on the sample, aligned to the etched pillars. This pattern is to deposit metal on the pillar and the surrounding bottom buffer layer.

g. Before metallization, residual resist should be removed from the surface. An $O_2$ etch was performed to clean the surface. We used the Panasonic dry etcher with an $O_2$ flow of 10 sccm, pressure of 0.5 Pa, RF forward power of 90 W and a RF capacitive bias of 130 W. With an etch rate of 200 nm/min, we performed etch for 1 minute, leaving sufficient resist to have a successful lift off.

h. Metal was evaporated on the sample using an electron beam evaporator to make electrical contact to the pillars and the bottom LSMO buffer layer. To make ohmic contact to p-type LSMO, high work function metal like platinum was deposited.

Since wire bonding is used to make an IC package, a thick metal layer compatible with this technique was deposited. In initial runs, we deposited platinum and gold. However, the layer peeled off during the metal lift off process. This is probably because platinum has poor adhesion to the LSMO surface. We introduced a thin layer of titanium, to act as an adhesion layer. In the later runs, three layers of metal were deposited in intervals of 10 minutes. The first was a 5-10 nm titanium layer for adhesion followed by 40 run of platinum and 300-500 nm of gold. The metal coated sample was then dipped in acetone for ~15 minutes to lift off the metal and pattern the contacts. Here, the resist covered regions are dissolved in the solvent which allow isolation between the top pillar contact and bottom LSMO back contact.

The cleanroom processed sample was diced into 4 mm×4 mm size. The sample was placed into an IC package using silver paste and wire bonded to the package.

Figure 40A:
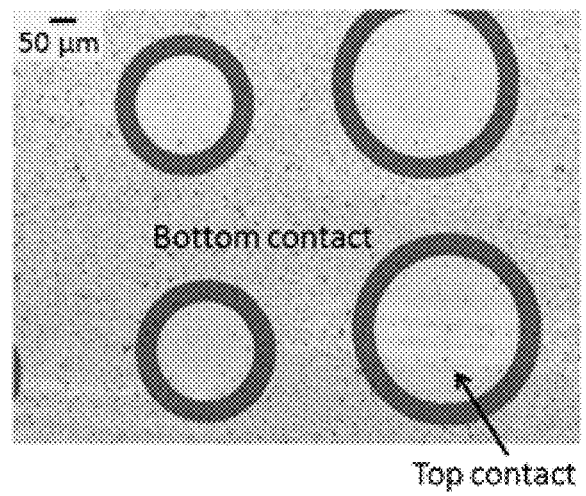
FIG. 40(a) is an optical image of final structure for temperature-dependent I-V measurement with Mask-1 pattern, with a large contact area.
Figure 40B:
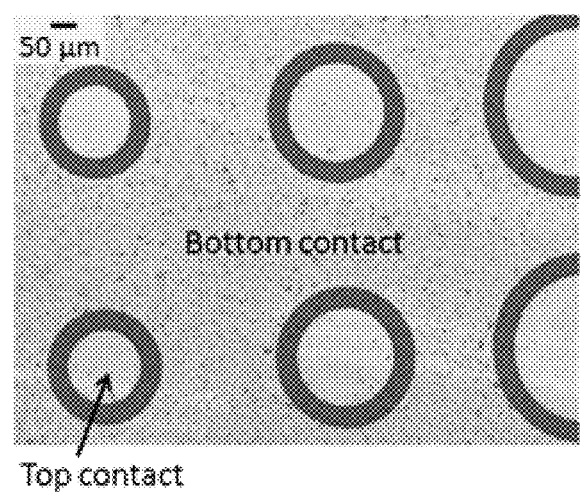
FIG. 40(b) is an optical image of final structure for temperature-dependent I-V measurement with Mask-1 pattern, with a large contact area.
Figure 40C:
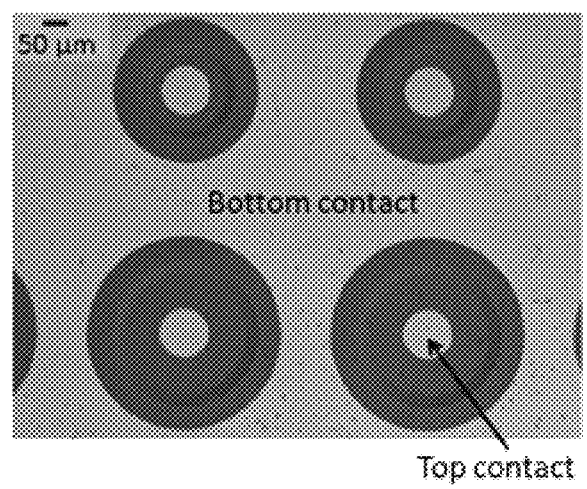
FIG. 40(c) is an optical image of final structure for temperature-dependent I-V measurement with mask-2 pattern, with better isolation between top and bottom contacts.
Figure 40D:
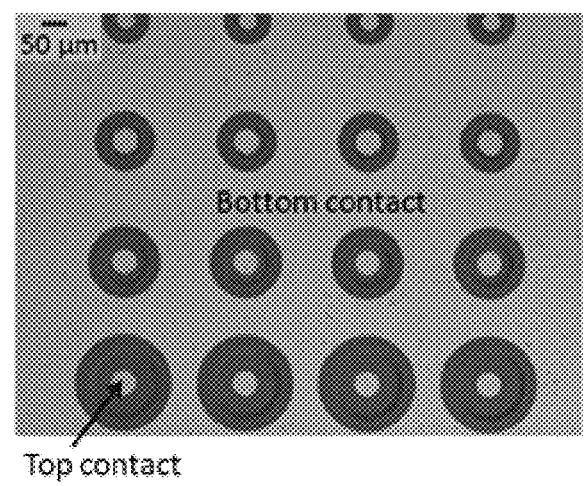
FIG. 40(d) is an optical image of final structure for temperature-dependent I-V measurement with mask-2 pattern, with better isolation between top and bottom contacts.

The optical images of the metalized clean room processed structure for the temperature dependent I-V measurements are shown in FIGS. 40(a), 40(b), 40(c), and 40(d). FIGS. 40(a) and 40(b) show the mask-1 type used to provide a bigger contact on top of pillar and a two-layer metallization of Ti (5 nm)/Pt (40 nm)/Au (500 nm). FIGS. 40(c) and 40(d) show the mask-2 pattern used to provide a smaller contact on top of the pillar to provide better electrical isolation between top and bottom contacts. The metallization includes three layers, Ti (10 nm)/Pt (40 nm)/Au (300 nm), with Ti layer chosen to provide better adhesion between LSMO and Pt/Au.

Superlattices Cross-plane I-V-T Measurements

The cross-plane I-V measurement was performed for the p-type LSMO/LMO superlattices as a function of temperature (100-600K).

Figure 41:
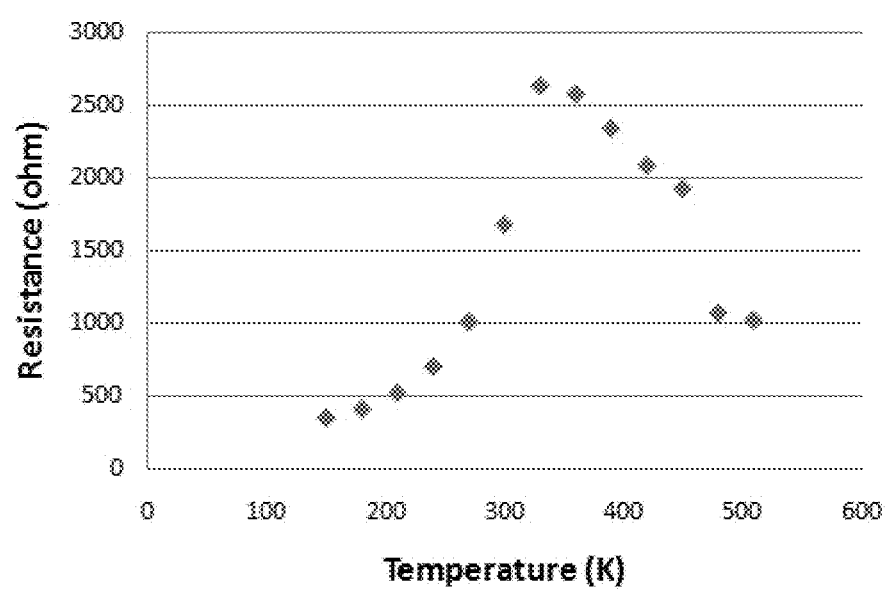
FIG. 41 is a cross-plane I-V measurements of p-type LSMO/LMO superlattices.
Figure 42A:
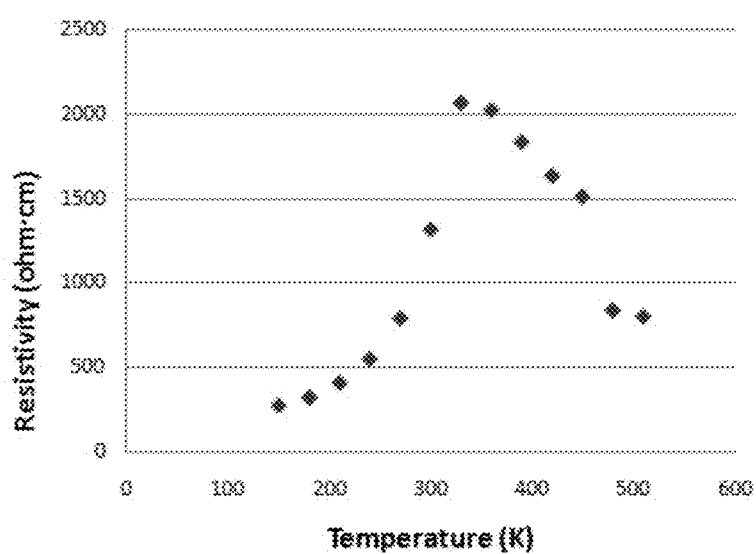
FIG. 42(a) is a calculated p-type LSMO/LMO superlattice with cross-plane resistivity.
Figure 42B:
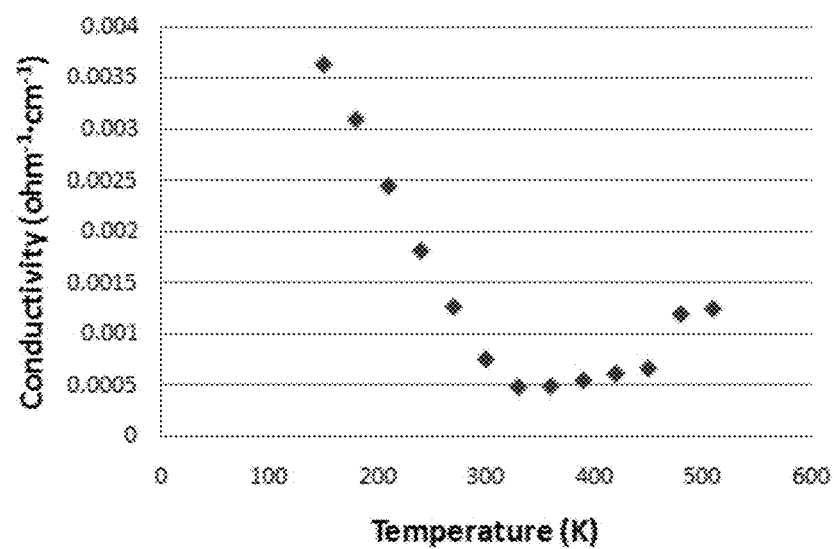
FIG. 42(b) is a calculated p-type LSMO/LMO superlattice with cross-plane conductivity.

The extracted temperature-dependent resistance is given in FIG. 41, which shows magnetic transition around T~330K, followed by decrease in resistance as a function of temperature. The temperature-dependent resistance was used to calculate the cross-plane electrical resistivity and conductivity of the superlattices using a circular pillar height of 900 nm and pillar diameter of 300 μm (FIGS. 42(a) and 42(b)). The cross-plane conductivity of the super lattice structure suggests a combination of magnetic transitions and thermionic behavior, which would be desirable to go higher in temperature. The measured cross-plane resistivities of LSMO/LMO superlattices show an enhancement of the apparent magnetic phase transition temperature, to $T_P \sim 330K$, ~80K higher than either LSMO thin films ($T_P \sim 260K$), LMO thin films ($T_P \sim 240K$), or in-plane-measured LSMO/LMO superlattices ($T_P \sim 250K$). The cross-plane enhancement in $T_P$ and the room temperature cross-plane resistivity enhancement by three orders of magnitude may be promising for low-magnetic field magneto-resistive devices, spintronics, plasmonics, field sensors, and magnetoresistive random access memory (MRAM).

Thermal Conductivity Measurement

Thermal conductivity measurements on LSMO and LMO thin films, as well as p-type LSMO/LMO superlattices can be used to evaluate the thermoelectric figure of merit. In the literature, reduction of thermal conductivity was considered to be a contributing factor for the enhancement of the thermoelectric figure of merit. A barrier to achieving a transition metal oxide thermoelectric figure of merit above 2 at room temperature is also restricted by high thermal conductivity in those materials.

An objective was to measure the temperature-dependent thermal conductivity, but in order to check the feasibility of p-type LSMO/LMO superlattice, we first performed room temperature thermal conductivity measurements. The room temperature thermal conductivity of thin films and superlattices were measured using the photo-acoustic (PA) technique. The photo-acoustic technique is a relatively simple, noncontact method for thermal conductivity measurement.

In the PA technique a laser diode operating at a wavelength of 0.8 μm is used as a heating source. The laser power driver is sinusoidally modulated by the internal function generator of a lock-in amplifier and the power output of the laser diode is ~150 mW during modulation mode. The laser beam heating generates the acoustic signal. The maximum rise in temperature at the sample surface is less than 0.5° C. A condenser microphone which is built into the PA cell is used to sense the acoustic signal and transmit to a lock-in amplifier that measures its amplitude and phase. The lock-in amplifier is connected to a computer for data acquisition and control.

The PA method of thermal conductivity measurement used samples coated with 80 nm of titanium metal layer using e-beam evaporator in a cleanroom environment. All the samples and reference STO bare substrates were coated with Ti simultaneously to achieve the same thickness uniformity and tolerance. The thermophysical properties of layers and substrate such as density and specific heat capacity are also used to infer thermal conductivity from PA measurements. The following thermophysical properties were provided to the measurement group for data processing (Table 4.3).

TABLE 4.3

Thermophysical properties for photoacoustic measurement.

| Material | Density (kg/m³) | Specific Heat (J/kg · K) | Thickness (nm) | Thermal Conductivity (W/m · K)$_{300 K}$ |
|---|---|---|---|---|
| STO | $5.12 \times 10^3$ | 314.3 | 500000 | 10 |
| LMO | $5.500 \times 10^3$ | 828.9 | 400 | — |
| LSMO | $5.1 \times 10^3$ | 545.4 | 560 | — |
| LSMO/LMO Superlattices | $5.266 \times 10^3$ | 639.6 | 1520 | — |

Figure 43:
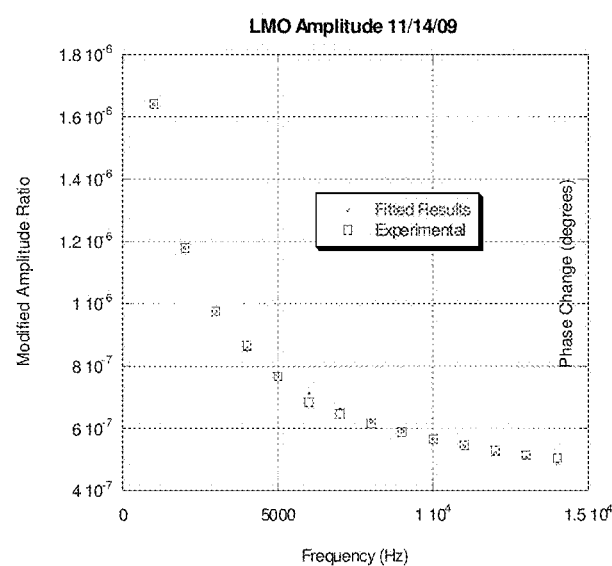
FIG. 43(a) is a PA modified amplitude ratio of LMO sample.
FIG. 43(b) is a phase fitting results of LMO sample.
Figure 43B:
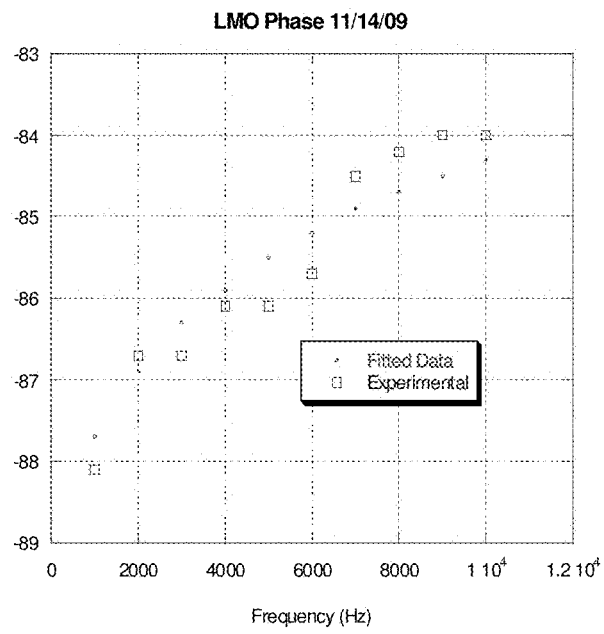
Figure 44:
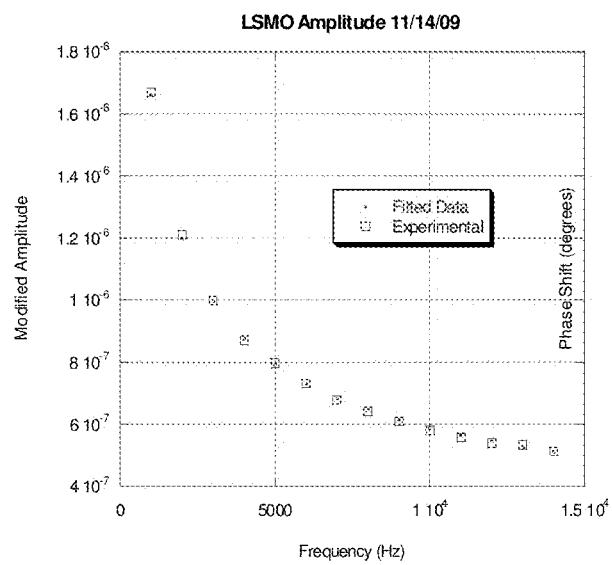
FIG. 44(a) is a PA amplitude ratio of LSMO sample.
FIG. 44(b) is a phase fitting results of LSMO sample.
Figure 44:
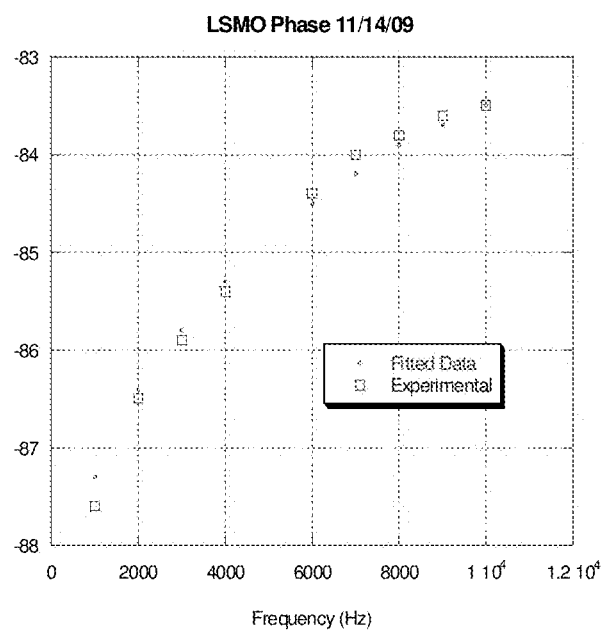
Figure 45:
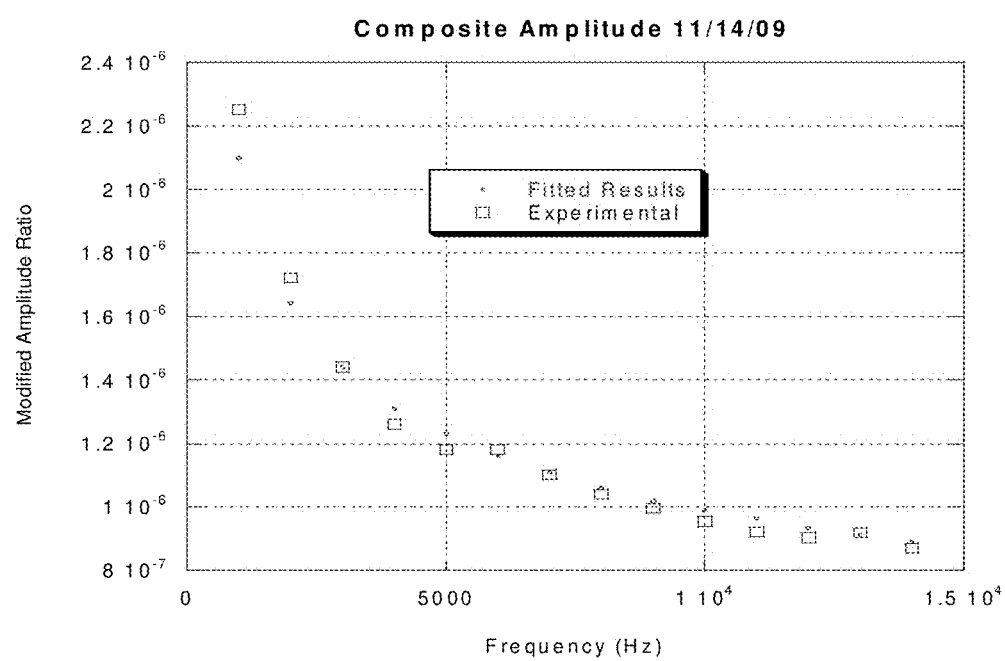
FIG. 45 is a PA amplitude fitting result of LSMO/LMO superlattices material system.

The PA measurement of thin film LSMO, LMO and LSMO/LMO superlattices was performed. Each sample was measured three times and the average values were used for analysis. The measured thermal conductivities of the samples are summarized in Table 4.4. Fitting plots are provided of p-type semiconducting thin film LMO (FIGS. 43(a) and 43(b)), metallic LSMO (FIGS. 44(a) and 44(b)) and LSMO/LMO superlattices (FIG. 45).

TABLE 4.4

Cross-plane room temperature thermal conductivity measurement of epitaxial thin films of LSMO, LMO and LSMO/LMO superlattices material system.

| Sample | Measured thermal conductivity $\kappa_T$ (W/m · K) by amplitude | Measured thermal conductivity $\kappa_T$ (W/m · K) by phase |
|---|---|---|
| LSMO | 1.60 | 1.53 |
| LMO | 1.29 | 1.24 |
| p-type LSMO/LMO Superlattices | 0.89 | N/A |

The Wiedemann-Franz law was used to calculate the electronic contribution ($\kappa_e$), where $L=2.44\times10^{-8}$ W$\Omega$K$^{-2}$, and the room temperature conductivities were $\sigma(LSMO)=3.02380$ $\Omega^{-1} \cdot$cm$^-$, $\sigma(LMO)=0.82310$ $\Omega^{-1} \cdot$cm$^{-1}$ and $\sigma(LSMO/LMO)=0.000758716$ $\Omega^{-1} \cdot$cm$^{-1}$. The lattice contribution to the total thermal conductivity ($\kappa_l$ was determined using ($\kappa_l = \kappa_T - \kappa_e$) and in all cases, the electronic contribution is negligible compared to the total thermal conductivity.

LSMO/LMO superlattices showed a room temperature thermal conductivity of 0.89 W/m·K, which is lower than either LSMO (1.60 W/m·K) or LMO (1.29 W/m·K) thin films. The lowest thermal conductivities achieved are lower than thermal conductivity reported in oxide bulk or composite materials to date and are highly competitive with the thermal conductivity of heavy metal alloys. Thermal conductivity helps to exploit the low-dimensional metal/semiconductor superlattices to increase the thermoelectric figure of merit (ZT). The room temperature thermal conductivity of 0.89 W/m·K suggests the possibility of realizing a metal oxide thermoelectric material with figure of merit greater than 2. The reduction in thermal conductivity using p-type perovskite, LSMO/LMO superlattices is an improvement in the development of perovskite oxide thermoelectrics.

CONCLUSIONS AND RESULTS

The novel p-type perovskite oxide metal/semiconductor superlattices to achieve a high ZT material for thermoelectric generators were investigated. We have presented the selection of LSMO as a metallic and LMO as a p-type semiconducting material for p-type metal/semiconductor superlattices for thermoelectric generator operating in a high temperature range (800-1000K). Conclusions and results include the following:

CONCLUSIONS

To realize material selection, growth parameters were designed to achieve the p-type epitaxial thin film of LSMO and LMO:
LSMO and LMO material characterization showed highly epitaxial thin film growth using pulsed laser deposition.
In-plane Seebeck measurement validated the p-type behavior for both LSMO and LMO.

Room temperature thermal conductivity measurement of epitaxial thin film LSMO is 1.60 W/m·K and LMO is 1.29 W/m·K.

Growth of p-type LSMO and LMO were used to obtain epitaxial, micron-thick LSMO/LMO superlattices.

The material characterization done using XRD, RSM and TEM demonstrated the superlattices were of high quality and were consistent with epitaxial films.

In an effort to perform cross-plane electrical transport measurements, an LSMO/LMO etch recipe ($Cl_2$/Ar chemistry) was developed with photoresist as a mask using reactive ion etching technique.

The measured cross-plane conductivities of LSMO/LMO superlattices suggest a combination of magnetic transitions and thermionic behavior.

The measured cross-plane resistivity data shows an increase of magnetic transition peak, to T~330K, in LSMO/LMO superlattices, which is approximately ~80K higher than either LSMO (T~244 K) or LMO (T~250 K) thin films.

The cross-plane thermal conductivity achievable in the LSMO/LMO superlattices was 0.89 W/m·K (at room temperature). This is a significant reduction in thermal conductivity as compared to their individual thin film counterparts (LSMO and LMO). Considering that thermal conductivity of the perovskite phase is cited as a major limitation in the literature, this disclosure is a step towards perovskite thermoelectrics with suitable ZT values.

Figure 49:
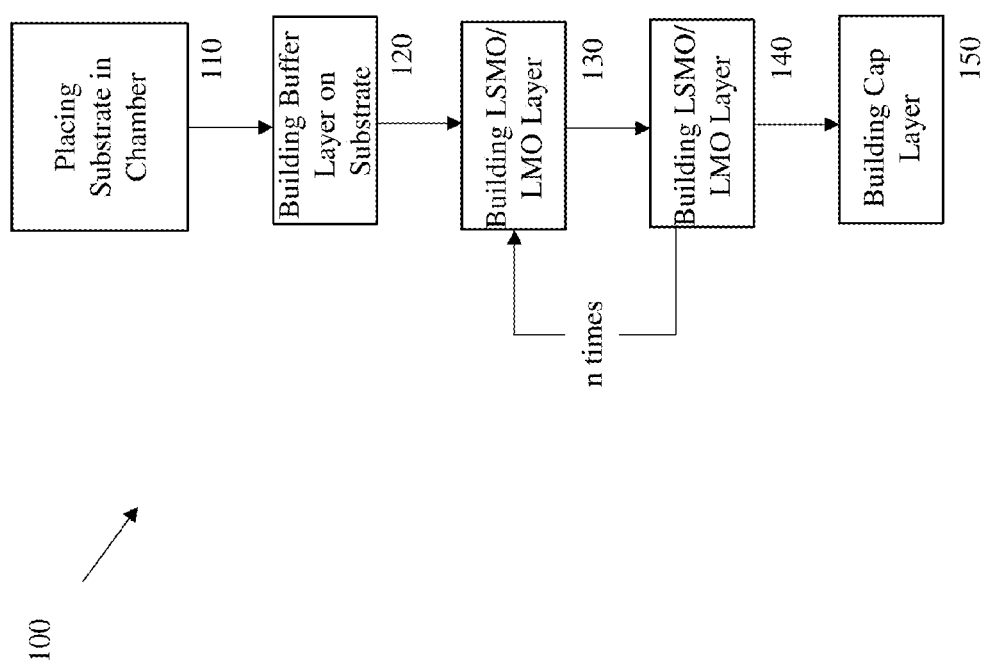
FIG. 49 is a process flow 100 illustrating the steps for building the metallic LSMO (8 nm)/semiconducting LMO (8 nm) superlattice structure.

Referring to FIG. 49, a process flow 100 according to the present disclosure is presented for building the structure shown in FIG. 3(*a*). The process 100 includes placing a substrate in a growth/deposition chamber (110). The substrate can be strontium titanate (STO), $(La,Sr)(Al,Ta)O_3$ (LSAT) or lanthanum aluminate ($LaAlO_3$), or other substrate that can provide an appropriate lattice matching for LSMO or LMO. The lattice mismatch between the substrate and the lattice should be less than 5%, more preferably less than 2%, and most preferably less than 1%. It should be noted that STO is depicted in FIG. 3(*a*). The chamber can be a growth chamber or a deposition chamber. In one embodiment, the chamber is a pulsed laser deposition chamber. Thereafter, the process flow continues to building a buffer layer on the substrate (120). The buffer layer can be layer of LSMO or LMO. The buffer layer depicted in FIG. 3(*a*) is LSMO and is depicted as being 400 nm. However, the buffer layer can be thinner, e.g., in one embodiment as low as 100 nm and in another embodiment even as low as 50 nm or it can be thicker, e.g., 500 nm. The buffer layer is achieved by applying the pulsed laser to the appropriate (LSMO or LMO) target in the presence of $O_2$ at a particular partial pressure (discussed further below).

Thereafter, a lattice of LMO and LSMO is provided on the buffer layer. The thickness of each layer, in at least one embodiment can be between 2 nm to 21 nm. It should be noted that if the buffer layer is of the LSMO type, then the first layer of the lattice provided on top of the buffer layer is a layer of LMO, however, if the buffer layer is of LMO type then the first layer of the lattice is a LSMO type. These layers (LSMO/LMO) then repeat in an alternating manner (i.e., either LSMO-LMO-LSMO— . . . or LMO-LSMO-LMO . . . ) for a number of times. In one embodiment the layer is repeated 60 times. However, the minimum can be one set of LSMO/LMO layers. The growth or deposition of these layers is also at a particular partial pressure of $O_2$ (discussed further below). These steps are depicted as Building LSMO/LMO layer (130 and 140). The last step is building a cap layer (150). The building of the cap layer is based on choosing conducting layer (LSMO) to be the last layer. Therefore, if the last layer happens to be an LMO layer, then the capping layer is an LSMO layer. Alternatively, if the last layer is an LSMO layer, then the last layer is continued to be built until the desired thickness is achieved. The capping layer is also built at the same partial pressure of $O_2$ as the buffer and the LSMO/LMO layers. The LSMO capping layer is about 3-20 times the thickness of each LSMO/LMO layer of the lattice. In the embodiment depicted in FIG. 3(*a*), the capping layer is about 160 nm thick.

Figure 50:
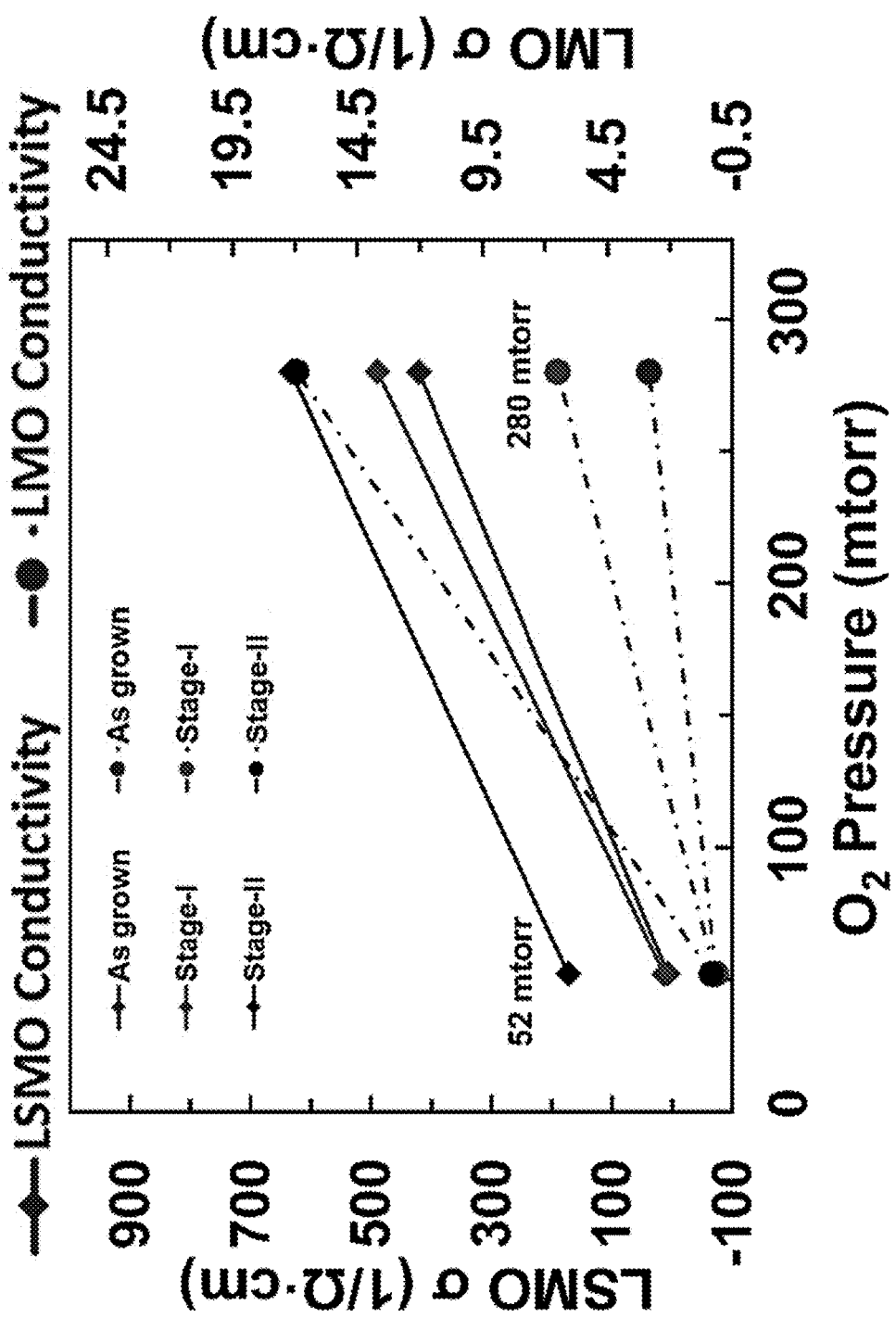
FIG. 50 is a graphical representation of the conductivity of LSMO and LMO measured at room temperature for thin films after two-stage annealing process.

According to one embodiment, the growth of LSMO and LMO thin films on (100)-oriented cubic STO substrates was achieved using pulsed laser deposition (PLD). The growth conditions used were 248 nm KrF excimer laser (pulse width of 25 ns), laser fluence of 1.3 J/cm$^2$, pulse frequency of 5 Hz, and temperature maintained at 750° C. measured using an infrared pyrometer (STO emissivity of 0.8). The target was mechanically polished prior to each growth to achieve a uniform film. Epitaxial high resistivity thin films of LSMO and LMO on STO were also deposited by PLD using a background $O_2$ pressure of 52 mtorr to compare their post-growth annealing behavior with that of a sample grown at a higher oxygen partial pressure of 280 mtorr. Post-growth annealing in oxygen did not appreciably affect the conductivity of the sample grown at 52 mtorr (see FIG. 50, conductivity of LSMO and LMO measured at room temperature for thin films after two-stage annealing process: Stage-I (750° C., 300 mtorr, 15 hours PLD), and Stage-II (900° C., atmospheric $O_2$ pressure, tube furnace). Hence, the control of oxygen stoichiometry was focused on optimizing the oxygen partial pressure during growth to achieve low resistivity thin films and superlattices.

Figure 51:
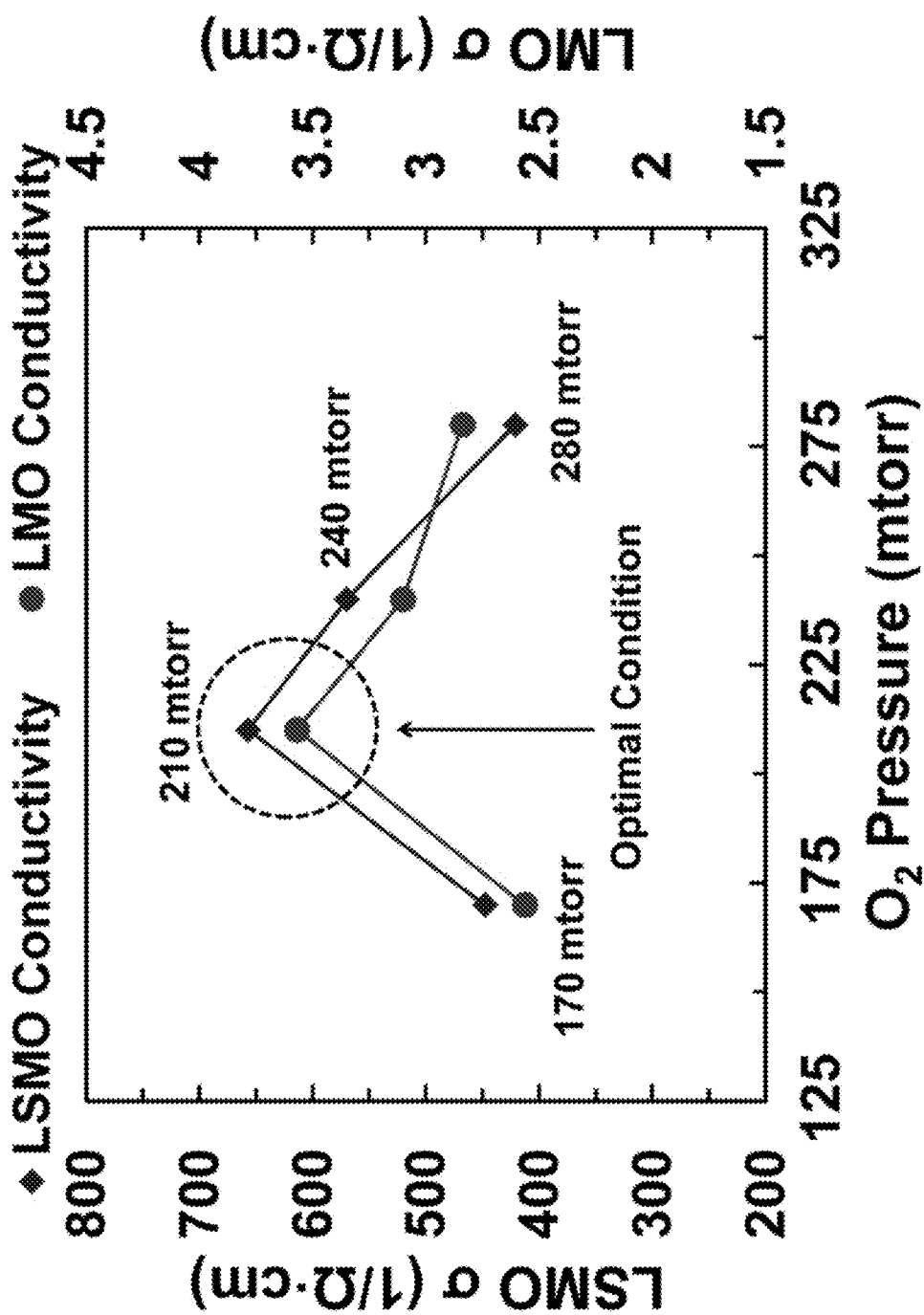
FIG. 51 is a graphical representation of the conductivity of LSMO and LMO measured at room temperature grown at higher oxygen partial pressure.

Optimization of the resistivity of the LSMO and LMO thin films was achieved with oxygen partial pressures in the range of 200-300 mtorr. The films grown at 210±3 mtorr resulted in the lowest resistivity (FIG. 51, conductivity of the LSMO and LMO thin films measured room temperature grown at higher oxygen partial pressure). LSMO and LMO films were deposited under conditions that yielded a 100× increase in electrical conductivity compared to thin films at 52 mtorr, both measured in-plane, thereby approaching the conductivity of a good thermoelectric material (about 1000/Ohm·cm), as is known to a person having ordinary skill in the art. The oxygen partial pressure effect on conductivity can be related to double exchange interactions between $Mn^{3+}$ and $Mn^{4+}$ ions. The parent compound $LaMnO_3$ ($Mn^{3+}$, $t^3_{2g}e^1_g$), with ion vacancies of $La^{3+}$, $Mn^{3+}$, and $O^{2-}$, allows doping on all lattice sites. The parent compound exhibits a ferromagnetic and semiconducting phase and conducts by cation transitions. The cation vacancies are responsible for causing mixed manganese $Mn^{3+}$ and $Mn^{4+}$ ions for charge neutrality. $LaMnO_3$ with $Sr^{2+}$ doping ($La_{0.67}Sr_{0.33}MnO_3$) creates a change of $Mn^{3+}$ to $Mn^{4+}$ with no $e_g$ electron ($t^3_{2g}e^0_g$). The hole hopping from a $Mn^{4+}$ ion to a $Mn^{3+}$ ion is possible only if the localized spins on adjacent Mn ions are parallel. This interaction between adjacent Mn ions is dominated by the double-exchange mechanism through an oxygen ion and is responsible for metallic behavior in LSMO. These $Mn^{4+}$ and $Mn^{3+}$ ion concentrations are susceptible to any change in oxygen stoichiometry, which is controlled by the oxygen partial pressure. A higher oxygen partial pressure increases the $Mn^{4+}$ ion concentration, which results in higher conductivity and higher mobility. A lower oxygen partial pressure creates oxygen vacancies, which accommodate in the vicinity of $Mn^{3+}$ ions compared to $Mn^{4+}$ ions. For every oxygen vacancy, one $Mn^{4+}$ is replaced by two $Mn^{3+}$ ions with a significant increase in the c-axis lattice parameter in LMO, resulting in high resistivity films. The LSMO and LMO samples grown at higher oxygen partial pressures have a high concentration of carriers, resulting in low resistivity films with better mobility.

As discussed above, the partial pressure of $O_2$ when building the superlattice structure depicted in FIG. 3(a), surprisingly has a significant impact on the electrical conductivity and the Seebeck coefficient. These parameters can be measured cross-plane or in-plane.

The following tables provide values for conductivity measured in $1/(\Omega \cdot cm)$, Seebeck coefficient measured in $\mu V/K$, and thermal conductivity measured in $W/(m \cdot K)$ for various conditions.

TABLE CIP-1

LSMO in-plane conductivity with
$O_2$ partial pressure at about 300 K

| LSMO $O_2$ Pressure (mtorr) | LSMO Conductivity (300 K) $(1/\Omega \cdot cm)$ |
| --- | --- |
| 52 | 3.03 |
| 170 | 447.868 |
| 210 | 657 |
| 240 | 570 |
| 280 | 420.85 |

TABLE CIP-2

LMO in-plane conductivity with $O_2$ partial pressure at about 300 K

| LMO $O_2$ Pressure (mtorr) | LMO Conductivity (300 K) $(1/\Omega \cdot cm)$ |
| --- | --- |
| 52 | 0.082311 |
| 170 | 2.56344 |
| 210 | 3.57 |
| 240 | 3.1 |
| 280 | 2.8376 |

TABLE CIP-3

LSMO/LMO Superlattice cross-plane conductivity
with 52 mtorr $O_2$ partial pressure at about 300 K
Cross-plane Superlattice (52 mtorr)

| Temperature (52 mtorr) | Conductivity (52 mtorr) |
| --- | --- |
| 150 | 0.003635828 |
| 180 | 0.003099477 |
| 210 | 0.002443857 |
| 240 | 0.001816644 |
| 270 | 0.001264151 |
| 300 | 0.000758716 |
| 330 | 0.000483742 |
| 360 | 0.000494309 |
| 390 | 0.000544768 |
| 420 | 0.000611709 |
| 450 | 0.000661003 |
| 480 | 0.001192218 |
| 510 | 0.001248907 |

Cross-plane Seebeck (S) at about 300° K = 1520 $\mu V/K$;
Cross-plane thermal conductivity ($\kappa_T$) at about 300 K = 0.89 W/m · K
Cross-plane electrical conductivity ($\sigma$) at about 300° K = 7.5 × $10^{-04}$ $ohm^{-1} \cdot cm^{-1}$

TABLE CIP-03

LSMO/LMO Superlattice cross-plane conductivity
with $O_2$ partial pressure at about 300 K
Cross-plane Superlattice (210 mtorr)

| Temperature- 210 mtorr | Conductivity- 210 mtorr |
| --- | --- |
| 210 | 2.66E-02 |
| 240 | 1.60E-02 |
| 270 | 1.13E-02 |
| 300 | 6.30E-03 |
| 360 | 9.50E-03 |
| 390 | 1.08E-02 |
| 420 | 9.10E-03 |
| 450 | 4.90E-03 |
| 480 | 3.18E-03 |
| 510 | 2.73E-03 |
| 540 | 2.71E-03 |
| 570 | 2.97E-03 |
| 600 | 3.04E-03 |

Cross-plane Seebeck (S) at about 300 K = 2560 $\mu V/K$;
Cross-plane Seebeck (S) at about 320 K = 8520 $\mu V/K$;
Cross-plane Seebeck (S) at about 340 K = 11160 $\mu V/K$;
Cross-plane Seebeck (S) at about 360 K = 16640 $\mu V/K$;
Cross-plane thermal conductivity ($\kappa_T$) at about 300 K = 0.92 W/m · K
Cross-plane electrical conductivity ($\sigma$) at about 300 K = 6.3 × $10^{-03}$ $ohm^{-1} \cdot cm^{-1}$, and at least 8 × $10^{-4}$ $ohm^{-1} \cdot cm^{-1}$.

As can be seen from the data provided above, the electrical conductivity for in-plane measurements for both LMO and LSMO thin films peak at 210 mtorr at a given temperature (657 1/(ohm·cm) at about 300K for LSMO and 3.57 1/(ohm·cm) at about 300K for LMO). Based on that observation, various parameters including conductivity measured in $1/(\Omega \cdot cm)$, Seebeck coefficient measured in $\mu V/K$, and thermal conductivity measured in $W/(m \cdot K)$ are provided for the LSMO/LMO superlattice measured in a cross-plane manner at 52 mtorr and at 210 mtorr. The results were surprising in that the electrical conductivity increased by a factor of about 10, while thermal conductivity remained substantially the same. Furthermore, the Seebeck coefficient increased by about 1000 $\mu V/K$. Furthermore, the Seebeck coefficient increased significantly with only 60K rise in temperature. This increase in Seebeck coefficient, increase in electrical conductivity, and the thermal conductivity substantially remaining the same as a result of an increase in partial pressure of $O_2$ in the pulsed laser deposition chamber during the deposition process of LSMO and LMO was unexpected. Increase in partial pressure of $O_2$ in other building processes (other deposition and growth processes) is within the scope of the present disclosure.

The cross-plane conductivity of the superlattice structure extracted from I-V-T measurements of etched pillars (see e.g., FIG. 5b) indicates a contribution from thermionic behavior, and the extracted effective barrier height of 300±15 meV is consistent with the theoretically expected LSMO/LMO Schottky barrier height ($\Phi_B$) of about 300 meV at about 300K. As provided above, the Seebeck coefficient is 1520±53 $\mu V/K$ at room temperature for a partial pressure of about 50±5 mtorr, or more particular 52 mtorr. One reason why the ZT is low under the 50 mtorr condition, as compared to the condition where the partial pressure of $O_2$ is about 210 mtorr, e.g., is due to a low power factor ($S^2\sigma$), which was a consequence of the high resistivities of the constituent materials (i.e., LSMO and LMO) combined with a high barrier height relative to kT at room temperature.

Figure 52:
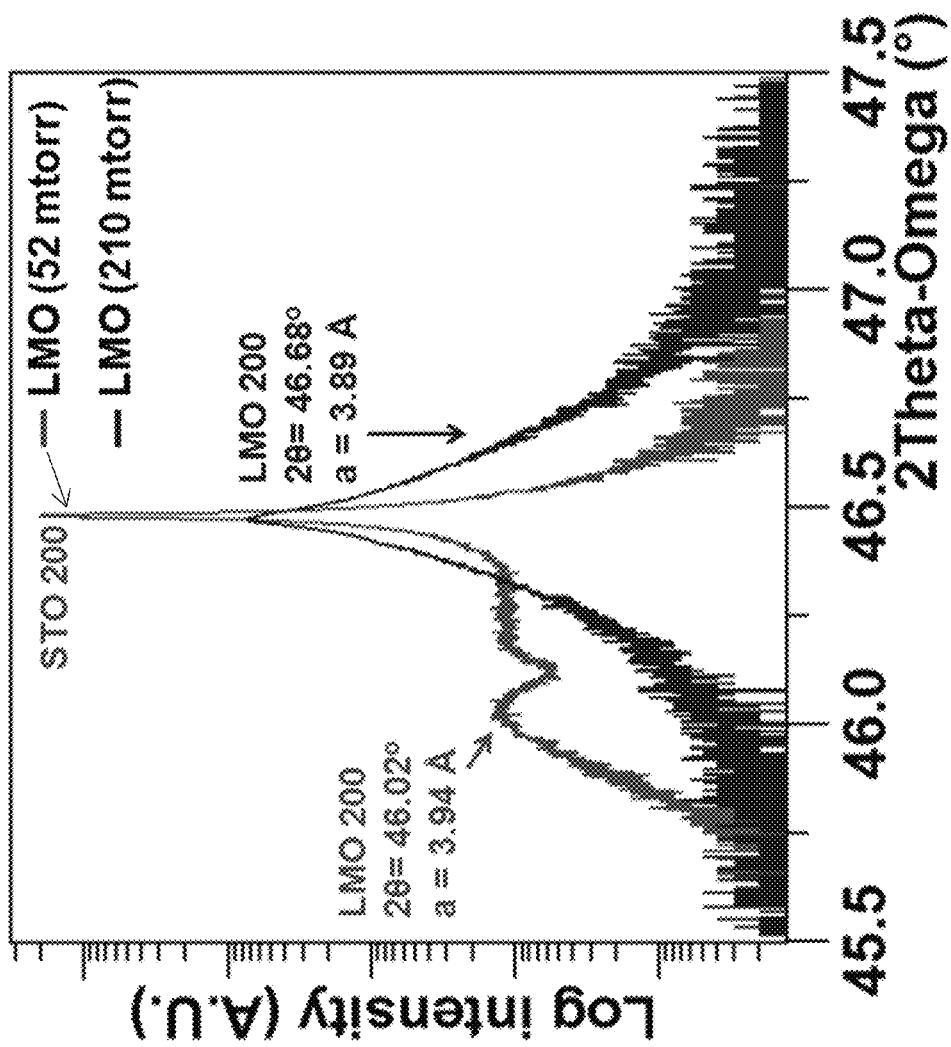
FIG. 52 is an XRD 2-theta-omega scan of an LMO on a STO (100) substrate.

LSMO and LMO thin-film structural analyses were performed using X-ray diffraction (XRD). XRD 2-theta-omega (2θ-ω) shows <001>-textured LSMO films on STO substrates without any additional impurity phases. The narrow full-width-α-half-maximum intensity (FWHM) of the rocking curve (0.012° suggests high crystalline quality. Highly aligned grains and in-plane epitaxy were confirmed by asymmetric 110 Phi scans of LSMO on STO, which showed that all four 90°-separated film peaks were well-aligned with the substrate peaks. LMO 2θ-ω analyses of the sample grown at a higher oxygen pressure in the range of 200-300 mtorr showed that the LMO peak at 3.89 Å overlaps with the STO substrate peak. In contrast, for LMO films grown at a low oxygen partial pressure of 52 mtorr, the c-axis lattice parameter increases from 3.89 Å to 3.94 Å (see FIG. 52, an XRD 2-theta-omega scan of an LMO on a STO (100) substrate confirming c-axis epitaxial behavior, the LMO grown at 52 mtorr partial oxygen pressure shows a distinguishing peak with a=3.94 Å whereas the LMO grown at 210 mtorr peak overlaps with the STO peak). The overlapping of the LMO film peak with the STO peak at higher oxygen partial pressure is consistent with prior observations. 110 asymmetric Phi scans confirmed highly aligned grains and in-plane epitaxy. Symmetrical 002 reciprocal space mapping showed the LMO peak intensity spread overlaps with the high intensity STO peak, confirming epitaxy.

Figure 53A:
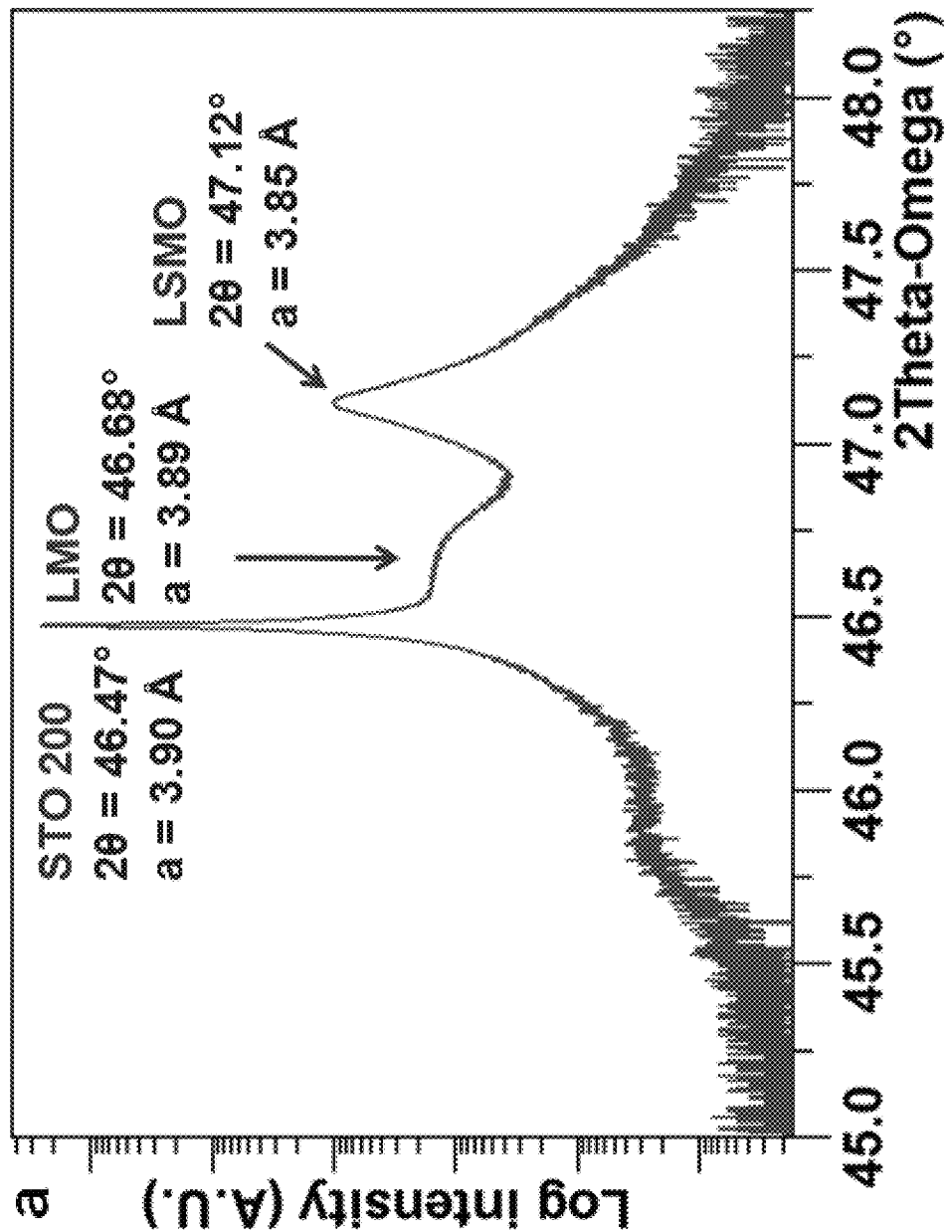
FIG. 53a is an XRD 2-theta-omega scan of an LSMO/LMO superlattice on a STO (100) substrate.
Figure 53B:
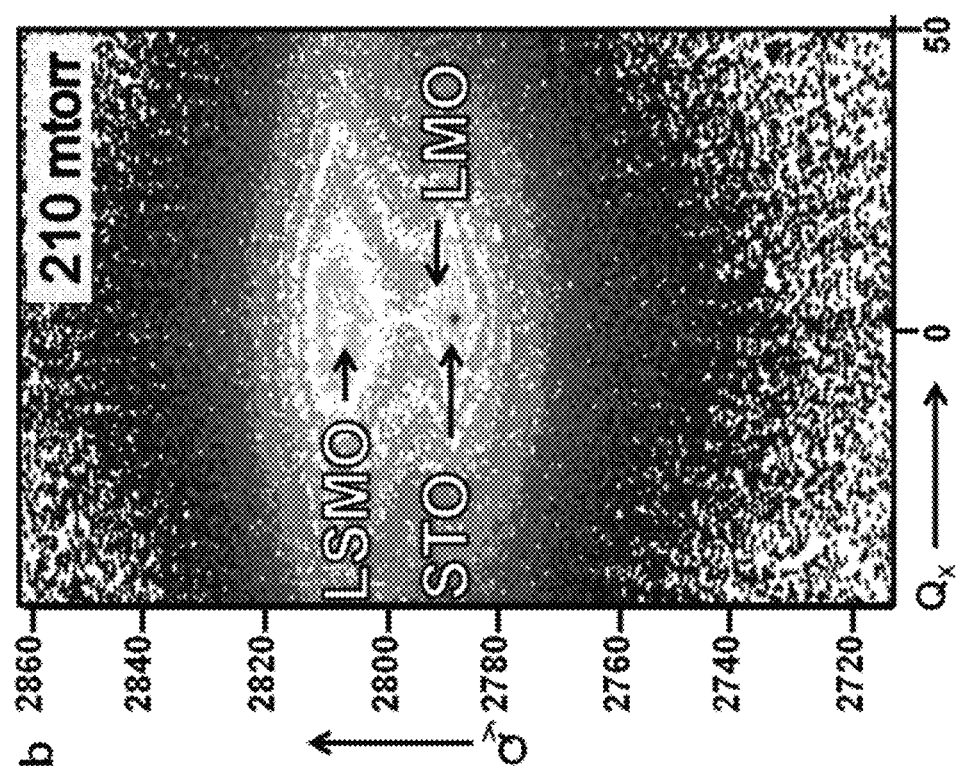
FIG. 53b is a 110 RSM of a micron-thick LSMO/LMO superlattice.

As discussed above, the low resistivity LSMO/LMO superlattices were grown at 210±3 mtorr oxygen partial pressure, maintaining all other growth parameters the same. The 2θ-ω analyses showed that the 002 film peak aligned with the STO 002 peak, confirming epitaxy (see FIG. 53a, XRD 2-theta-omega scan of an LSMO/LMO superlattice on a STO (100) substrate confirming c-axis epitaxial behavior with LSMO FWHM (0.187°). In-plane epitaxy and aligned grain were confirmed by asymmetric 110 Phi scans of superlattices, which showed that all four 90°-separated film peaks of LSMO and LMO were well-aligned with the STO substrate peaks. A 110 reciprocal space map from an oxide superlattice was analyzed to understand the degree of relaxation and strain in the superlattice layers (see FIG. 53b, 110 RSM of a micron-thick LSMO/LMO superlattice confirming the LMO peak overlapping with STO peak, and pseudomorphic growth of epitaxial LSMO and LMO superlattice films). The degree of spread around the STO peak confirms that the LMO peak overlaps with the STO peak; this overlap along with the intense LSMO peak confirms the pseudomorphic nature of the superlattice on STO substrates.

Figure 54A:
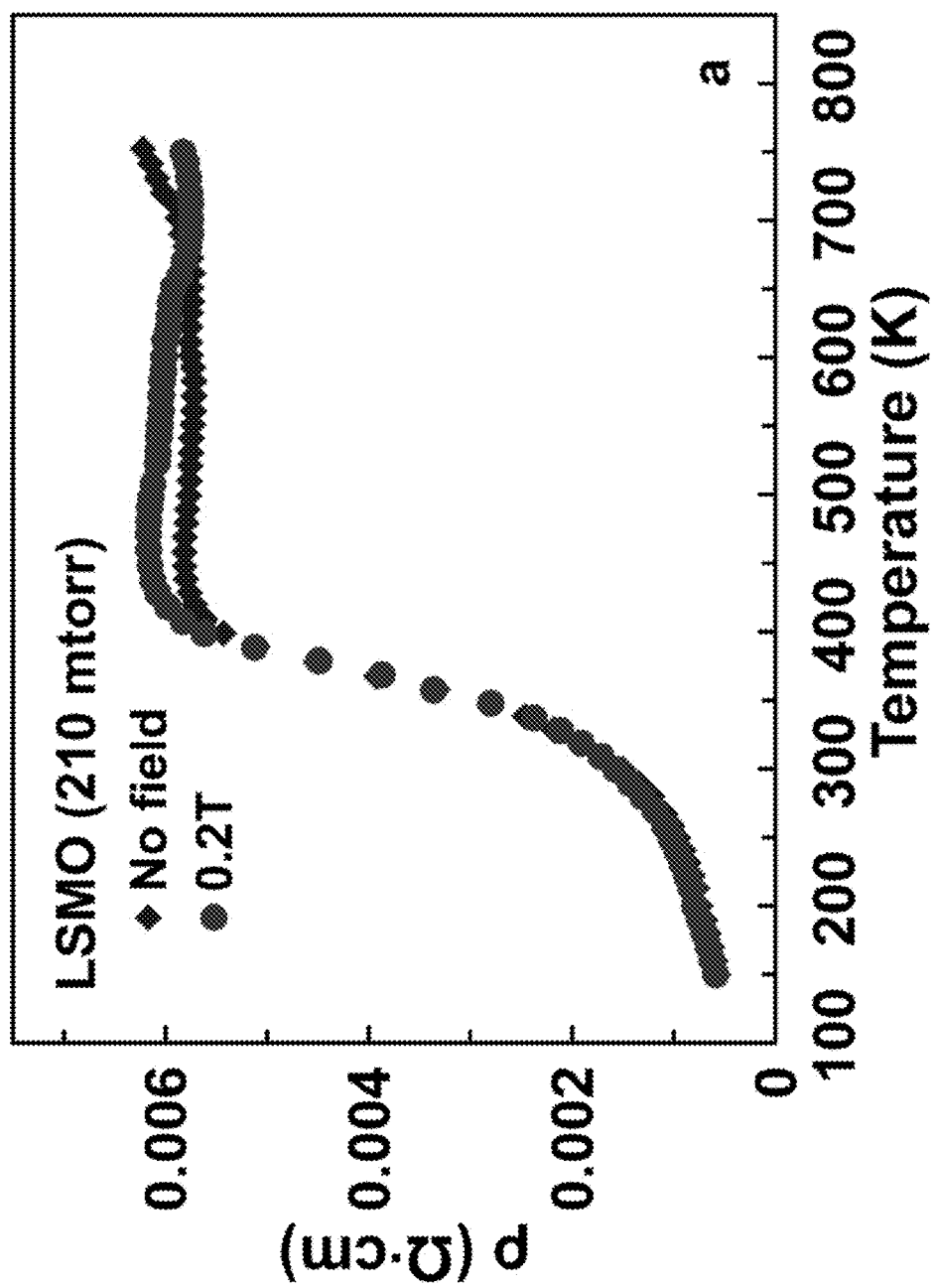
FIG. 54a is a graphical representation of temperature-dependent in-plane resistivity with and without a magnetic field applied in a direction normal to the film surface for LSMO.
Figure 55A:
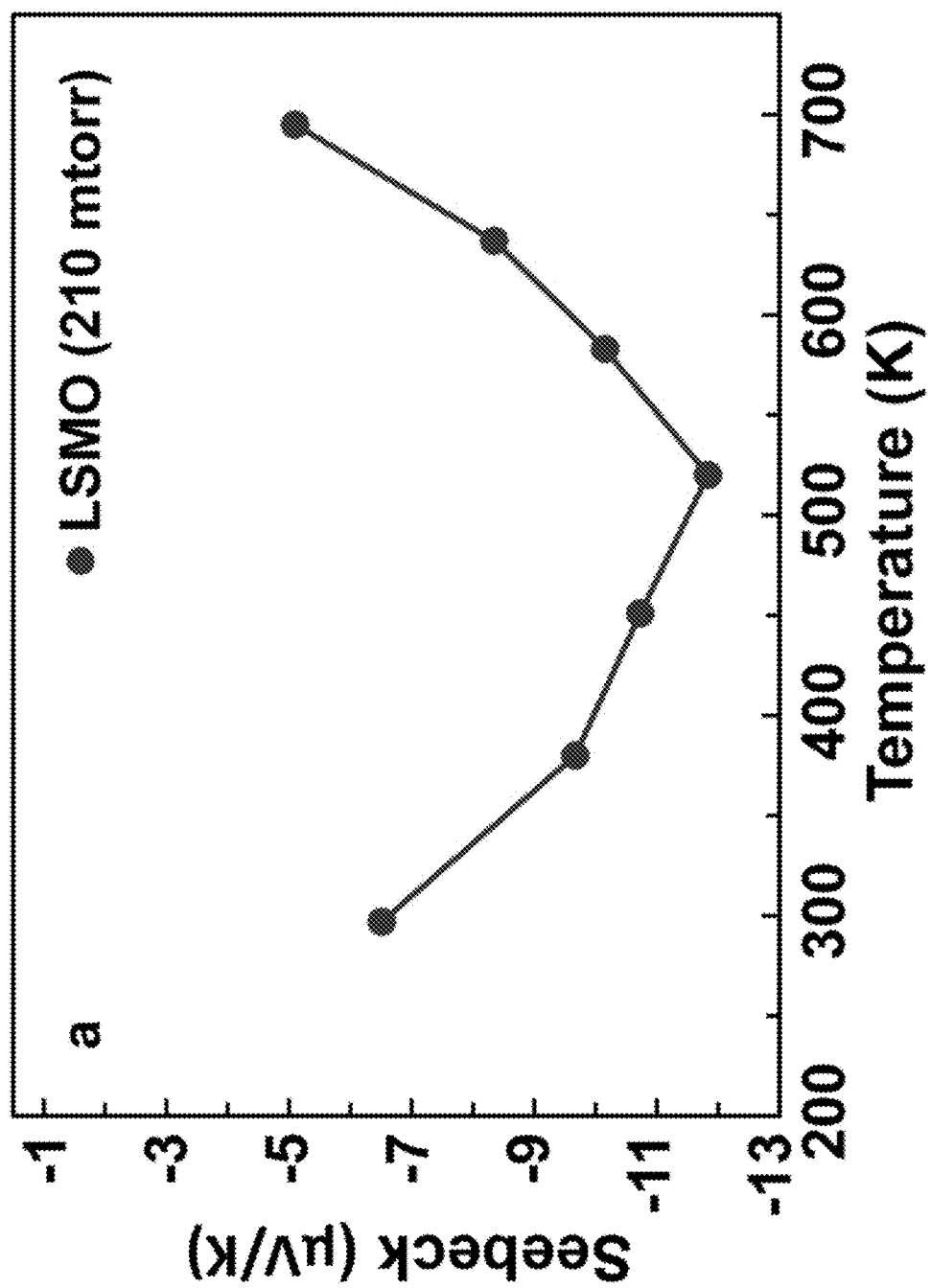
FIG. 55a is a graph of in-plane Seebeck measurement of LSMO showing that the Seebeck coefficient is consistent with metallic behavior with a magnitude of less than 15 µV/K.

The in-plane electrical transport properties of epitaxial LSMO grown at 210 mtorr were extracted from measurements of resistivity, Seebeck coefficient, and carrier concentration. Hall measurements of a 200 nm thick epitaxial LSMO film on STO showed a room temperature resistivity of $1.52 \times 10^{-3}$ ohm·cm, a hole carrier concentration of $1.12 \times 10^{21}$ cm$^3$, and mobility of 3.67 cm$^2$/Vs, in the range of typical oxide thermoelectric materials. Four-probe temperature dependent resistivity (TDR) measurements of LSMO, with (H=0.2 Tesla) and without (H=0 Tesla) a magnetic field, showed a 100× increase in electrical conductivity compared to high resistivity LSMO thin films grown at 52 mtorr (see FIG. 54a, a graph of temperature-dependent in-plane resistivity with and without a magnetic field applied in a direction normal to the film surface for LSMO), approximately in the range of a good thermoelectric material (about 1000/Ohm·cm). The increase in the conductivity of LSMO is due to a higher carrier concentration with polaronic hopping conduction, with an extracted thermal activation energy ($E_A$) of 97.0±5 meV. The in-plane temperature dependent Seebeck measurement of LSMO showed a Seebeck coefficient with a magnitude less than 15 µV/K over the entire temperature range, which is consistent with metallic behavior (see FIG. 55a, in-plane Seebeck measurement of LSMO showing that the Seebeck coefficient is consistent with metallic behavior with a magnitude of less than 15 µV/K).

Figure 54B:
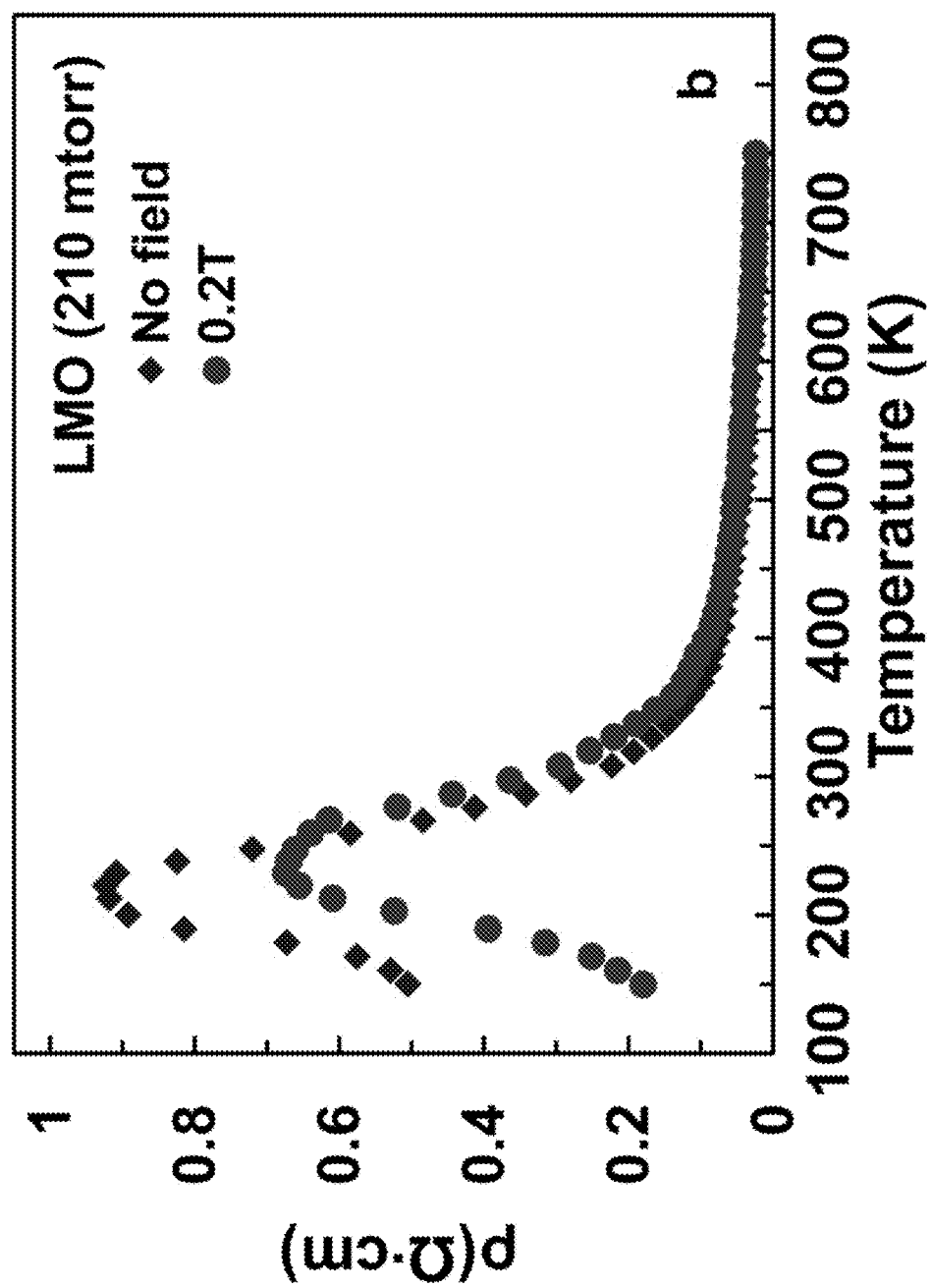
FIG. 54b is a graph of temperature-dependent in-plane resistivity with and without a magnetic field applied in a direction normal to the film surface for LMO.
Figure 55B:
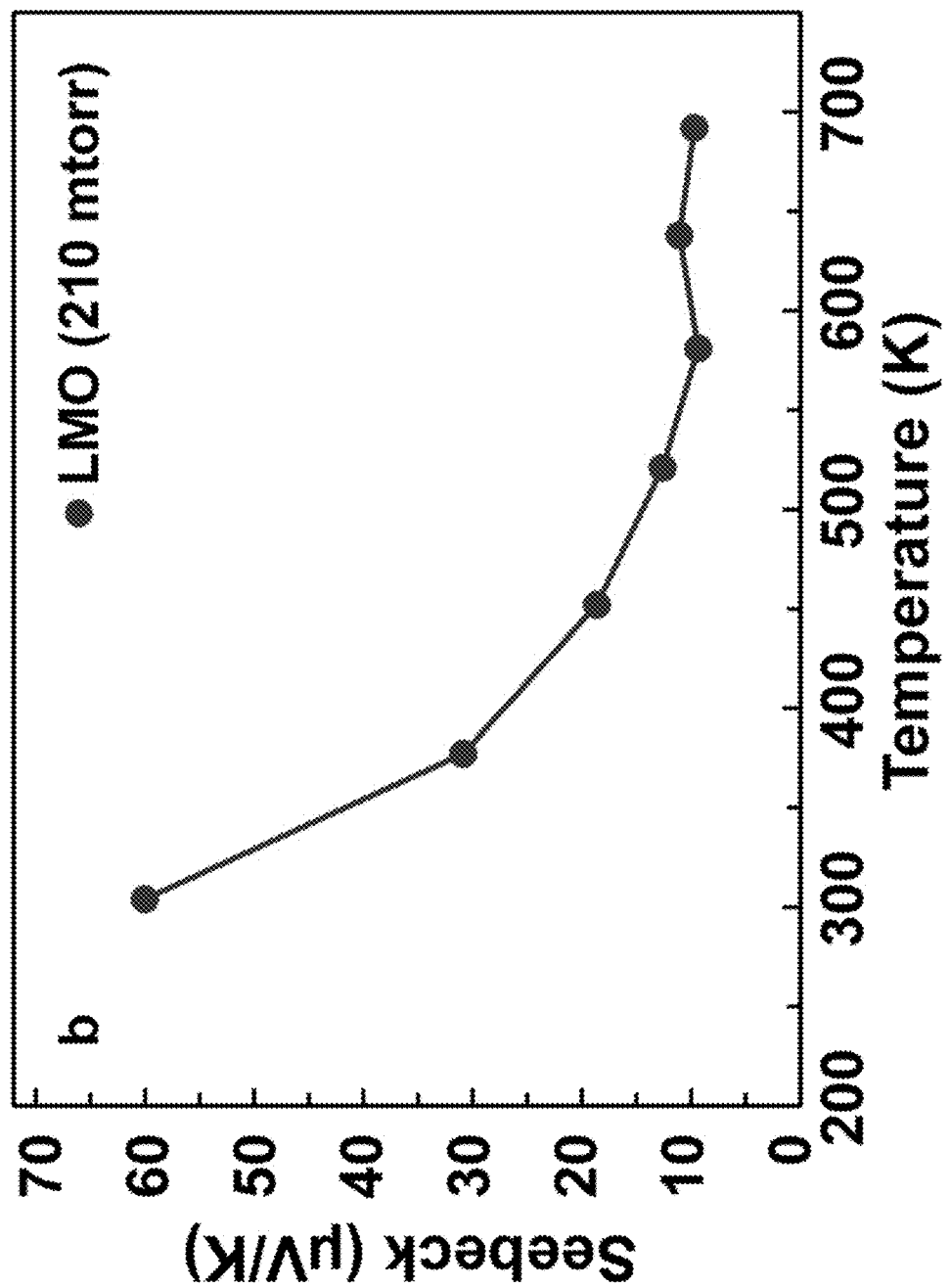
FIG. 55b is a graph of in-plane Seebeck measurement of LMO validating p-type behavior with a room temperature Seebeck coefficient of 60±3 µV/K.

Similarly, an epitaxial 200 nm thin film of LMO was characterized using the Hall effect measurement technique, which provided a room temperature resistivity of $2.79 \times 10^{-1}$ ohm·cm, and a hole carrier concentration of $1.15 \times 10^{19}$ cm$^{-3}$ with a hole mobility of 1.94 cm$^2$/Vs. Temperature dependent four-probe resistivity measurement of LMO with and without magnetic field also showed a 100× increase in the conductivity, with a thermal activation energy ($E_A$) of 93.0±5 meV (see FIG. 54b, a graph of temperature-dependent in-plane resistivity with and without a magnetic field applied in a direction normal to the film surface for LMO). The in-plane temperature dependent Seebeck measurement with a room temperature Seebeck coefficient of 60±3 µV/K confirmed that the LMO films were p-type (see FIG. 55b, graph of in-plane Seebeck measurement of LMO validating p-type behavior with a room temperature Seebeck coefficient of 60±3 µV/K).

The temperature dependent resistivity measurement at a magnetic field of 0.2 Tesla of LSMO thin films grown at a higher oxygen pressure (210 mtorr) shows low magnetoresistance (about 6%) and an LMO thin-film MR ratio of about 40%. The LSMO sample grown at 52 mtorr showed an MR ratio of about 16% and the LMO MR ratio was about 52%. This high MR in the sample grown at low oxygen pressure is attributed to a disordered spin state, in contrast to films grown at high oxygen pressure, which change to an ordered state with applied magnetic field.

Thermal conductivity of LSMO/LMO superlattices was measured using a photo-acoustic (PA) technique. The high resistivity superlattices grown at 52 mtorr showed a cross-plane room temperature thermal conductivity of 0.89 W/m·K. Phonon scattering at interfaces showed a reduction in the lattice contribution to the thermal conductivity. The low resistivity LSMO/LMO superlattices grown at 210 mtorr exhibited a thermal conductivity of 0.92±0.12 W/m·K. The cross-plane thermal conductivity indicates that the suppression of thermal conductivities due to the interfaces is preserved. The estimated cross-plane electronic contribution ($\kappa_e$) using the Wiedemann-Franz law ($\kappa_e = L_o \sigma T$) was found to be negligible in both high and low resistivity LSMO/LMO superlattices. The measured room temperature thermal conductivity is comparably lower than that of bulk oxides and composite materials and comparable to heavy metallic alloys (0.5-2 W/m·K).

Figure 56A:
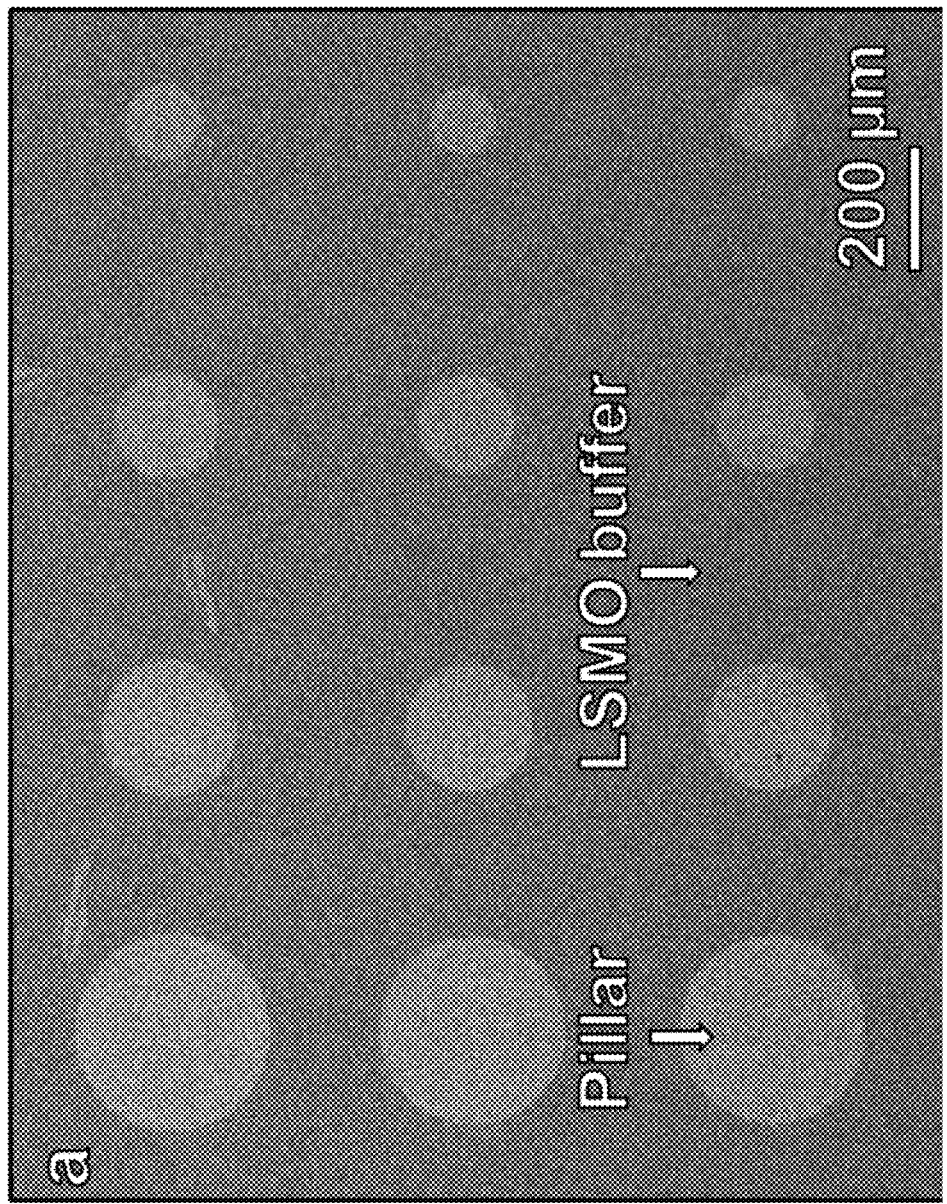
FIG. 56a is a schematic of a field emission scanning electron microscope top view images of anisotropically etched LSMO/LMO superlattices by ICP-RIE.
Figure 56B:
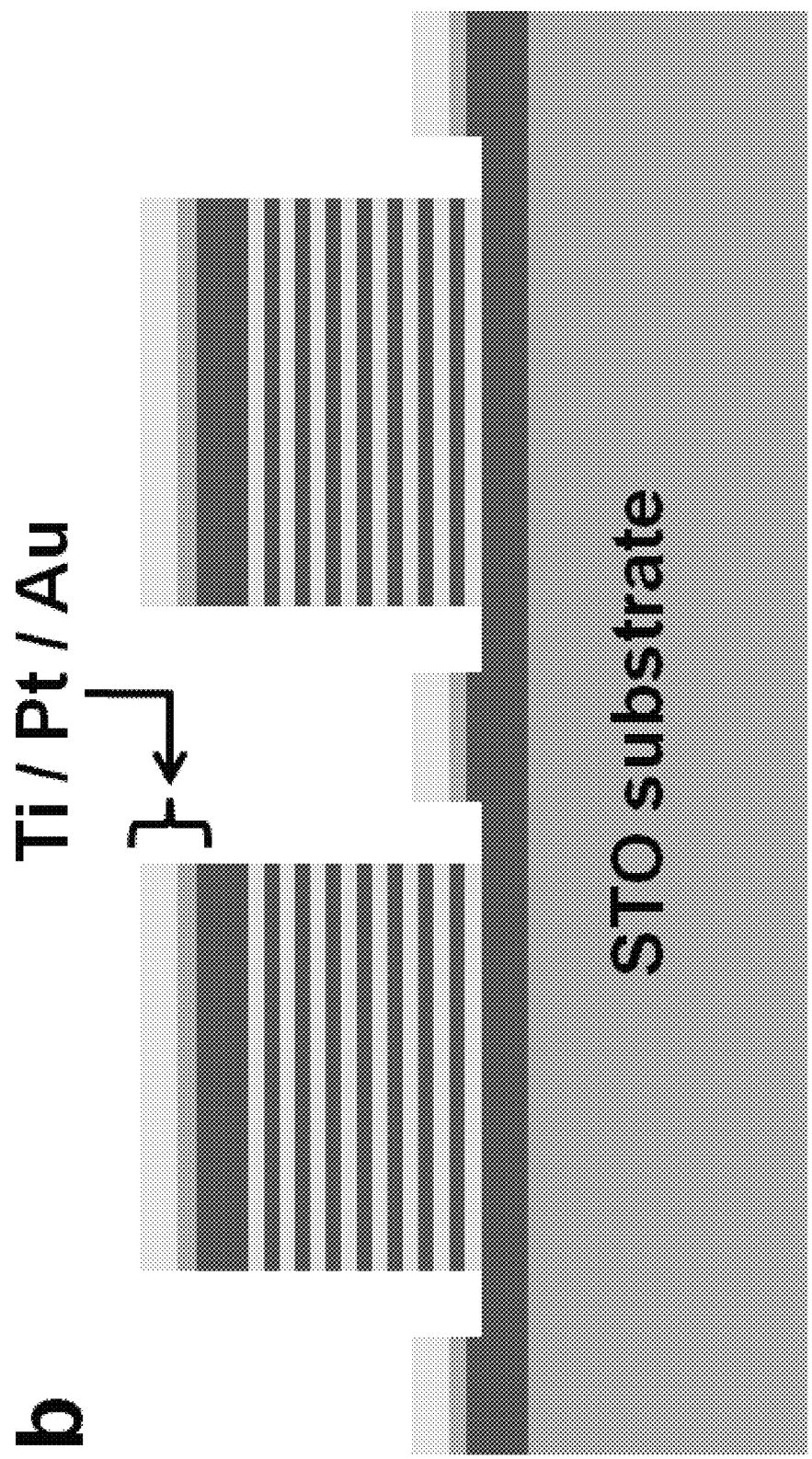
FIG. 56b is a schematic of side view of the final structure of LSMO/LMO superlattices for I-V cross-plane measurement.
Figure 57:
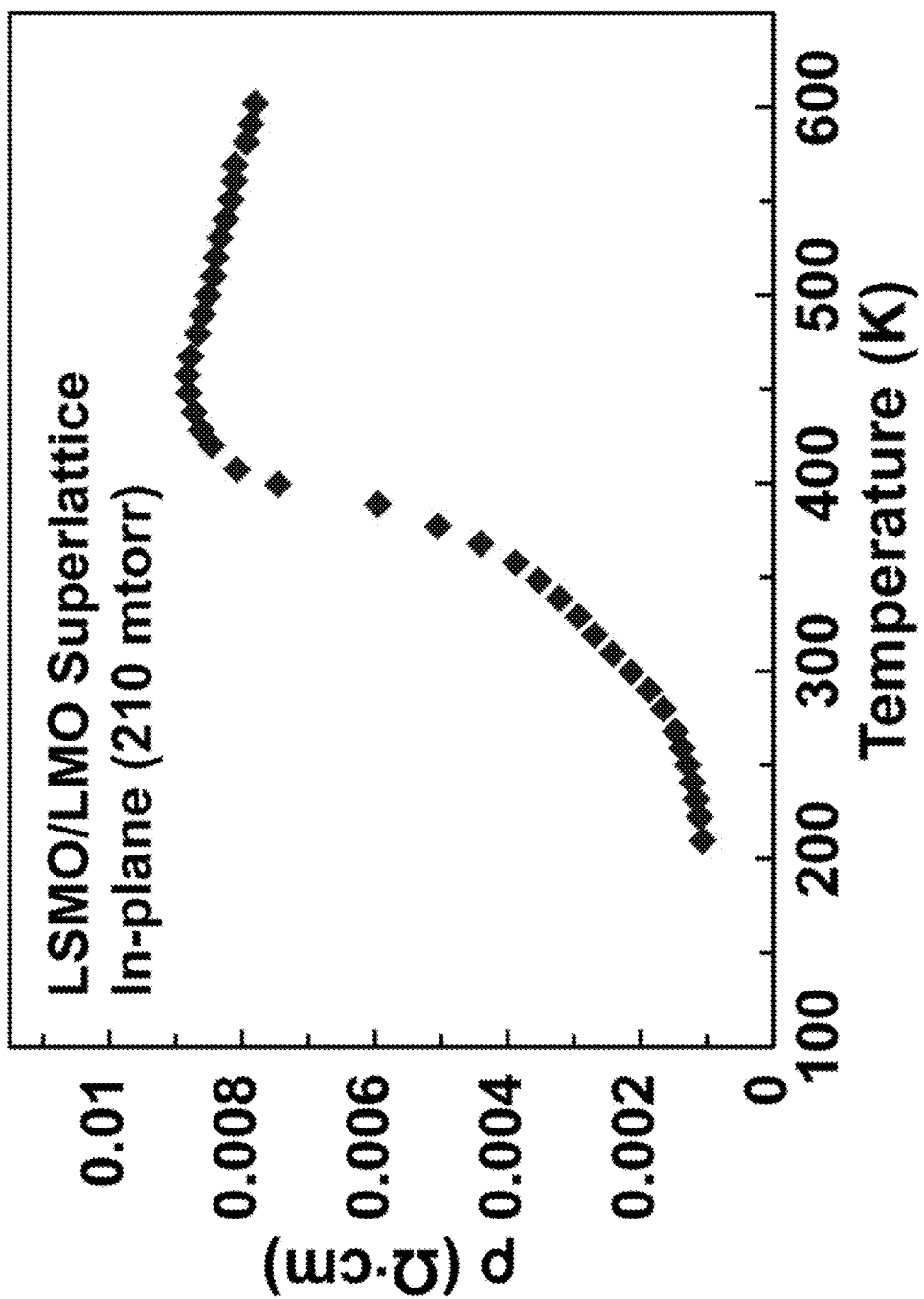
FIG. 57 is a graph of temperature-dependent in-plane resistivity of p-type LSMO/LMO superlattice.

The cross-plane electrical transport (power factor) measurement required etching of cylindrical pillar structures (1.1 micron height and 300 µm diameter) on the superlattices to reach the bottom buffer layer (see, FIG. 56a, a schematic of a field emission scanning electron microscope top view images of anisotropically etched LSMO/LMO superlattices by ICP-RIE). The cylindrical pillar device structures were fabricated using AZ-9260 resist as an etching mask for inductively coupled plasma reactive ion etching (ICP-RIE) (see FIG. 56b, a schematic of side view of the final structure of LSMO/LMO superlattices for I-V cross-plane measurement). The etching recipe used was 40:10 sccm of $Cl_2$:Ar, a chamber pressure of 0.7 Pa, an RF forward power of 800 W, and a capacitive bias of 350 W. The metallization used for top and bottom contacts consisted of three layers, Ti (8 nm)/Pt (125 nm)/Au (500 nm), to achieve good ohmic contact with LSMO/LMO superlattices. In-plane temperature-dependent resistivity measurements were performed on the LSMO/LMO superlattices (see FIG. 57, a graph of temperature-dependent in-plane resistivity of p-type LSMO/

Figure 58:
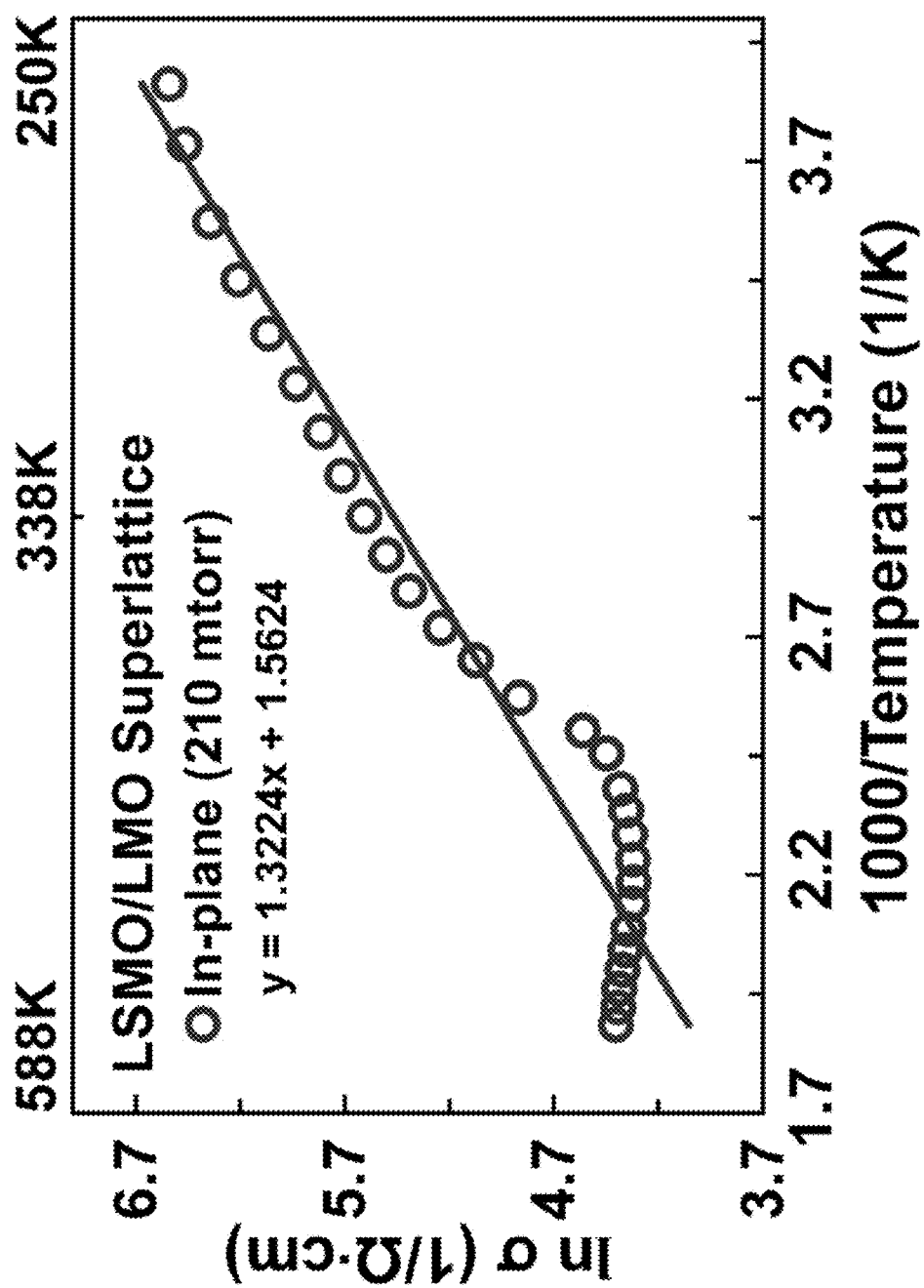
FIG. 58 is an in-plane LSMO/LMO superlattice electrical conductivity plot fitted to extract the effective thermal activation energy of 114±6 meV.
Figure 59:
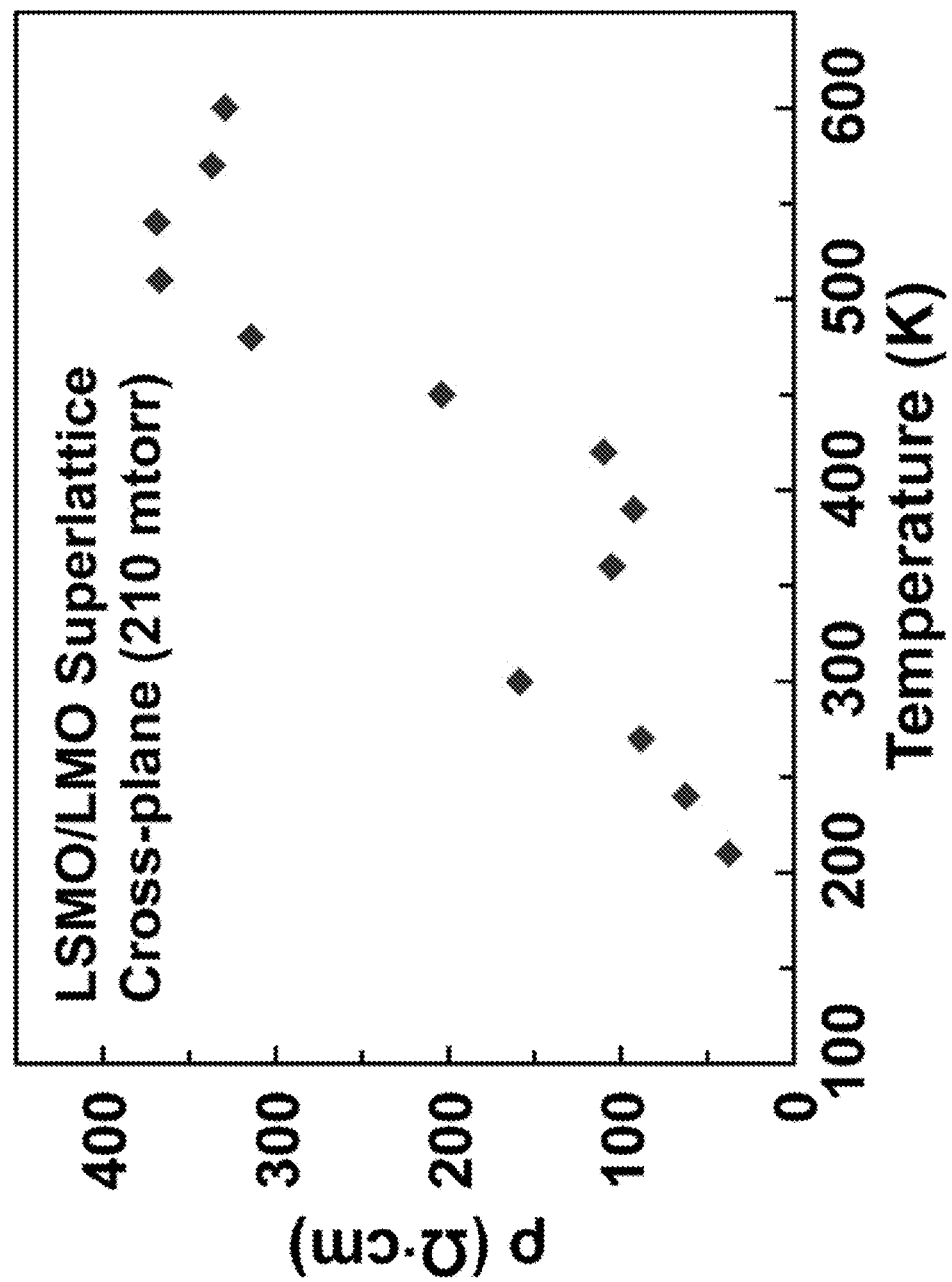
FIG. 59 is an extracted cross-plane resistivity plot of the p-type LSMO/LMO superlattice using temperature dependent I-V measurement.
Figure 60:
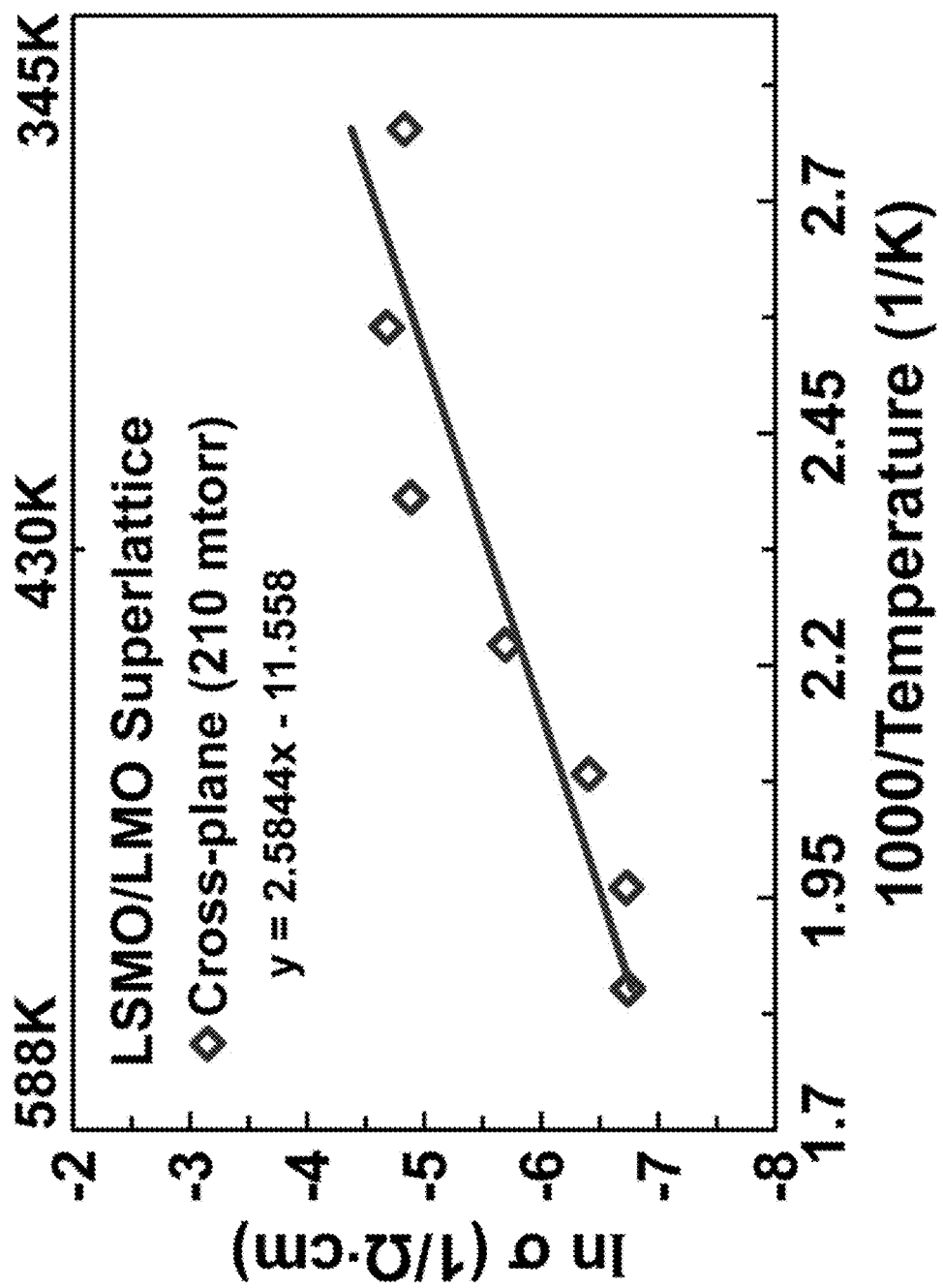
FIG. 60 is an Arrhenius plot of cross-plane LSMO/LMO superlattice electrical conductivity. The fitting extracted an effective barrier height of 223±11 meV.

LMO superlattice), which showed a thermal activation energy ($E_A$) of 114±6 meV (see FIG. 58, in-plane LSMO/LMO superlattice electrical conductivity plot fitted to extract the effective thermal activation energy of 114±6 meV). Temperature dependent I-V measurements in the temperature range of 100-600K were performed on the cross-plane cylindrical devices. The extracted temperature dependent conductivity showed an order of magnitude increase in the cross-plane conductivity, compared to high resistivity superlattices (see FIG. 59, extracted cross-plane resistivity plot of the p-type LSMO/LMO superlattice using temperature dependent I-V measurement). The effective barrier height of 223±11 meV was extracted from the cross-plane temperature dependent electrical conductivity data for LSMO/LMO superlattices (see FIG. 60, Arrhenius plot of cross-plane LSMO/LMO superlattice electrical conductivity. The fitting extracted an effective barrier height of 223±11 meV). The effective cross-plane barrier is higher than that measured for in-plane transport suggests that the temperature dependence of cross-plane conductivity was dominated by interface effects such as thermionic emission over interfacial barriers. The modification of the room temperature barrier ($\Phi_B$) height by varying the doping levels (i.e. by growing at high oxygen pressure) of the constituent materials in the superlattices enables the lowering of the effective barrier by approximately 75 meV.

Figure 61:
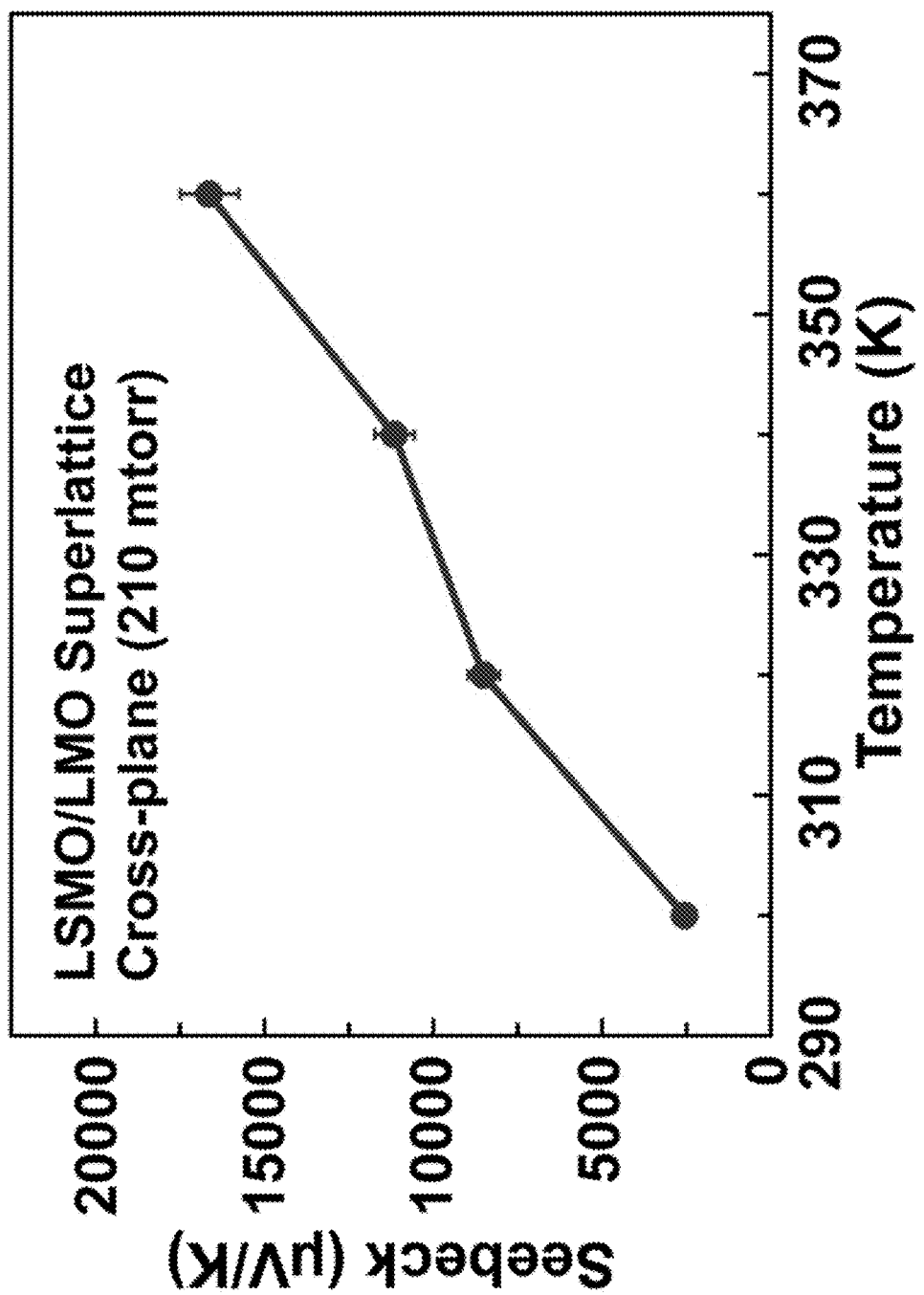
FIG. 61 is a plot of the LSMO/LMO superlattice cross-plane Seebeck coefficient measurement using thermal imaging technique.

Cross-plane Seebeck coefficient measurements in the temperature range of 300K-360K were performed using a thermal imaging technique. The measured room temperature cross-plane Seebeck coefficient for low resistivity superlattices was 2560±130 µV/K. The Seebeck coefficient of the low resistivity sample increased with temperature to 8520±430 µV/K (320K), 11160±560 µV/K (340K), and 16640±830 µV/K (360K) (see FIG. 61, the LSMO/LMO superlattice cross-plane Seebeck coefficient measurement using thermal imaging technique showed a giant Seebeck coefficient of 2560±130 µV/K at about 300K, which increased to 16640±830 µV/K at 360K). The measured Seebeck coefficient of low resistivity LSMO/LMO superlattices is higher, the cross-plane conductivity is higher, and the effective barrier is lower (by about 75 meV) in comparison with prior results with high resistivity superlattices. The LSMO/LMO superlattice constituent materials exhibit spintronic properties where charges and spin current are intertwined and can generate a spin-Seebeck effect. Therefore, the observed significant increase in the Seebeck coefficient with temperature in LSMO/LMO superlattices may be an indication of possible collective contribution from interplay of charge and spin transport in superlattices. It may be concluded that the temperature gradient across the ferromagnetic conductor (LSMO) generates spin current. These spin currents may be injected into the ferromagnetic semiconductor (LMO) due to lowering of the effective barrier height, which leads to a giant spin-Seebeck effect. This phenomenon of generation of charge, spin current, and phonon-magnon (spin waves) coupling is referred to as the spin-Seebeck effect or spin calorimetric effect. The entire contribution in the LSMO/LMO superlattice thermal conductivity is from the lattice contribution. Therefore, phonon-drag effects also contributed to the huge enhancement of the Seebeck coefficient in superlattices. The giant contribution of spin-Seebeck, the large temperature dependence, and the low thermal conductivity in LSMO/LMO superlattices may offer opportunities to realize spin-dependent thermoelectric devices or magnetic thermoelectric devices where the collective effect of charge, spin, and heat transport can be utilized to increase the efficiency of thermoelectric devices.

Figure 62:
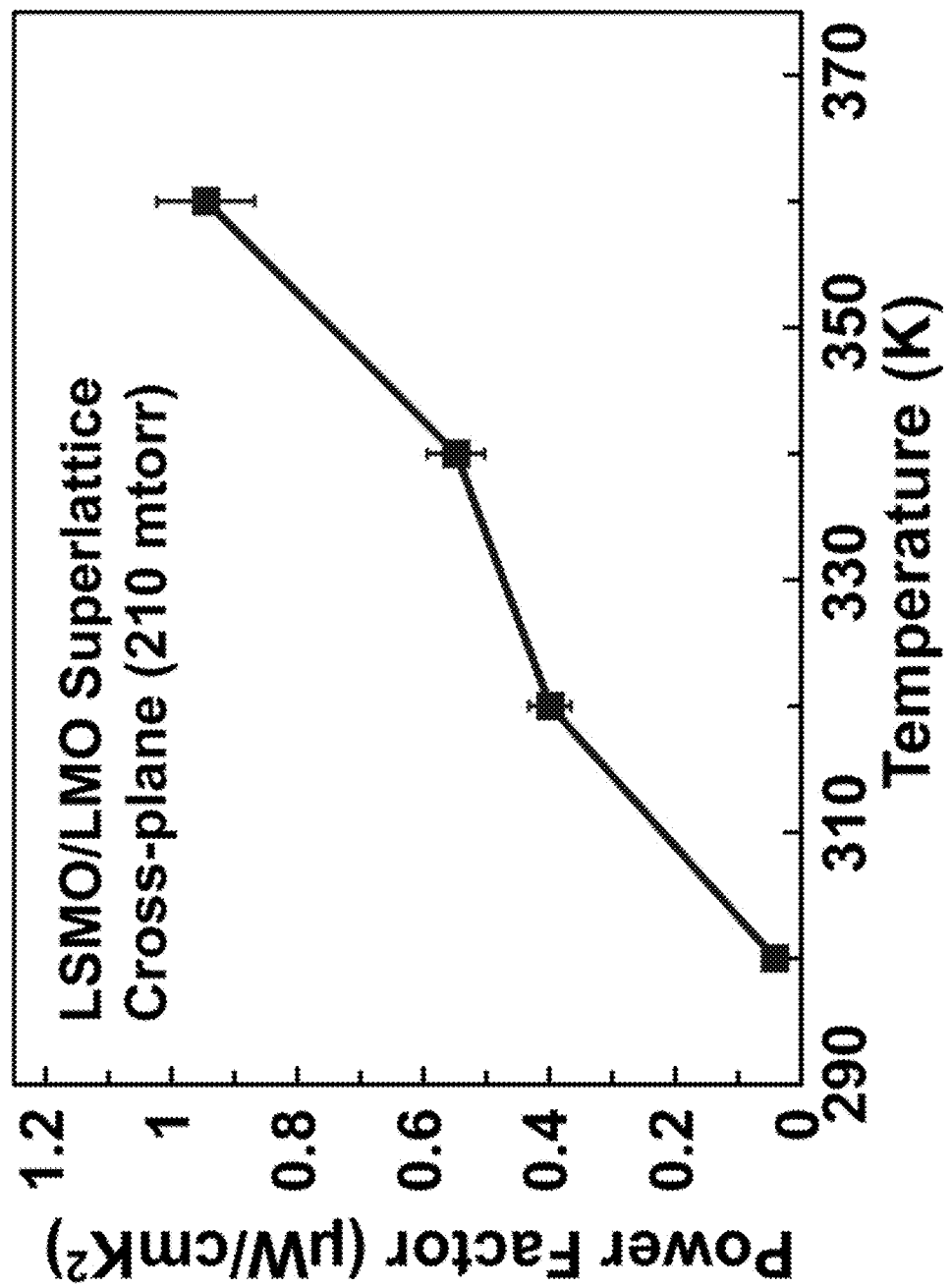
FIG. 62 is a plot of the extracted cross-plane power factor ($S^2\sigma$) of the low resistivity p-type LSMO/LMO superlattice.
Figure 63:
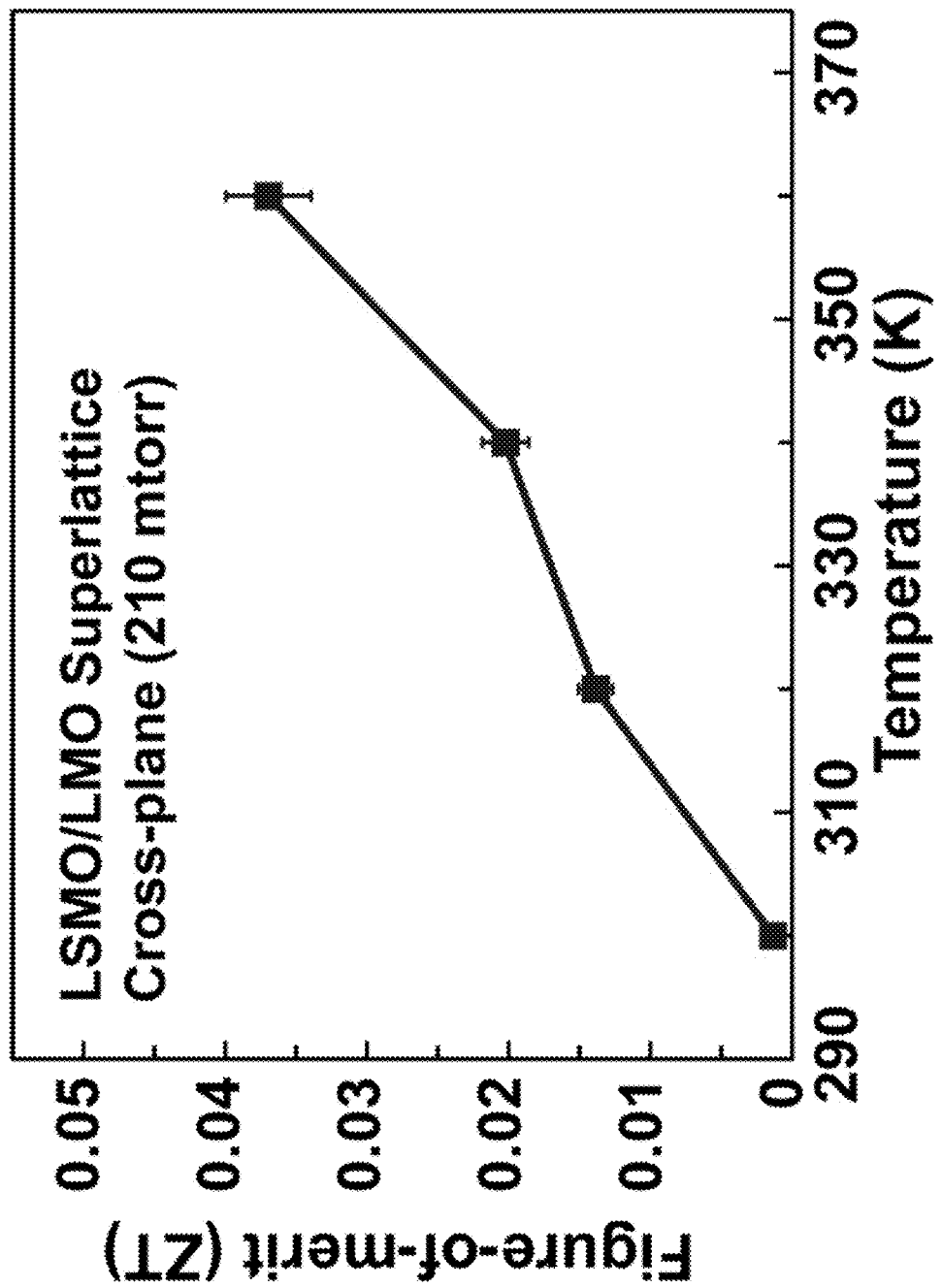
FIG. 63 is a plot of the extracted cross-plane thermoelectric figure-of-merit (ZT) of p-type LSMO/LMO superlattices.

The extracted cross-plane temperature dependent power factor ($S^2u$) of low resistivity LSMO/LMO superlattices (see FIG. 62, the extracted cross-plane power factor ($S^2u$) of the low resistivity p-type LSMO/LMO superlattice. The power factor increased by two orders of magnitude compared to high resistivity superlattices grown at 52 mtorr) increased by two orders of magnitude compared to high resistivity 52 mtorr superlattices and reached about 0.95 µV/cmK$^2$. Combining the cross-plane power factor and room temperature thermal conductivity of the LSMO/LMO superlattices yielded a thermoelectric figure of merit (ZT) of 0.037±0.003 at 360K (see FIG. 63, the extracted cross-plane thermoelectric figure-of-merit (ZT) of p-type LSMO/LMO superlattices; the cross-plane ZT increased by two orders of magnitude compared to high resistivity superlattices grown at 52 mtorr). The increase of ZT by two orders of magnitude over that achieved for superlattices grown at 52 mtorr provides significant utility and benefit that can be used in many thermoelectric fields.

It should be appreciated that by manipulating partial pressure of $O_2$ in the process of building the superlattice, as described herein, the thermal conductivity can be manipulated to be between 0.5 and 1.5 W/(m·K) at about 300K. Further, the superlattice can be configured so that the cross-plane electrical conductivity measured between the substrate and the capping layer can be at least $6.3 \times 10^{-3}$ ohm$^{-1}$·cm$^{-1}$ measured at about 300K, while the cross-plane Seebeck coefficient of the thermoelectric superlattice measured between the substrate and the capping layer can be at least 1600 µV/K measured at about 300K.

Those skilled in the art will recognize that numerous modifications can be made to the specific implementations described above. The implementations should not be limited to the particular limitations described. Other implementations may be possible.

What is claimed is:

1. A thermoelectric superlattice, comprising:
    a substrate;
    a buffer layer disposed on the substrate;
    at least one set of alternating layers of perovskites oxide $La_{0.67}Sr_{0.33}MnO_3$ (LSMO) and $LaMnO_3$ (LMO) disposed on the buffer layer; and
    a capping layer disposed on the at least one set of LSMO and LMO,
    the cross-plane electrical conductivity of the thermoelectric superlattice measured between the substrate and the capping layer having a value of at least $8 \times 10^{-4}$ ohm$^{-1}$–cm$^{-1}$ measured at about 300K; and
    wherein each layer in the at least one set of alternating layers has a same thickness, and wherein said same thickness is 2-21 nm and wherein the thickness of the capping layer is 3-20 times said same thickness.

2. The thermoelectric superlattice of claim 1, the substrate is one of strontium titanate (STO), (La,Sr)(Al,Ta)O$_3$ (LSAT) and lanthanum aluminate (LaAlO$_3$).

3. The thermoelectric superlattice of claim 1, the substrate has a lattice mismatch with the at least one set of LSMO and LMO of less than 5%.

4. The thermoelectric superlattice of claim 1, the substrate has a lattice mismatch with the at least one set of LSMO and LMO of less than 2%.

5. The thermoelectric superlattice of claim 1, the substrate has a lattice mismatch with the at least one set of LSMO and LMO of less than 1%.

6. The thermoelectric superlattice of claim 1, the buffer layer having a thickness of between 50 nm to 500 nm.

7. The thermoelectric superlattice of claim 1, the cross-plane electrical conductivity of the thermoelectric superlattice having a value of at least $6.3 \times 10^{-3}$ 1/(ohm·cm) measured at about 300K.

8. The thermoelectric superlattice of claim 1, the capping layer is between about 50 nm and 200 nm.

9. The thermoelectric superlattice of claim 1, the cross-plane Seebeck coefficient measured between the substrate and the capping layer is at least 1520 µV/K at about 300K and the cross-plane thermal conductivity measured between the substrate and the capping layer is between 0.5 and 1.5 W/(m·K) at about 300K.

* * * * *